United States Patent
Kamimura et al.

(10) Patent No.: US 12,454,405 B2
(45) Date of Patent: Oct. 28, 2025

(54) CHEMICAL LIQUID AND CHEMICAL LIQUID STORAGE BODY

(71) Applicant: FUJIFILM Corporation, Tokyo (JP)

(72) Inventors: Tetsuya Kamimura, Haibara-gun (JP); Satomi Takahashi, Haibara-gun (JP); Tadashi Oomatsu, Haibara-gun (JP); Tetsuya Shimizu, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 18/673,409

(22) Filed: May 24, 2024

(65) Prior Publication Data

US 2024/0317485 A1    Sep. 26, 2024

Related U.S. Application Data

(60) Division of application No. 17/139,045, filed on Dec. 31, 2020, now Pat. No. 12,030,713, which is a continuation of application No. PCT/JP2019/026947, filed on Jul. 8, 2019.

(30) Foreign Application Priority Data

Jul. 11, 2018   (JP) ................... 2018-131747

(51) Int. Cl.
| | | |
|---|---|---|
| B65D 85/00 | (2006.01) | |
| B65D 25/14 | (2006.01) | |
| B65D 81/26 | (2006.01) | |
| G03F 7/32 | (2006.01) | |
| G03F 7/00 | (2006.01) | |

(52) U.S. Cl.
CPC ............ *B65D 85/70* (2013.01); *B65D 25/14* (2013.01); *B65D 81/26* (2013.01); *G03F 7/32* (2013.01); *G03F 7/325* (2013.01); *G03F 7/0012* (2013.01)

(58) Field of Classification Search
None
See application file for complete search history.

(56) References Cited

U.S. PATENT DOCUMENTS

| | | | | |
|---|---|---|---|---|
| 2004/0191672 | A1* | 9/2004 | Oguro ................. | G03F 7/0392 430/283.1 |
| 2005/0175942 | A1 | 8/2005 | Ohnishi | |
| 2011/0061678 | A1 | 3/2011 | Koshiyama et al. | |
| 2012/0288796 | A1* | 11/2012 | Katayama ............ | G03F 7/11 430/281.1 |
| 2013/0084524 | A1* | 4/2013 | Hayama ............... | G03F 7/2041 430/325 |
| 2018/0362894 | A1 | 12/2018 | Gott | |
| 2019/0064672 | A1 | 2/2019 | Murayama et al. | |
| 2019/0219923 | A1 | 7/2019 | Kamimura et al. | |
| 2019/0219924 | A1 | 7/2019 | Kamimura | |
| 2019/0243240 | A1 | 8/2019 | Kamimura et al. | |

FOREIGN PATENT DOCUMENTS

| | | |
|---|---|---|
| CN | 101313385 A | 11/2008 |
| JP | 2015-084122 A | 4/2015 |
| TW | 201807512 A | 3/2018 |
| TW | 201814406 A | 4/2018 |
| TW | 201840842 A | 11/2018 |
| WO | 2017/188296 A1 | 11/2017 |
| WO | 2018/061573 A1 | 4/2018 |
| WO | 2018/092763 A1 | 5/2018 |

OTHER PUBLICATIONS

International Search Report dated Aug. 27, 2019, issued by the International Searching Authority in application No. PCT/JP2019/026947.
Written Opinion dated Aug. 27, 2019, issued by the International Searching Authority in application No. PCT/JP2019/026947.
International Preliminary Report on Patentability dated Jan. 12, 2021, issued by the International Bureau in application No. PCT/JP2019/026947.
Communication dated Jul. 2, 2022 from the Korean Patent Office in Korean Application No. 10-2021-7000456.
Office Action dated Nov. 28, 2022 from the Taiwanese Intellectual Property Office in TW application No. 108124353.
Chinese Office Action dated Jul. 26, 2023 in Chinese Application No. 201980046121.0.

* cited by examiner

*Primary Examiner* — Roberts P Culbert
(74) *Attorney, Agent, or Firm* — Sughrue Mion, PLLC

(57) ABSTRACT

The present invention provides a chemical liquid having excellent defect suppressing properties. The present invention further provides a chemical liquid storage body containing the chemical liquid. The chemical liquid of the present invention is a chemical liquid containing a compound other than an alkane and an alkene, and one or more organic solvents selected from the group consisting of decane and undecane, in which the chemical liquid further contains one or more organic components selected from the group consisting of alkanes having 12 to 50 carbon atoms and alkenes having 12 to 50 carbon atoms, and a content of the organic component is 0.10 to 1,000,000 mass ppt with respect to a total mass of the chemical liquid.

18 Claims, No Drawings

CHEMICAL LIQUID AND CHEMICAL LIQUID STORAGE BODY

CROSS-REFERENCE TO RELATED APPLICATIONS

This application is a Divisional of U.S. application Ser. No. 17/139,045, filed on Dec. 31, 2020, which is Continuation of PCT International Application No. PCT/JP2019/026947 filed on Jul. 8, 2019, which claims priority under 35 U.S.C. § 119(a) to Japanese Patent Application No. 2018-131747 filed on Jul. 11, 2018. Each of the above applications is hereby expressly incorporated by reference, in its entirety, into the present application.

BACKGROUND OF THE INVENTION

1. Field of the Invention

The present invention relates to a chemical liquid and a chemical liquid storage body.

2. Description of the Related Art

In a case where semiconductor devices are manufactured by a wiring forming process including photolithography, as a prewet solution, a resist solution (resist composition), a developer, a rinsing solution, a peeling solution, a chemical mechanical polishing (CMP) slurry, a washing solution used after CMP, or the like, or as a diluent thereof, a chemical liquid containing water and/or an organic solvent is used.

In recent years, advances in photolithography technology have led to the miniaturization of patterns. As a method of miniaturizing a pattern, a method of shortening the wavelength of the exposure light source is used, and as the exposure light source, ultraviolet rays, KrF excimer laser, ArF excimer laser, etc., which have been conventionally used, are replaced with a shorter wavelength. Attempts have been made to form a pattern using a certain EUV (extreme ultraviolet ray) or the like.

With the miniaturization of the pattern, the chemical liquid used in this process is required to have further defect suppressing properties.

As a conventional chemical liquid used for pattern formation, JP 2015-084122A discloses "a method for manufacturing an organic treatment liquid for patterning a chemically amplified resist film capable of reducing the generation of particles in the pattern formation technique (paragraph "0010")".

SUMMARY OF THE INVENTION

As a result of examining an organic treatment liquid (chemical liquid) for patterning manufactured by the manufacturing method, the inventors of the present invention found room for improvement in defect suppressing properties.

It is therefore an object of the present invention to provide a chemical liquid having excellent defect suppressing properties. Another object is to provide a chemical liquid storage body containing the chemical liquid.

In order to achieve the aforementioned objects, the inventors of the present invention carried out an intensive examination, and have found that the objects can be achieved by the following constitution.

[1]
A chemical liquid containing a compound other than an alkane and an alkene, and one or more organic solvents selected from the group consisting of decane and undecane,
   wherein the chemical liquid further contains one or more organic components selected from the group consisting of alkanes having 12 to 50 carbon atoms and alkenes having 12 to 50 carbon atoms, and
   a content of the organic component is 0.10 to 1,000,000 mass ppt with respect to a total mass of the chemical liquid.

[2]
The chemical liquid according to [1], wherein the organic component contained in the chemical liquid is two or more organic components.

[3]
The chemical liquid according to [1] or [2], wherein the chemical liquid contains both one or more of the alkanes having 12 to 50 carbon atoms and one or more of the alkenes having 12 to 50 carbon atoms.

[4]
The chemical liquid according to any one of [1] to [3], wherein the organic solvent has a Hansen solubility parameter distance to eicosene of 3 to 20 $MPa^{0.5}$.

[5]
The chemical liquid according to any one of [1] to [3], wherein the organic solvent contained in the chemical liquid has a content of an organic solvent having a Hansen solubility parameter distance to eicosene of 3 to 20 $MPa^{0.5}$ of 20% to 80% by mass with respect to the total mass of the chemical liquid, and
   the organic solvent contained in the chemical liquid has a content of an organic solvent having a Hansen solubility parameter distance to eicosene of not 3 to 20 $MPa^{0.5}$ of 20% to 80% by mass with respect to the total mass of the chemical liquid.

[6]
The chemical liquid according to any one of [1] to [5], wherein the organic solvent contained in the chemical liquid is one or more organic solvents selected from the group consisting of propylene glycol monomethyl ether acetate, propylene glycol monomethyl ether, cyclohexanone, ethyl lactate, propylene carbonate, isopropanol, 4-methyl-2-pentanol, butyl acetate, methyl methoxypropionate, propylene glycol monoethyl ether, propylene glycol monopropyl ether, cyclopentanone, γ-butyrolactone, diisoamyl ether, isoamyl acetate, dimethyl sulfoxide, N-methylpyrrolidone, diethylene glycol, ethylene glycol, dipropylene glycol, propylene glycol, ethylene carbonate, sulfolane, cycloheptanone, 2-heptanone, butyl butyrate, isobutyl isobutyrate, pentyl propionate, isopentyl propionate, ethylcyclohexane, mesitylene, decane, undecane, 3,7-dimethyl-3-octanol, 2-ethyl-1-hexanol, 1-octanol, 2-octanol, ethyl acetoacetate, dimethyl malonate, methyl pyruvate, and dimethyl oxalate.

[7]
The chemical liquid according to any one of [1] to [6], wherein a content of the organic component is 1 to 150 mass ppt with respect to the total mass of the chemical liquid.

[8]
The chemical liquid according to any one of [1] to [7], further containing a metal component, wherein a content of the metal component is 0.01 to 500 mass ppt with respect to the total mass of the chemical liquid.

[9]

The chemical liquid according to any one of [1] to [7], further containing a metal component, wherein a mass ratio of the content of the organic component to a content of the metal component is 0.001 to 10000.

[10]

The chemical liquid according to [8] or [9], wherein a mass ratio of the content of the organic component to the content of the metal component is 0.05 to 2000.

[11]

The chemical liquid according to any one of [8] to [10], wherein a mass ratio of the content of the organic component to the content of the metal component is 0.1 to 100.

[12]

The chemical liquid according to any one of [8] to [11], wherein the metal component contains metal particles and metal ions.

[13]

The chemical liquid according to [12], wherein a mass ratio of the content of the organic component to a content of the metal particles is 0.01 to 1000.

[14]

The chemical liquid according to [12] or [13], wherein the mass ratio of the content of the organic component to a content of the metal particles is 0.1 to 10.

[15]

The chemical liquid according to any one of [12] to [14], wherein a mass ratio of the content of the organic component to a content of the metal particles is 0.28 to 3.5.

[16]

The chemical liquid according to any one of [12] to [15], wherein a mass ratio of the content of the organic component to a content of the metal ions is 0.01 to 1000.

[17]

The chemical liquid according to any one of [12] to [16], wherein a mass ratio of the content of the organic component to a content of the metal ions is 0.1 to 5.

[18]

The chemical liquid according to any one of [12] to [17], wherein a mass ratio of the content of the organic component to a content of the metal ions is 0.2 to 1.3.

[19]

The chemical liquid according to any one of [1] to [18], wherein the organic component contained in the chemical liquid is two or more organic components, and one or more of the two or more organic components have a boiling point of 380° C. or higher.

[20]

The chemical liquid according to any one of [1] to [19], wherein the organic component contained in the chemical liquid is two or more organic components selected from the group consisting of alkanes having 12 to 50 carbon atoms, among the two or more alkanes having 12 to 50 carbon atoms, any one of alkanes having 16 to 34 carbon atoms has a largest mass content.

[21]

A chemical liquid storage body comprising a container and the chemical liquid according to any one of [1] to [20] stored in the container, wherein a liquid contact portion in contact with the chemical liquid in the container is an electropolished stainless steel or a fluororesin.

[22]

The chemical liquid storage body according to [21], wherein a void volume calculated by the expression (1) is 2% to 50% by volume:

$$\text{void volume} = \{1 - (\text{volume of the chemical liquid in the container/volume of the container})\} \times 100. \quad \text{Expression (1)}$$

According to the present invention, it is possible to provide a chemical liquid having excellent defect suppressing properties. Further, it is possible to provide a chemical liquid storage body containing the chemical liquid.

DESCRIPTION OF THE PREFERRED EMBODIMENTS

Hereinafter, the present invention will be specifically described.

The following constituents will be described based on typical embodiments of the present invention in some cases, but the present invention is not limited to the embodiments.

In the present specification, a range of numerical values described using "to" means a range including the numerical values listed before and after "to" as a lower limit value and an upper limit value respectively.

Further, in the present invention, "ppm" means "parts-per-million ($10^{-6}$)", "ppb" means "parts-per-billion ($10^{-9}$)", "ppt" means "parts-per-trillion ($10^{-12}$)", and "ppq" means "parts-per-quadrillion ($10^{-15}$)".

Further, in the present invention, regarding the description of a group (atomic group), in a case where whether the group is substituted or unsubstituted is not described, as long as the effects of the present invention are not impaired, the group includes a group which does not have a substituent and a group which contains a substituent. For example, "hydrocarbon group" includes not only a hydrocarbon group which does not have a substituent (unsubstituted hydrocarbon group) but also a hydrocarbon group which contains a substituent (substituted hydrocarbon group). The same applies for each compound.

Further, in the present invention, "radiation" means, for example, far ultraviolet rays, extreme ultraviolet (EUV), X-rays, electron beams, and the like. Further, in the present invention, "light" means actinic rays or radiation. In the present invention, unless otherwise specified, "exposure" includes not only exposure, far ultraviolet rays, X-rays, and EUV, and the like, but also lithography by particle beams such as Electron beams or ion beams.

[Chemical Liquid]

The chemical liquid according to an embodiment of the present invention contains a compound other than an alkane and an alkene, and one or more organic solvents selected from the group consisting of decane and undecane.

The chemical liquid further contains an organic component.

The organic component is one or more selected from the group consisting of alkanes having 12 to 50 carbon atoms and alkenes having 12 to 50 carbon atoms.

Further, the content of the organic component is 0.10 to 1,000,000 mass ppt with respect to the total mass of the chemical liquid.

It is unclear what mechanism enables the chemical liquid according to an embodiment of the present invention to achieve the above objects. According to the inventors of the present invention, presumably, the mechanism may be as below. The following mechanism is merely based on presumption, and in a case where the effects of the present invention are obtained by other mechanisms, they are also included in the scope of the present invention.

The chemical liquid contains a small amount of impurities that are mixed in during the processes of storage and transfer through pipe, and such impurities are likely to cause various defects. The various defects are, for example, defects that occur in a case where the chemical liquid is applied to a manufacturing process of a semiconductor device. More specific examples thereof include metal residue defects in a case where the chemical liquid is used as a prewet solution or a rinsing solution, defects that form cross-links between patterns in a case where the chemical liquid is used as a pattern developer, and defects such as those described above that occur in a case where the chemical liquid is used as a pipe washing solution and a prewet solution, rinsing solution, or developer is transferred to the washed pipe thereafter and used.

Since the chemical liquid of the present invention contains a predetermined amount of an organic component in advance, it behaves like a saturated solution, and impurities (particularly, impurities that are likely to cause defects) are hardly mixed into the chemical liquid. Since the organic components, alkanes and alkenes, have a predetermined number or more of carbon atoms, their affinity for impurities in the liquid contact portion on containers, pipes, and the like used in the case of storing and transferring chemical liquids or the like, is appropriately suppressed, thereby preventing the elution of impurities derived from the liquid contact portion.

On the other hand, the organic components, alkanes and alkenes, have a predetermined number or less of carbon atoms, and it is possible to prevent the organic components themselves from causing defects.

Based on such a mechanism, the inventors of the present invention presume that various processes using the chemical liquid of the present invention have been able to suppress the occurrence of defects in the final product.

[Organic Solvent]

The chemical liquid of the present invention (hereinafter, also simply referred to as "chemical liquid") contains a compound other than an alkane and an alkene, and one or more organic solvents selected from the group consisting of decane and undecane. In other words, in the present specification, alkanes and alkenes are not included in the organic solvent except decane and undecane.

In the present specification, an organic solvent is intended to refer to an organic compound which is contained in the chemical liquid in an amount more than 10000 mass ppm per component with respect to the total mass of the chemical liquid. That is, in the present specification, a liquid organic compound contained in the chemical liquid in an amount greater than 10000 mass ppm with respect to the total mass of the chemical liquid corresponds to an organic solvent.

In addition, the organic solvent which the chemical liquid must contain is a compound other than an alkane and an alkene, decane, and/or undecane.

The organic solvent is preferably a compound other than an alkane and an alkene.

Further, in the present specification, "liquid" means that the compound stays in liquid form at 25° C. under atmospheric pressure.

The content of the organic solvent in the chemical liquid is not particularly limited. Generally, the content of the organic solvent with respect to the total mass of the chemical liquid is preferably 98.0% by mass or more, more preferably greater than 99.0% by mass, still more preferably 99.9% by mass or more, and particularly preferably 99.99% by mass or more. The upper limit is less than 100% by mass.

The organic solvent may be used alone or in combination of two or more. In a case where two or more organic solvents are used, the total content thereof is preferably within the above range.

The organic solvent preferably has a Hansen solubility parameter distance to eicosene of 3 to 20 $MPa^{0.5}$ from the viewpoint that defect suppressing properties are more excellent in a case where the chemical liquid is applied to various processes (for example, applied as a prewet solution, a developer, a rinsing solution, or a washing solution for washing equipment with which these liquids come into contact) (hereinafter, also simply referred to as "defect suppressing properties of the chemical liquid").

In a case where the organic solvent has a Hansen solubility parameter distance to eicosene of 3 $MPa^{0.5}$ or more, it is considered that elution of the organic components or the like from a filter or the like used in purifying the chemical liquid can be appropriately suppressed, and the content of the organic components of the chemical liquid can be easily controlled to be equal to or less than the upper limit allowed by the chemical liquid of the present invention. Further, it is easy to prevent unintended impurities (especially organic impurities with small polarity) from the environment (such as air and container and pipe used in the case of storing and transferring liquid or the like) from being taken into the chemical liquid.

In a case where the organic solvent has a Hansen solubility parameter distance to eicosene of 20 $MPa^{0.5}$ or less, it is considered that the solubility to the organic component contained in the chemical liquid is good, and in a case where the chemical liquid is applied to a wafer or the like, it is easy to prevent the organic components from aggregating on the wafer and causing defects.

In a case where two or more organic solvents are used, at least one thereof preferably satisfies the range of the Hansen solubility parameter, at least two thereof more preferably satisfy the range of the Hansen solubility parameter, and all of them still more preferably satisfy the range of the Hansen solubility parameter.

In a case where two or more organic solvents are used, the weighted average value of the Hansen solubility parameter based on the molar ratio of the content of each organic solvent preferably satisfies the range of the Hansen solubility parameter.

For example, the organic solvent in the chemical liquid is preferably only the organic solvent substantially satisfying the range of the Hansen solubility parameter. The expression that the organic solvent in the chemical liquid is substantially only the organic solvent satisfying the range of the Hansen solubility parameter means that the content of the organic solvent satisfying the range of the Hansen solubility parameter is 99% by mass or more (preferably 99.9% by mass or more) with respect to the total mass of the organic solvent.

Further, for example, the organic solvent is also preferably a mixed solvent containing both an organic solvent satisfying the range of the Hansen solubility parameter and an organic solvent not satisfying the range of the Hansen solubility parameter.

In this case, it is preferable that the chemical liquid (mixed solvent) contains 20% to 80% by mass (preferably 30% to 70% by mass) of an organic solvent satisfying the range of the Hansen solubility parameter with respect to the total mass of the chemical liquid, and contains 20% to 80% by mass (preferably 30% to 70% by mass) of an organic solvent not satisfying the range of the Hansen solubility parameter with respect to the total mass of the chemical liquid.

It is considered that in a case where the content of the organic solvent satisfying the range of the Hansen solubility parameter and the content of the organic solvent not satisfying the range of the Hansen solubility parameter are each within a certain range, the affinity of the chemical liquid as a whole to the metallic material and the organic material can be adjusted to an appropriate range, so that the effects of the present invention become superior to those in a case where the content of the organic solvent not satisfying the range of the Hansen solubility parameter is too small or excessive (for example, in the case of being 1% by mass or more and less than 20% by mass, or more than 80% by mass with respect to the total mass of the chemical liquid (mixed solvent)).

In a case where the organic solvent not satisfying the range of the Hansen solubility parameter is contained an inadequate amount (for example, more than 1% by mass and less than 20% by mass), the inadequate amount of the organic solvent not satisfying the range of the Hansen solubility parameter is likely to act in the direction of precipitating organic impurities and/or ionic metal components having a relatively large polarity and the like, which are unintentionally mixed (contamination) from the environment, contained in the chemical liquid. On the other hand, it is considered that in a case where the content of the organic solvent not satisfying the range of the Hansen solubility parameter is 20% by mass or more, the action of making these components less likely to be taken in from the environment is more preferential than the action of precipitation described above, and the defect suppressing properties of the chemical liquid as a whole are improved.

It is considered that in a case where the content of the organic solvent not satisfying the range of the Hansen solubility parameter is 80% by mass or less, an excessive intake of organic impurities and/or particulate metal components having a small polarity from the environment can be suppressed and the defect suppressing properties are improved.

Further, the total content of the organic solvent satisfying the range of the Hansen solubility parameter and the organic solvent not satisfying the range of the Hansen solubility parameter is preferably 98.0% by mass or more, more preferably 99.0% by mass or more, still more preferably more than 99.9% by mass, and particularly preferably 99.99% by mass or more with respect to the total mass of the chemical liquid. The upper limit value is less than 100% by mass.

The Hansen solubility parameter distance to eicosene in the organic solvent not satisfying the range of the Hansen solubility parameter is not 3 to 20 $MPa^{0.5}$.

In the organic solvent not satisfying the range of the Hansen solubility parameter, the Hansen solubility parameter distance to eicosene is 0 $MPa^{0.5}$ or more and less than 3 $MPa^{0.5}$ (preferably greater than 0 $MPa^{0.5}$ and less than 3 $MPa^{0.5}$), or greater than 20 $MPa^{0.5}$ (preferably greater than 20 $MPa^{0.5}$ and 50 $MPa^{0.5}$ or less).

The Hansen solubility parameter distance to eicosane of the organic solvent is preferably 5 to 25 $MPa^{0.5}$ from the viewpoint that the defect suppressing properties of the chemical liquid are more excellent.

The estimation mechanism is the same as that described above regarding the Hansen solubility parameter distance to eicosene of the organic solvent.

In a case where two or more organic solvents are used, at least one thereof preferably satisfies the range of the Hansen solubility parameter, at least two thereof more preferably satisfy the range of the Hansen solubility parameter, and all of them still more preferably satisfy the range of the Hansen solubility parameter. Further, the content of the organic solvent satisfying the range of the Hansen solubility parameter is preferably 50% by mass or more and less than 100% by mass, more preferably 80% by mass or more and less than 100% by mass, and still more preferably 95% by mass or more and less than 100% by mass with respect to the total mass of the chemical liquid.

In a case where two or more organic solvents are used, the weighted average value of the Hansen solubility parameter based on the molar ratio of the content of each organic solvent preferably satisfies the range of the Hansen solubility parameter.

In the present specification, the Hansen solubility parameter is intended to refer to the Hansen solubility parameter described in "Hansen Solubility Parameters: A Users Handbook, Second Edition" (pages 1-310, CRC Press, published in 2007) and the like. That is, the Hansen solubility parameter represents the solubility by a multidimensional vector (dispersion force element ($\delta d$), polar force element ($\delta p$), and hydrogen bonding component ($\delta h$)), and these three parameters are considered to be coordinates of a point in a three-dimensional space called Hansen space.

The Hansen solubility parameter distance is the distance in the Hansen space between two compounds, and the Hansen solubility parameter distance is calculated by the following formula:

$$(Ra)^2 = 4(\delta d2 - \delta d1)^2 + (\delta p2 - \delta p1)^2 + (\delta h2 - \delta h1)^2$$

Ra: Hansen solubility parameter distance between the first compound and the second compound (unit: $MPa^{0.5}$)
$\delta d1$: Dispersion force element of the first compound (unit: $MPa^{0.5}$)
$\delta d2$: Dispersion force element of the second compound (unit: $MPa^{0.5}$)
$\delta p1$: Polar force element of the first compound (unit: $MPa^{0.5}$)
$\delta p2$: Polar force element of the second compound (unit: $MPa^{0.5}$)
$\delta h1$: Hydrogen bonding component of the first compound (unit: $MPa^{0.5}$)
$\delta h2$: Hydrogen bonding component of the second compound (unit: $MPa^{0.5}$)

In the present specification, the Hansen solubility parameter of a compound is specifically calculated by using Hansen Solubility Parameter in Practice (HSPiP).

As the type of the organic solvent, known organic solvents can be used without particular limitation. Examples of the organic solvents include alkylene glycol monoalkyl ether carboxylate, alkylene glycol monoalkyl ether, a lactic acid alkyl ester, alkoxyalkyl propionate, cyclic lactone (preferably having 4 to 10 carbon atoms), a monoketone compound which may have a ring (preferably having 4 to 10 carbon atoms), alkylene carbonate, alkoxyalkyl acetate, alkyl pyruvate, dialkyl sulfoxide, cyclic sulfone, dialkyl ether, monohydric alcohol, glycol, acetic acid alkyl ester, and N-alkylpyrrolidone.

The organic solvent contained in the chemical liquid is preferably one or more selected from the group consisting of propylene glycol monomethyl ether acetate (PGMEA), propylene glycol monomethyl ether (PGME), cyclohexanone (CHN), ethyl lactate (EL), propylene carbonate (PC), isopropanol (IPA), 4-methyl-2-pentanol (MIBC), butyl acetate (nBA), methyl methoxypropionate, propylene glycol monoethyl ether, propylene glycol monopropyl ether, cyclopentanone, γ-butyrolactone, diisoamyl ether, isoamyl acetate, dimethyl sulfoxide, N-methylpyrrolidone, diethylene glycol, ethylene glycol, dipropylene glycol, propylene glycol, ethylene carbonate, sulfolane, cycloheptanone, 2-heptanone, butyl butyrate, isobutyl isobutyrate, pentyl propionate, isopentyl propionate, ethylcyclohexane, mesitylene, decane, undecane, 3,7-dimethyl-3-octanol, 2-ethyl-1-hexanol, 1-octanol, 2-octanol, ethyl acetoacetate, dimethyl malonate, methyl pyruvate, and dimethyl oxalate.

Examples of using two or more organic solvents include combined use of PGMEA and PGME, and combined use of PGMEA and PC.

The type and the content of the organic solvent in the chemical liquid can be measured using a gas chromatography mass spectrometer.

The C log P of the organic solvent is preferably 0.05 to 7.00, and more preferably 0.07 to 2.00, from the viewpoint that the defect suppressing properties of the chemical liquid are more excellent.

The C log P value is a value obtained by calculating the common logarithm log P of the partition coefficient P between 1-octanol and water. Known methods and software can be used for calculating the C log P value, but unless otherwise specified, the present invention uses the C log P program incorporated in ChemBioDraw Ultra 12.0 manufactured by Cambridgesoft.

In a case where two or more organic solvents are used, the weighted average value of C log P values based on the molar ratio of the content of each organic solvent preferably satisfies the C log P value range.

[Organic Components]

The chemical liquid contains an organic component.

The organic component is one or more selected from the group consisting of alkanes having 12 to 50 carbon atoms and alkenes having 12 to 50 carbon atoms.

The chemical liquid may contain one organic component alone or two or more. The chemical liquid preferably contains two or more organic components from the viewpoint that the defect suppressing properties of the chemical liquid are more excellent.

In a case where two or more organic components are contained, the chemical liquid preferably satisfies any one or more of the following requirements A to C and preferably the requirement C:

Requirement A: The chemical liquid contains two or more selected from the group consisting of alkanes having 12 to 50 carbon atoms.

Requirement B: The chemical liquid contains two or more selected from the group consisting of alkenes having 12 to 50 carbon atoms.

Requirement C: The chemical liquid contains one or more selected from the group consisting of alkanes having 12 to 50 carbon atoms and one or more selected from the group consisting of alkenes having 12 to 50 carbon atoms.

The content of the organic component is 0.10 to 1,000,000 mass ppt with respect to the total mass of the chemical liquid from the viewpoint that the defect suppressing properties of the chemical liquid are more excellent, and is preferably 0.5 to 10,000 mass ppt, more preferably 0.5 to 1,000 mass ppt, still more preferably 1 to 150 mass ppt, and particularly preferably 1 to 60 mass ppt, from the point that the defect suppressing properties of the chemical liquid are more excellent.

In a case where two or more organic components are used, the total content thereof is preferably within the above range.

The C log P of the organic component is preferably 5.0 or more, more preferably 8.0 to 26.0, and still more preferably 9.0 to 17.0, from the viewpoint that the defect suppressing properties of the chemical liquid are more excellent.

The C log P value is a value obtained by calculating the common logarithm log P of the partition coefficient P between 1-octanol and water. Known methods and software can be used for calculating the C log P value, but unless otherwise specified, the present invention uses the C log P program incorporated in ChemBioDraw Ultra 12.0 manufactured by Cambridgesoft.

The molecular weight of the organic component is preferably 200 to 600, and more preferably 220 to 450.

The boiling point of the organic component is usually 180° C. or higher, preferably 190° C. to 600° C., and more preferably 200° C. to 500° C.

Further, it is preferable that the chemical liquid contains two or more organic components, and at least one thereof has a boiling point of 380° C. or higher (preferably 380° C. to 480° C.).

In the present specification, the boiling point means the boiling point at standard atmospheric pressure.

<Alkane>

The alkane having 12 to 50 carbon atoms as an organic component is a compound represented by $C_jH_{2j+2}$ (j represents an integer of 12 to 50 and two j have the same value).

The alkane may be linear or branched. Incidentally, the alkane having 12 to 50 carbon atoms does not contain a cyclic structure. That is, the alkane is not a cycloalkane.

The alkane preferably has 14 to 40 carbon atoms, and more preferably 16 to 34 carbon atoms.

Further, the chemical liquid preferably contains two or more selected from the group consisting of alkanes having 12 to 50 carbon atoms, and among the two or more alkanes having 12 to 50 carbon atoms, any one of alkanes having 16 to 34 carbon atoms preferably has a largest mass content, from the viewpoint that the defect suppressing properties of the chemical liquid are more excellent.

In a case where the chemical liquid contains the alkane having 12 to 50 carbon atoms, the content thereof is preferably 0.01 to 5,000 mass ppt, more preferably 0.5 to 1,000 mass ppt, and still more preferably 1 to 50 mass ppt with respect to the total mass of the chemical liquid, from the viewpoint that the defect suppressing properties of the chemical liquid are more excellent.

In a case where two or more of the alkanes are contained, the total content is preferably within the above range.

<Alkene>

The alkene having 12 to 50 carbon atoms as an organic component contains one or more C=C double bonds in the molecule.

The alkene having 12 to 50 carbon atoms containing one or more C=C double bonds in the molecule is an alkene represented by $C_nC_{2n+2-2x}$ (n is an integer of 12 to 50, and x represents an integer of 1 or more and represents the number of C=C double bonds the alkene has). In $C_nC_{2n+2-2x}$, two n have the same value, and "2n+2−2x" has a value of 4 or more.

The alkene having 12 to 50 carbon atoms may be linear or branched. Incidentally, the alkene having 12 to 50 carbon atoms does not contain a cyclic structure. That is, the alkene having 12 to 50 carbon atoms is not a cycloalkene.

In a case where the chemical liquid contains the alkene having 12 to 50 carbon atoms, the content thereof is preferably 0.1 to 5,000 mass ppt, more preferably 0.5 to 1,000 mass ppt, and still more preferably 1 to 50 mass ppt with respect to the total mass of the chemical liquid, from the viewpoint that the defect suppressing properties of the chemical liquid are more excellent.

In a case where two or more of the alkenes are used, the total content thereof is preferably within the above range.

The alkene represented by $C_nC_{2n+2-2x}$, where x is 1, preferably has 14 to 40 carbon atoms, and more preferably has 16 to 34 carbon atoms, from the viewpoint that the defect suppressing properties of the chemical liquid are more excellent.

In a case where the chemical liquid contains the alkene represented by $C_nC_{2n+2-2x}$, where x is 1, the content thereof is preferably 0.01 to 5,000 mass ppt, more preferably 0.1 to 1,000 mass ppt, and still more preferably 1 to 40 mass ppt with respect to the total mass of the chemical liquid.

In a case where two or more alkenes represented by $C_nC_{2n+2-2x}$, where x is 1, are used, the total content is preferably within the above range.

The alkene represented by $C_nC_{2n+2-2x}$, where x is 2 or more, has a carbon number (that is, n) of preferably 30 to 50, and more preferably 30 to 40.

The number of double bonds (that is, x) is preferably 2 to 15, and more preferably 2 to 10.

The alkene represented by $C_nC_{2n+2-2x}$, where x is 2 or more, is preferably squalene ($C_{30}H_{50}$), lycopene ($C_{40}H_{56}$), neurosporene ($C_{40}H_{58}$), phytoene ($C_{40}H_{64}$) or phytofluene ($C_{40}H_{62}$), and more preferably squalene.

In a case where the chemical liquid contains the alkene represented by $C_nC_{2n+2-2x}$, where x is 2 or more, the content thereof is preferably 0.01 to 5,000 mass ppt, more preferably 0.1 to 1,000 mass ppt, and still more preferably 1 to 10 mass ppt with respect to the total mass of the chemical liquid.

In a case where two or more alkenes represented by $C_nC_{2n+2-2x}$, where x is 2 or more, are used, the total content is preferably within the above range.

The content of the organic component in the chemical liquid can be measured by using a gas chromatography mass spectrometry (GCMS) device.

[Metal Component]

The chemical liquid may contain a metal component.

In the present invention, the metal component includes metal particles and metal ions, for example, in the case of being referred to as the content of the metal component, it indicates the total content of the metal particles and metal ions.

The chemical liquid may contain either one of the metal particles or the metal ions, or may contain both of them. The chemical liquid preferably contains both metal particles and metal ions.

Examples of the metal element in the metal component include Na (sodium), K (potassium), Ca (calcium), Fe (iron), Cu (copper), Mg (magnesium), Mn (manganese), Li (lithium), Al (aluminum), Cr (chromium), Ni (nickel), Ti (titanium), and Zr (zirconium). The metal component may contain one or two or more metal elements.

The metal particles may be a simple substance or an alloy, and the metal may be present in a form associated with an organic substance.

The metal component may be a metal component that is inevitably contained in each component (raw material) contained in the chemical liquid, or may be a metal component that is inevitably contained during the production, storage and/or transfer of the treatment liquid, or may be intentionally added.

In a case where the chemical liquid contains the metal component, the content thereof is preferably 0.01 to 500 mass ppt, more preferably 0.01 to 250 mass ppt, and still more preferably 0.01 to 100 mass ppt with respect to the total mass of the chemical liquid, from the viewpoint that the defect suppressing properties of the chemical liquid are more excellent.

It is considered that in a case where the content of the metal component is 0.01 mass ppt or more, it is easy to prevent the organic compound the chemical liquid may contain (especially polar organic compound) from being aggregated into particles on the substrate or the like to form a defect.

Further, in a case where the content of the metal component is less than 500 mass ppt, it is easy to avoid an increase in the occurrence of defects derived from the metal component.

In a case where the chemical liquid contains metal ions, the content thereof is preferably 0.01 to 400 mass ppt, and more preferably 0.01 to 200 mass ppt, and still more preferably 0.01 to 80 mass ppt with respect to the total mass of the chemical liquid, from the viewpoint that the defect suppressing properties of the chemical liquid are more excellent.

In a case where the chemical liquid contains metal particles, the content thereof is preferably 0.01 to 400 mass ppt, more preferably 0.01 to 150 mass ppt, and still more preferably 0.01 to 40 mass ppt with respect to the total mass of the chemical liquid, from the viewpoint that the defect suppressing properties of the chemical liquid are more excellent.

Further, in a case where the chemical liquid contains the metal component, the mass ratio of the content of the organic component to the content of the metal component (mass content of organic component/mass content of metal component) is preferably 0.001 to 10000, more preferably 0.05 to 2000, still more preferably 0.1 to 2000, and particularly preferably 0.1 to 100, from the viewpoint that the defect suppressing properties of the chemical liquid are more excellent.

In a case where the chemical liquid contains metal particles, the mass ratio of the content of the organic component to the content of the metal particles (mass content of the organic component/mass content of metal particles) is preferably 0.01 to 30000, more preferably 0.1 to 6000, still more preferably 0.1 to 1000, particularly preferably 0.1 to 10, and most preferably 0.28 to 3.5, from the viewpoint that the defect suppressing properties of the chemical liquid are more excellent.

In a case where the chemical liquid contains metal ions, the mass ratio of the content of the organic component to the content of the metal ion (mass content of organic component/mass content of metal ion) is preferably 0.01 to 10000, more preferably 0.1 to 2500, still more preferably 0.01 to 1000, particularly preferably 0.1 to 5, and most preferably 0.2 to 1.3, from the viewpoint that the defect suppressing properties of the chemical liquid are more excellent.

The type and the content of the specific metal ions and the specific metal particles in the chemical liquid can be measured by Single Nano Particle Inductively Coupled Plasma Mass Spectrometry (SP-ICP-MS).

The device used in SP-ICP-MS is the same as the device used in general inductively coupled plasma mass spectrometry (ICP-MS). The only difference between SP-ICP-MS and ICP-MS is how to analyze data. With SP-ICP-MS, data can be analyzed using commercial software.

With ICP-MS, the content of metal components as a measurement target is measured regardless of the way the metal components are present. Accordingly, the total mass of metal particles and metal ions as a measurement target is quantified as the content of metal components.

With SP-ICP-MS, the content of metal particles can be measured. Accordingly, by subtracting the content of metal particles from the content of metal components in the sample, the content of metal ions in the sample can be calculated.

Examples of the device for SP-ICP-MS include Agilent 8800 triple quadrupole inductively coupled plasma mass spectrometry (ICP-MS, for semiconductor analysis, option #200) manufactured by Agilent Technologies, Inc. By using this device, the content of metal particles can be measured by the method described in Examples. As devices other than the above, NexION350S manufactured by PerkinElmer Inc. and Agilent 8900 manufactured by Agilent Technologies, Inc can also be used.

[Other Components]

The chemical liquid may contain other components other than the above. Examples of the other components include other organic compounds, water, and resins.

<Water>

The chemical liquid may contain water. The water is not particularly limited, and for example, distilled water, ion-exchanged water, pure water, and the like can be used.

Water may be added to the chemical liquid, or may be unintentionally mixed in the chemical liquid in the manufacturing process of the chemical liquid. Examples of the case of unintentional mixing in the manufacturing process of the chemical liquid include, but are not limited to, a case where water is contained in a raw material (for example, an organic solvent) used for manufacturing the chemical liquid, and a case where water is mixed in the manufacturing process of the chemical liquid (for example, contamination).

The content of water in the chemical liquid is not particularly limited. Generally, the content of water is preferably 0.05% to 2.0% by mass with respect to the total mass of the chemical liquid. The content of water in the chemical liquid means the content of water measured using an apparatus utilizing a Karl Fischer moisture content measurement method as the measurement principle.

<Resin>

The chemical liquid may further contain a resin. The resin is more preferably a resin P containing a group which decomposes by the action of an acid to generate a polar group (repeating unit containing an acid-decomposable group). The resin is more preferably a resin containing a repeating unit represented by the formula (AI) described later, which is a resin whose solubility in a developer containing an organic solvent as a main component is reduced by the action of an acid. The resin containing a repeating unit represented by the formula (AI) described later contains a group that decomposes by the action of an acid to generate an alkali-soluble group.

Examples of the polar group include alkali-soluble groups. Examples of the alkali-soluble group include a carboxy group, a fluorinated alcohol group (preferably a hexafluoroisopropanol group), a phenolic hydroxyl group, and a sulfo group.

In the acid-decomposable group, the polar group is protected by a group capable of leaving with an acid (acid-leaving group). Examples of the acid-leaving group include —C($R_{36}$)($R_{37}$)($R_{38}$), —C($R_{36}$)($R_{37}$)(O$R_{39}$), and —C($R_{01}$)($R_{02}$)(O$R_{39}$).

In the formula, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

Hereinafter, the resin P whose solubility in a developer containing an organic solvent as a main component is reduced by the action of an acid will be described in detail.

(Formula (AI): Repeating Unit Containing an Acid-Decomposable Group)

The resin P preferably contains a repeating unit represented by the formula (AI).

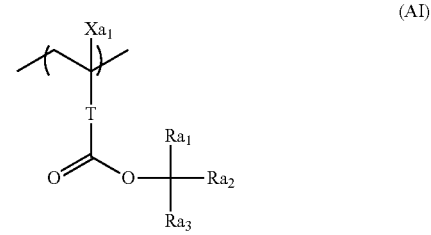

(AI)

In the formula (AI), $Xa_1$ represents a hydrogen atom or an alkyl group which may have a substituent.

T represents a single bond or a divalent linking group.

$Ra_1$ to $Ra_3$ each independently represent an alkyl group (linear or branched) or a cycloalkyl group (monocyclic or polycyclic).

Two of $Ra_1$ to $Ra_3$ may be bonded to each other to form a cycloalkyl group (monocyclic or polycyclic).

The content of the repeating unit containing an acid-decomposable group (preferably the repeating unit represented by the formula (AI)) is preferably 20% to 90 mol %, more preferably 25% to 85 mol %, and still more preferably 30% to 80 mol % with respect to all the repeating units in the resin P.

Further, the resin P may contain other repeating units in addition to the repeating unit containing an acid-decomposable group. Examples of the other repeating unit include a repeating unit containing a lactone structure, a repeating unit containing a phenolic hydroxyl group, a repeating unit containing a polar group, and a repeating unit containing a silicon atom in a side chain.

The weight-average molecular weight of the resin P is preferably 1,000 to 200,000, more preferably 3,000 to 20,000, and still more preferably 5,000 to 15,000 in terms of polystyrene as determined by the GPC (Gel permeation chromatography) method. In a case where the weight-average molecular weight is 1,000 to 200,000, deterioration in heat resistance and dry etching resistance, deterioration in developability, and deterioration in film formability due to high viscosity can be prevented.

The dispersity (molecular weight distribution) is usually 1 to 5, preferably 1 to 3, more preferably 1.2 to 3.0, and still more preferably 1.2 to 2.0.

The content of the resin P in the chemical liquid is preferably 50% to 99.9% by mass and more preferably 60% to 99.0% by mass in the total solid content.

Further, in the chemical liquid, the resin P may be used as a single resin, or a plurality of kinds.

Any of known components such as an acid generator, a basic compound, a quencher, a hydrophobic resin, a surfactant, and a solvent can be used in the chemical liquid as long as they do not conflict with the requirements of the present invention. The chemical liquid may also contain, for example, a component contained in an actinic ray-sensitive or radiation-sensitive resin composition described in JP2013-195844A, JP2016-057645A, JP2015-207006A, WO2014/148241, JP2016-188385A, JP2017-219818A, and the like.

<Other Organic Compounds>

The chemical liquid may contain other organic compounds other than those described above.

The other organic compound means an organic compound which is neither an alkane having 12 to 50 carbon atoms nor an alkene having 12 to 50 carbon atoms, and has a content of 10000 mass ppm or less with respect to the total mass of the chemical liquid.

Examples of the other organic compounds include alkanes having less than 12 carbon atoms and alkenes having less than 12 carbon atoms.

Other organic compounds may be added to the chemical liquid or may be unintentionally mixed in the manufacturing process of the chemical liquid. Examples of the case of unintentional mixing in the manufacturing process of the chemical liquid include, but are not limited to, a case where another organic compound is contained in a raw material (for example, an organic solvent) used for manufacturing the chemical liquid, and a case where another organic compound is mixed in the manufacturing process of the chemical liquid (for example, contamination).

In a case where the chemical liquid contains other organic compounds, the content is preferably 0.001 to 10,000 mass ppt, more preferably 0.1 to 80 mass ppt, and still more preferably 1 to 15 mass ppt with respect to the total mass of the chemical liquid.

The content of other organic compounds in the chemical liquid can be measured by using a gas chromatography mass spectrometry (GCMS) device.

<Use of Chemical Liquid>

The chemical liquid according to the embodiment is preferably used for manufacturing a semiconductor device.

Specifically, in the manufacturing process of a semiconductor device including a lithography step, an etching step, an ion implantation step, a peeling step, and the like, the chemical liquid is used to treat organic substance after completion of each step or before the next step is performed, and it is suitably used as a prewet solution, a developer, a rinsing solution, a peeling solution, and the like. For example, it can be used for rinsing the edge lines of a semiconductor substrate before and after being coated with the resist application.

Alternatively, the chemical liquid may be used as a diluent or the like for the resin contained in the resist liquid. In addition, it may be also be diluted with another organic solvent and/or water, and the like.

Further, the chemical liquid can be used for other uses other than manufacturing of semiconductor devices, and can also be used as a developer such as polyimide, resist for sensors, and resist for lenses, and rinsing solution, and the like.

Further, the chemical liquid can also be used as a solvent for medical uses or washing uses. For example, the chemical liquid can be suitably used for washing containers, pipes, substrates (for example, a wafer and glass), and the like.

As the washing use, it is also preferable to use the washing solution (such as pipe washing solution and container washing solution) for washing the pipes, container, and the like with which the liquid such as the prewet solution as described above comes into contact.

In particular, the chemical liquid exerts a more excellent effect when in the case of being applied to the prewet solution, the developer, and the rinsing solution in the pattern formation. Further, even in the case of being applied to a pipe washing solution used for pipes used for transferring these liquids, a more excellent effect is exerted.

<Method for Manufacturing Chemical Liquid>

As the method for manufacturing the chemical liquid, known methods can be used without particular limitation. In particular, the method for manufacturing a chemical liquid preferably includes a filtration step of filtering a substance to be purified containing an organic solvent using a filter to obtain a chemical liquid, from the viewpoint of obtaining a chemical liquid exhibiting more excellent effects of the present invention.

The substance to be purified used in the filtration step may be procured by purchasing or the like, or may be obtained by reacting raw materials. The substance to be purified preferably has a low content of impurities. Examples of commercially available products of such a substance to be purified include the substances called "high-purity grade products".

As the method for obtaining a substance to be purified (typically, a substance to be purified containing an organic solvent) by reacting raw materials, known methods can be used without particular limitation. Examples thereof include a method for obtaining an organic solvent by reacting a single raw material or a plurality of raw materials in the presence of a catalyst.

More specific examples of the method include a method for obtaining butyl acetate by reacting acetic acid and n-butanol in the presence of sulfuric acid; a method for obtaining 1-hexanol by reacting ethylene, oxygen, and water in the presence of $Al(C_2H_5)_3$; a method for obtaining 4-methyl-2-pentanol by reacting cis-4-methyl-2-pentene in the presence of Diisopinocamphenyl borane (Ipc2BH); a method for obtaining propylene glycol 1-monomethyl ether 2-acetate (PGMEA) by reacting propylene oxide, methanol and acetic acid in the presence of sulfuric acid; a method for obtaining isopropyl alcohol (IPA) by reacting acetone and hydrogen in the presence of copper oxide-zinc oxide-aluminum oxide; and a method for obtaining ethyl lactate by reacting lactic acid and ethanol.

<Filtration Step>

The method for manufacturing a chemical liquid according to the embodiment of the present invention includes a filtration step of filtering the substance to be purified using a filter to obtain a chemical liquid. The method of filtering the substance to be purified using a filter is not particularly limited, but it is preferable to pass the substance to be purified through (pass through) a filter unit having a housing and a filter cartridge accommodated in the housing with or without pressure.

Filter Pore Size

The pore size of the filter is not particularly limited, and a filter having a pore size that is normally used for filtering the substance to be purified can be used. Among others, the pore size of the filter is preferably 200 nm or less, more preferably 20 nm or less, still more preferably 10 nm or less, particularly preferably 5 nm or less, and most preferably 3 nm or less, from the viewpoint of ease of controlling the number of particles (such as metal particles) contained in the chemical liquid within a desired range. The lower limit value is not particularly limited, but is preferably 1 nm or more in general from the viewpoint of productivity.

In the present specification, the pore size of and pore size distribution of a filter mean the pore size and pore size distribution as determined by the bubble point of isopropanol (IPA) or HFE-7200 ("NOVEC 7200", manufactured by 3M Company, hydrofluoroether, $C_4F_9OC_2H_5$).

The pore size of the filter is preferably 5.0 nm or less from the viewpoint of easier controlling of the number of particles contained in the chemical liquid. Hereinafter, a filter having a pore size of 5 nm or less is also referred to as a "fine pore size filter".

The fine pore size filter may be used alone or may be used with a filter having another pore size. In particular, it is preferable to use a filter having a larger pore size in combination from the viewpoint of being more excellent in productivity. In this case, clogging of the fine pore size filter can be prevented by passing the substance to be purified, which has been previously filtered through a filter having a larger fine pore size, through the fine pore size filter.

In other words, in a case where one filter is used, the pore size of the filter is preferably 5.0 nm or less, and in a case where two or more filters are used, the pore size of the filter having the smallest pore size is 5.0 nm or less.

The configuration in which two or more filters having different pore sizes are sequentially used is not particularly limited, and examples thereof include a method in which the filter units described above are sequentially arranged along the pipe line through which the substance to be purified is transferred. At this time, in a case where an attempt is made to keep the flow rate of the substance to be purified per unit time constant in the entire pipeline, a larger pressure may be applied to the filter unit having a smaller pore size than to the filter unit having a larger pore size. In this case, it is preferable to place a pressure regulating valve, a damper, or the like between the filter units to keep the pressure applied to the filter unit having a small pore size constant, or to place a filter unit in which the same filter is accommodated in parallel along the pipe line to increase the filtering area. By doing so, the number of particles in the chemical liquid can be controlled more stably.

Filter Material

As the material for the filter, known materials for the filter can be used without particular limitation. Specific examples thereof include, in the case of resins, polyamide such as nylon (for example, 6-nylon and 6,6-nylon); polyolefin such as polyethylene and polypropylene; polystyrene; polyimide; polyamide imide; poly(meth)acrylate; polyfluorocarbons such as polytetrafluoroethylene, perfluoroalkoxyalkane, perfluoroethylene propene copolymer, ethylene-tetrafluoroethylene copolymer, ethylene-chlorotrifluoroethylene copolymer, polychlorotrifluoroethylene, polyvinylidene fluoride, and polyvinyl fluoride; polyvinyl alcohol; polyester; cellulose; and cellulose acetate. Particularly, at least one selected from the group consisting of nylon (among them, 6,6-nylon is preferable), polyolefin (among them, polyethylene is preferable), poly(meth)acrylate, and polyfluorocarbon (among them, polytetrafluoroethylene (PTFE) and perfluoroalkoxyalkane (PFA) are preferable) is preferable from the viewpoint of obtaining further improved solvent resistance and obtaining the chemical liquid obtained having more excellent defect suppressing property. These polymers may be used alone or in combination of two or more.

Further, in addition to the resin, diatomite, glass, or the like may also be used.

In addition, a polymer (such as nylon-grafted UPE) obtained by graft-copolymerizing a polyamide (for example, nylon such as nylon-6 or nylon-6,6) onto a polyolefin (such as UPE described later) may be used as a material for the filter.

The filter may be a surface-treated filter. As the surface treatment method, known methods can be used without particular limitation. Examples of the surface treatment method include a chemical modification treatment, a plasma treatment, a hydrophobization treatment, coating, a gas treatment, and sintering.

Plasma treatment is preferred due to the hydrophilic nature of the filter surface. The water contact angle on the surface of the filter material hydrophilized by plasma treatment is not particularly limited, but the static contact angle at 25° C. as measured by a contact angle meter is preferably 60° or less, more preferably 50° or less, and still more preferably 30° or less.

As the chemical modification treatment, a method of introducing an ion exchange group into a base material is preferable.

That is, the filter is preferably obtained by using various materials exemplified above as a base material and introducing an ion exchange group into the base material. Typically, it is preferable that the filter includes a layer, which contains a base material having an ion exchange group, on a surface of the base material described above. Although the surface-modified base material is not particularly limited, a filter obtained by introducing ion exchange groups into the aforementioned polymer is preferable from the viewpoint of easier manufacturing.

Examples of the ion exchange group include a cation exchange group such as a sulfonic acid group, a carboxy group, and a phosphoric acid group, and an anion exchange group such as a quaternary ammonium group. The method of introducing the ion exchange group into the polymer is not particularly limited, and examples thereof include a method of reacting a compound containing an ion exchange group and a polymerizable group with a polymer such that the compound is grafted on the polymer typically.

Although the method of introducing the ion exchange group is not particularly limited, the aforementioned fibers of the resin are irradiated with ionizing radiation (such as α-Ray, β-ray, γ-ray, X-ray, and electron beam) to form an active portion (radical) in the resin. The resin after the irradiation is immersed in a monomer-containing solution to graft-polymerize a monomer on the base material. As a result, this monomer is bonded to the polyolefin fiber generating a polymer as a graft polymerization side chain. The resin containing the generated polymer as a side chain is brought into contact and reacted with a compound containing an anion exchange group or a cation exchange group to introduce an ion exchange group into the graft-polymerized side chain polymer to obtain a final product.

Further, the filter may have a structure obtained by combining a woven or non-woven fabric having an ion exchange group formed by a radiation graft-polymerization method with a conventional glass wool, a woven or non-woven filter material.

The use of a filter containing an ion exchange group makes it easy to control the content of particles containing metal atoms in a chemical liquid within a desired range. The material of the filter containing an ion exchange group is not particularly limited, and examples thereof include a material obtained by introducing an ion exchange group into polyfluorocarbon or polyolefin, of which more preferred is a material obtained by introducing an ion exchange group into polyfluorocarbon.

The pore size of the filter containing an ion exchange group is not particularly limited, but is preferably 1 to 30 nm, and more preferably 5 to 20 nm. The filter containing an ion exchange group may also serve as the filter having the smallest pore size described above, or may be used separately from the filter having the smallest pore size. Among others, the filtration step is preferably configured to use a filter containing an ion exchange group and a filter having the smallest pore size without an ion exchange group, from the viewpoint of obtaining a chemical liquid exhibiting more excellent effects of the present invention.

The material of the filter having the smallest pore size described above is not particularly limited, but is preferably, generally, at least one selected from the group consisting of polyfluorocarbon and polyolefin, and more preferably polyolefin, from the viewpoint of solvent resistance and the like.

Therefore, as the filter used in the filtration step, two or more filters made of different materials may be used, and for example, two or more selected from the group consisting of filters made of polyolefin, polyfluorocarbon, polyamide, and a material obtained by introducing an ion exchange group thereto may be used.

Filter Pore Structure

The pore structure of the filter is not particularly limited and may be appropriately selected according to the components in the substance to be purified. In the present specification, the pore structure of the filters means the pore size distribution, the positional distribution of pores in the filters, the shape of pores, and the like, and is typically controllable by the method for manufacturing the filter.

For example, a porous membrane can be obtained by forming a powder of resin or the like by sintering, and a fibrous membrane can be obtained by forming by a method such as electrospinning, electroblowing, and meltblowing. These have different pore structures.

"Porous membrane" means a membrane that retains components in the substance to be purified such as gels, particles, colloids, cells, and poly-oligomers, but allows components substantially smaller than the pores to pass through the pores. The retention of components in the substance to be purified by the porous membrane may depend on operating conditions, such as surface velocity, surfactant usage, pH, and combinations thereof, and may depend on the pore size and structure of the porous membrane and the size and structure (such as hard particles or gels) of the particles to be removed.

In a case where the substance to be purified contains particles that are negatively charged, a filter made of polyamide functions as a non-sieving membrane for the removal of such particles. Examples of typical non-sieving membranes include, but are not limited to, nylon membranes such as nylon-6 membranes and nylon-6,6 membranes.

As used herein, the retention mechanism by "non-sieving" refers to retention caused by a mechanism such as interference, diffusion, and adsorption, which are unrelated to the pressure drop and the pore size of the filter.

Non-sieving retention includes retention mechanisms such as interference, diffusion and adsorption, which remove particles to be removed in the substance to be purified regardless of the pressure drop of the filter or the pore size of the filter. Adsorption of particles to the filter surface can be mediated by, for example, intermolecular Van der Waals forces and electrostatic forces. An interference effect occurs in a case where particles moving in a non-sieving membrane layer with serpentine paths cannot change direction enough to avoid contacting with the non-sieving membrane. Particle transport by diffusion arises primarily from the random or Brownian motion of small particles, which creates a certain probability that the particles will collide with the filter material. In a case where there is no repulsive force between the particles and the filter, the non-sieving retention mechanism can be activated.

Ultra high molecular weight polyethylene (UPE) filters are typically sieving membranes. Sieving membrane means a membrane that captures particles primarily via a sieving retention mechanism, or a membrane optimized to capture particles via a sieving retention mechanism.

Typical examples of sieving membranes include, but are not limited to, polytetrafluoroethylene (PTFE) membranes and UPE membranes.

The "sieving retention mechanism" refers to the retention resulting from that the particles to be removed are larger than the pore size of the porous membrane. Sieve retention force is enhanced by forming a filter cake (aggregation of particles to be removed on the surface of the membrane). The filter cake effectively functions a secondary filter.

The material of the fibrous membrane is not particularly limited as long as it is a polymer capable of forming the fibrous membrane. Examples of the polymer include polyamide. Examples of the polyamide include nylon 6 and nylon 6,6. The polymer forming the fibrous membrane may be poly(ether sulfone). In a case where the fibrous membrane is on the primary side of the porous membrane, the surface energy of the fibrous membrane is preferably higher than the polymer which is the material of the porous membrane on the secondary side. Such a combination includes, for example, a case where the material of the fibrous membrane is nylon and the porous membrane is polyethylene (UPE).

As the method for manufacturing the fibrous membrane, known methods can be used without particular limitation. Examples of the method for manufacturing the fibrous membrane include electrospinning, electroblowing, and meltblowing.

The pore structure of the porous membrane (Porous membrane containing, for example, UPE and PTFE) is not particularly limited, but the pore shapes include, for example, a lace-like shape, a string-like shape, and a node-like shape.

The size distribution of pores in the porous membrane and the position distribution in the membrane are not particularly limited. The size distribution may be smaller and the distribution position in the membrane may be symmetric. Further, the size distribution may be larger and the distribution position in the membrane may be asymmetric (the aforementioned membrane is also referred to as "asymmetric porous membrane"). In asymmetric porous membranes, the size of the pores varies in the membrane, typically increasing in pore size from one surface of the membrane to the other surface of the membrane. At this time, the surface on the side with a large number of pores having a larger pore size is referred to as the "open side", and the surface on the side with a large number of pores having a smaller pore size is also referred to as the "tight side".

Further, examples of the asymmetric porous membrane include a membrane in which the size of pores is minimized at a certain position within the thickness of the membrane (this is also referred to as "hourglass shape").

Using the asymmetric porous membrane with larger sized pores on the primary side, in other words, with the primary side as the open side, the pre-filtration effect can be produced.

The porous membrane may include a thermoplastic polymer such as polyethersulfone (PESU), perfluoroalkoxyalkane (PFA, copolymer of tetrafluoroethylene and perfluoroether), polyamides, and polyolefins, or may include polytetrafluoroethylene and the like.

Among them, the material of the porous membrane is preferably ultra high molecular weight polyethylene. Ultra high molecular weight polyethylene means thermoplastic polyethylene having an extremely long chain, and preferably has a molecular weight of 1 million or more, typically 2 to 6 million.

As the filter used in the filtration step, two or more filters having different pore structures may be used, or a porous membrane filter and a fibrous membrane filter may be used in combination. Specific examples thereof include a method using a nylon fibrous membrane filter and a UPE porous membrane filter.

Further, it is preferable to thoroughly wash the filter before use.

In the case of using an unwashed filter (or a filter that has not been sufficiently washed), impurities contained in the filter are likely to be brought into the chemical liquid.

Examples of the impurities contained in the filter include, the aforementioned organic components, and in a case where the filtration step is performed using an unwashed filter (or a filter that has not been sufficiently washed), the content of the organic components in the chemical liquid may exceed the allowable range as the chemical liquid of the present invention.

For example, in a case where a polyolefin such as UPE and a polyfluorocarbon such as PTFE are used for the filter, the filter is likely to contain alkanes having 12 to 50 carbon atoms as impurities.

Further, in a case where a polyamide, such as nylon, a polyimide, or a polymer obtained by graft-copolymerizing a polyamide (such as nylon) onto a polyolefin (such as UPE) is used as the filter, the filter is likely to contain alkenes having 12 to 50 carbon atoms as impurities.

Examples of the method of washing the filter include a method of immersing the filter in an organic solvent having a low impurity content (for example, an organic solvent obtained by distillation purification (such as PGMEA)) for one week or more. In this case, the liquid temperature of the organic solvent is preferably 30° C. to 90° C.

The substance to be purified may be filtered using a filter with an adjusted degree of washing, and the resulting chemical liquid may also be adjusted so as to contain a desired amount of the organic component derived from the filter.

As described above, the filtration step according to the embodiment of the present invention may be a multistage filtration step in which the substance to be purified is passed through two or more filters which are different from each other in at least one selected from the group consisting of the material of the filter, the pore size and the pore structure.

Further, the substance to be purified may be passed through the same filter a plurality of times, or the substance to be purified may be passed through a plurality of filters of the same kind.

There is no particular limitation on the material of the liquid contact portion (meaning the inner wall surface or the like at which the substance to be purified and the chemical liquid may come into contact with each other) of the purifier used in the filtration step of the purification device used in the filtration step, but is preferably formed from at least one selected from the group consisting of nonmetallic materials (such as fluororesin) and electropolished metallic materials (such as stainless steel) (hereinafter, these are also collectively referred to as "corrosion-resistant material"). For example, the expression "the liquid contact portion of the manufacturing tank is formed from a corrosion-resistant material" means that the manufacturing tank itself consists of a corrosion-resistant material, or that the inner wall surface of the manufacturing tank is coated with a corrosion-resistant material.

As the nonmetallic material, known materials can be used without particular limitation.

Examples of the nonmetallic material include, but are not limited to, at least one material selected from the group consisting of a polyethylene resin, a polypropylene resin, a polyethylene-polypropylene resin, and a fluororesin (for example, a tetrafluoroethylene resin, a tetrafluoroethylene-perfluoroalkyl vinyl ether copolymer resin, a tetrafluoroethylene-hexafluoropropylene copolymer resin, a tetrafluoroethylene-ethylene copolymer resin, a chlorotrifluoro ethylene-ethylene copolymer resin, a vinylidene fluoride resin, a chlorotrifluoroethylene copolymer resin, and a vinyl fluoride resin).

As the metallic material, known materials can be used without particular limitation.

Examples of the metallic material include, but are not limited to, a metallic material in which the total content of chromium and nickel with respect to the total mass of the metallic material is more than 25% by mass, and more preferably 30% by mass or more with respect to the total mass of the metallic material. The upper limit value of the total content of chromium and nickel in the metallic material is not particularly limited, but is preferably 90% by mass or less in general.

Examples of the metallic material include stainless steel and a nickel-chromium alloy.

As the stainless steel, known stainless steel can be used without particular limitation. Among those, the stainless steel is preferably an alloy containing nickel in an amount of 8% by mass or more is preferable, and more preferably austenite-based stainless steel containing nickel in an amount of 8% by mass or more. Examples of the austenite-based stainless steel include steel use stainless (SUS) 304 (Ni content: 8% by mass, Cr content: 18% by mass), SUS304L (Ni content: 9% by mass, Cr content: 18% by mass), SUS316 (Ni content: 10% by mass, Cr content: 16% by mass), and SUS316L (Ni content: 12% by mass, Cr content: 16% by mass).

As the nickel-chromium alloy, known nickel-chromium alloys can be used without particular limitation. Among those, the nickel-chromium alloy is preferably a nickel-chromium alloy in which the nickel content is 40% to 75% by mass and the chromium content is 1% to 30% by mass.

Examples of the nickel-chromium alloy include HASTELLOY (trade name, the same applies below), MONEL (trade name, the same applies below), and INCONEL (trade name, the same applies below). More specific examples thereof include HASTELLOY C-276 (Ni content: 63% by mass, Cr content: 16% by mass), HASTELLOY C (Ni content: 60% by mass, Cr content: 17% by mass), and HASTELLOY C-22 (Ni content: 61% by mass, Cr content: 22% by mass).

Further, the nickel-chromium alloy may further contain boron, silicon, tungsten, molybdenum, copper, cobalt, and the like in addition to the aforementioned alloy, as necessary.

As the method for electropolishing the metallic material, known methods can be used without particular limitation. For example, it is possible to use the methods described in paragraphs "0011" to "0014" in JP2015-227501A, paragraphs "0036" to "0042" in JP2008-264929A, and the like.

Presumably, the chromium content in the passivation layer on the surface of the electropolished metallic material is higher than the chromium content in the matrix. Therefore, it is presumed that in a case where a purification device in which the liquid contact portion is formed from the electropolished metallic material is used, metal-containing particles are less likely to flow out into the substance to be purified.

The metallic material may have undergone buffing. As the buffing method, known methods can be used without particular limitation. The size of abrasive grains used for finishing the buffing is not particularly limited, but is preferably equal to or smaller than #400 from the viewpoint that such grains make it easy to further reduce the surface asperity of the metallic material. The buffing is preferably performed before the electropolishing.

<Other Steps>

The method for manufacturing the chemical liquid may further include a step other than the filtration step. Examples of steps other than the filtration step include a distillation step, a reaction step, and a charge removing step.

(Distillation Step)

The distillation step is a step of distilling a substance to be purified containing an organic solvent to obtain a distilled substance to be purified. As the method for purifying the substance to be purified, known methods can be used without particular limitation. A typical example thereof is a method in which a distillation column is placed on the primary side of the purification device used in the filtration step and the distilled substance to be purified is introduced into a manufacturing tank.

At this time, the liquid contact portion of the distillation column is not particularly limited, but it is preferably formed of a corrosion-resistant material described above.

(Reaction Step)

The reaction step is a step of reacting the raw materials to produce a substance to be purified containing an organic solvent which is the reaction product. As the method for producing the substance to be purified, known methods can be used without particular limitation. A typical example thereof is a method in which a reactor is placed on the primary side of a manufacturing tank (or a distillation column) of a purification device used in a filtration step, and a reaction product is introduced into the manufacturing tank (or a distillation column).

At this time, the liquid contact portion of the manufacturing tank is not particularly limited, but is preferably formed of a corrosion-resistant material described above.

(Charge Removing Step)

The charge removing step is a step of removing charge from the substance to be purified to reduce the charging potential of the substance to be purified.

As the charge removing method, known charge removing methods can be used without particular limitation. Examples of the charge removing method include a method for bringing the substance to be purified into contact with a conductive material.

The contact time for which the substance to be purified is brought into contact with a conductive material is preferably 0.001 to 60 seconds, more preferably 0.001 to 1 second, and still more preferably 0.01 to 0.1 seconds. Examples of the conductive material include stainless steel, gold, platinum, diamond, and glassy carbon.

Examples of the method for bringing the substance to be purified into contact with a conductive material include a method for disposing a grounded mesh consisting of a conductive material in the interior of a pipe line and passing the substance to be purified through the mesh.

During the purification of the substance to be purified, it is preferable to perform all the accompanying activities, such as the opening of a container, washing of a container and a device, storage of a solution, analysis, and the like in a clean room. The clean room is preferably a clean room with a cleanliness of class 4 or higher defined by International Standard ISO 14644-1:2015 defined by International Organization for Standardization. The clean room preferably meets any of International Organization for Standardization (ISO) class 1, ISO class 2, ISO class 3, or ISO class 4, more preferably meets ISO class 1 or ISO class 2, and still more preferably meets ISO class 1.

Although the preservation temperature of the chemical liquid is not particularly limited, the preservation temperature is preferably 4° C. or higher from the viewpoint that impurities contained in the chemical liquid in a trace amount are less likely to elute and the more excellent effect of the present invention can be obtained.

[Chemical Liquid Storage Body]

The chemical liquid manufactured by the purification method may be stored in a container and preserved until use.

Such a container and the chemical liquid stored in the container are collectively referred to as a chemical liquid storage body. The chemical liquid is taken out from the preserved chemical liquid storage body and used.

The container for preserving the above chemical liquid is preferably a container having a high degree of cleanliness and little elution of impurities for use in manufacturing semiconductor devices.

Specific examples of usable containers include, but are not limited to, "Clean Bottle" series manufactured by Aicello Chemical Co., Ltd. and "Pure Bottle" manufactured by Kodama plastics Co., Ltd.

The container to be used is also preferably a multi-layer bottle having an inner wall with a six-layer structure made of six kinds of resins or a seven-layer structure made of six kinds of resins for the purpose of preventing impurities from entering the chemical liquid (contamination). Examples of these containers include containers described in JP2015-123351A.

The liquid contact portion of the container may be a corrosion-resistant material (preferably electropolished stainless steel or fluororesin) described above or glass. From the viewpoint that the more excellent effect of the present invention can be obtained, it is preferable that 90% or more of the area of the liquid contact portion consists of the above materials, and it is more preferable that the entire liquid contact portion consists of the materials.

The void volume of the chemical liquid storage body in the container is preferably 2% to 80% by volume, more preferably 2% to 50% by volume, and still more preferably 5% to 30% by volume.

The void volume is calculated according to the expression (1).

$$\text{void volume} = \{1 - (\text{volume of the chemical liquid in the container}/\text{volume of the container})\} \times 100 \quad \text{Expression (1)}$$

The container volume is synonymous with the internal volume (capacity) of the container.

In a case where the void volume is relatively small, the amount of organic compounds in the air can be reduced because there is less air in the voids, which reduces the amount of organic compounds in the air mixing into the chemical liquid, so that the composition of the stored chemical liquid can be easily stabilized.

In a case where the void volume is 2% by volume or more, the chemical liquid can be easily handled because there is an appropriate space.

EXAMPLES

Hereinafter, the present invention will be more specifically described based on examples. The materials, the amount and proportion of the materials used, the details of treatments, the procedure of treatments, and the like shown in the following examples can be appropriately modified as long as the gist of the present invention is maintained. Accordingly, the scope of the present invention is not limited to the following examples.

At the time of preparation of chemical liquids of Examples and Comparative Examples, all of the handling of containers and the preparation, filling, preservation, analysis, and measurement of chemical liquids were performed in a clean room that meets a level equal to or lower than the ISO Class 2 or 1. In order to improve the measurement accuracy, in the measurement of the content of the organic component and the measurement of the content of the metal component, in a case where the measurement of components at the detection limit or below by normal measurement is performed, the chemical liquid was concentrated and then measured, and the contents were calculated by converting it to the concentration of the solution before concentration.

[Preparation of Chemical Liquid]
[Preparation of Filter]

The filters used for the purification of the chemical liquid were all filters washed with a washing solution obtained by distillation purification of commercially available propylene glycol monomethyl ether acetate (PGMEA). In the washing, the entire filter unit containing the filter was immersed in PGMEA to wash the entire liquid contact portion. Further, the washing period (immersion period) was set to one week or more. The liquid temperature of PGMEA was maintained at 30° C. during the washing.

The following filters were used as filters.
UPE: ultra high molecular weight polyethylene filter, manufactured by Entegris, pore size 3 nm
PTFE: polytetrafluoroethylene filter, manufactured by Entegris, pore size 10 nm
Nylon: nylon filter, manufactured by PALL, pore size 5 nm
Nylon-grafted UPE: Nylon/ultra high molecular weight polyethylene graft copolymer filter, manufactured by Entegris, pore size 3 nm
Polyimide: polyimide filter, manufactured by Entegris, pore size 10 nm

[Purification]
<Substance to be Purified>

The following organic solvents were used as substances to be purified for the manufacture of the chemical liquids of Examples and Comparative Examples. Commercially available products were used for all of the following organic solvents.

The values in parentheses indicate the Hansen solubility parameter distances to eicosene (unit: $MPa^{0.5}$) in the case of using the organic solvent alone.

PGMEA: propylene glycol monomethyl ether acetate (9.5)
CHN: cyclohexanone (9.1)
EL: ethyl lactate (12.9)
PGME: propylene glycol monomethyl ether (11.0)
PC: propylene carbonate (19.1)
MMP: methyl methoxypropionate (8.8)
IPA: isopropanol (15.8)
MIBC: 4-methyl-2-pentanol (11.1)
NBA: butyl acetate (5.6)
MeOH: methanol (23.7)
Undecane: undecane (1.8)
Butyl butyrate: butyl butyrate (4.6)
Isoamyl Ether: isoamyl ether (diisoamyl ether) (2.1)
Ethylcyclohexane: ethylcyclohexane (1.8)
IAA: isoamyl acetate (6.0)
Isobutyl isobutyrate: isobutyl isobutyrate (3.6)
Methyl Malonate: dimethyl malonate (10.3)

In the case of using two organic solvents in combination, the organic solvents were purchased before mixing and predetermined amounts thereof were mixed to obtain the substance to be purified.

In the case of using two organic solvents are used in combination, the numerical value described indicates the mixing ratio (mass ratio) of the organic solvent.

For example, the description "PGME/PGMEA=7/3" means a 7:3 mixture (mass ratio) of PGMEA and PGME, wherein the Hansen solubility parameter distance to eicosene (the weighted average value of the Hansen solubility parameter based on the molar ratio of the content of each organic solvent) in all such mixtures is 11.0 $MPa^{0.5}$.

<Container>

The following containers were used as the containers for storing the chemical liquids.
EP-SUS: container of which a liquid contact portion is electropolished stainless steel
PFA: container of which a liquid contact portion is coated with perfluoroalkoxyalkane One selected from the substances to be purified was distilled, and the substance to be purified having been purified by distillation was further passed through the filter subjected to the washing one or more times, and then stored in various containers at a predetermined void volume.

In addition, in the course of purification, stainless steel pipes in which the liquid contact portion was electropolished or stainless steel pipes in which the liquid contact portion was not electropolished were used as the pipe for transferring the substance to be purified and the chemical liquid.

The type of substance to be purified, the type of filter, the washing period of the filter, the number of times of passage, the type of pipe, and the length of the pipe (distance of transfer by pipe) were appropriately changed to obtain the chemical liquids shown in Table 1.

However, the chemical liquid with a total hydrocarbon content of more than 1,000,000 mass ppt, such as Comparative Example AB01, was prepared by passing the chemical liquid through a filter that had not been subjected to the above-mentioned washing process.

Further, chemical liquids containing an alkane and/or an alkene having less than 12 carbon atoms, such as Comparative Example HB07, were prepared by adding an alkane and an alkene having 6 and 10 carbon atoms to the substance to be purified after passing through a filter so as to have the contents shown in Table 1.

Hereinafter, the numbers of Examples or Comparative Examples are consistent with the numbers of the chemical liquids. For example, the chemical liquid prepared in Example AA01 and used for the test is referred to as chemical liquid AA01.

[Analysis]

The content of the organic component and the metal component of the chemical liquid was measured by the method shown below.

<Content of Organic Components>

The content of organic components in various chemical liquids was analyzed using a gas chromatography mass spectrometry (GC/MS) device.

<Content of Metal Component>

The content of metal components (metal ions and metal particles) in the chemical liquid was measured by a method using ICP-MS and SP-ICP-MS.

The equipment used was the following apparatus.
Manufacturer: PerkinElmer
Model: NexION 350S
The following analysis software was used for the analysis.
Syngistix Nano Application Module for "SP-ICP-MS"
Syngistix for ICP-MS software In addition, among the alkanes or alkenes detected from the chemical liquid, all of the alkanes or alkenes having 20 or more carbon atoms had a boiling point of 380° C. or higher.

The following table shows the manufacturing conditions of the chemical liquid in each Example, the contents of the organic component and the metal component.

Tables 1a1 to 1a19 list the types of organic solvents and filters used in the manufacture of the chemical liquids.

Tables 1b1 to 1b19 list the alkane contents in the chemical liquids.

Tables 1c1 to 1c19 list the alkene contents in the chemical liquids.

Tables 1d1 to 1d19 list the metal component content in the chemical liquids and the like.

In Tables 1a1 to 1a19, the values described in the lower columns of the "HSP distance to eicosane" and the "HSP distance to eicosene" mean the Hansen solubility parameter distance to eicosane or eicosene of the organic solvent used (unit: $MPa^{0.5}$).

In a system in which two or more organic solvents are mixed, it means the weighted average value of Hansen solubility parameters based on the molar ratio of the content of each organic solvent.

The column "C log P" shows the C log P value of the organic solvent used.

In a system in which two or more organic solvents are mixed, it means the weighted average value of C log P value based on the molar ratio of the content of each organic solvent.

In Tables 1b1 to 1b19 and Tables 1c1 to 1c19, the values described in the lower columns of the carbon numbers of alkanes and alkenes represented by $C_kH_{2k}$ (alkenes containing one or more C=C double bonds) indicate the content of alkanes or alkenes represented by $C_kH_{2k}$ of each number of carbon atoms. For example, in Table 1b1, the chemical liquid AA01 contains 2 mass ppt of the alkane having 18 carbon atoms with respect to the total mass of the chemical liquid.

It should be noted that, of the alkanes and alkenes represented by $C_kH_{2k}$ having 12 to 50 carbon atoms, the contents of the alkanes and alkenes represented by $C_kH_{2k}$ having an unlisted carbon number are omitted.

The value of "0" described for the content of alkane and alkene means that the content of those alkane and alkene was less than 0.001 mass ppt (detection limit) with respect to the total mass of the chemical liquid. In this case, it is considered that the chemical liquid does not contain the alkane and alkene having a content of "0".

In Tables 1b1 to 1b19 and Tables 1c1 to 1c19, the "total amount" column indicates the total content of alkanes having 12 to 50 carbon atoms in the chemical liquid and the total content of alkenes having 12 to 50 carbon atoms in the chemical liquid, respectively. That is, even in a case where the chemical liquid contains an alkane or alkene having 6 or 10 carbon atoms, the contents thereof are not added up for the calculation in the "total amount" column.

In Tables 1b1 to 1b19, the values described in the lower columns of the column of "maximum carbon number" indicate the number of carbon atoms of the alkane having the largest mass content among the alkanes of each number of carbon atoms contained in the chemical liquid.

In Tables 1c1 to 1c19, the values described in the lower columns of the column of "$C_nH_m$" indicate the content of alkenes containing two or more C=C double bonds. Only squalene (C log P: 12.9) was detected as the alkene containing two or more C=C double bonds.

The values described in the lower columns of the "total amount of organic components" column in Tables 1d1 to 1d19 indicate the total content of organic components in the chemical liquid. That is, even in a case where the chemical liquid contains an alkane or alkene having 6 or 10 carbon atoms, their contents thereof are not added up for the calculation in the "total amount of organic components" column.

The values described in the lower columns of the "Ratio 1 to 3" column of Tables 1d1 to 1d19 respectively indicate the "mass ratio of the content of the organic component to the content of the metal component", the "mass ratio of the content of the organic component to the content of the metal particles", and the "mass ratio of the content of the organic component to the content of the metal ions" in the chemical liquids.

TABLE 1

| Table 1a1 | Organic solvent | | | | Filter | Container | |
|---|---|---|---|---|---|---|---|
| | Type | ClogP | HSP distance to eicosane | HSP distance to eicosene | | Type | Void volume [% by volume] |
| Example AA01 | PGMEA | 0.60 | 11.3 | 9.5 | UPE | EP-SUS | 10 |
| Example AA02 | PGMEA | 0.60 | 11.3 | 9.5 | PTFE | EP-SUS | 10 |
| Example AA03 | PGMEA | 0.60 | 11.3 | 9.5 | Nylon | EP-SUS | 10 |
| Example AA04 | PGMEA | 0.60 | 11.3 | 9.5 | Nylon-grafted UPE | EP-SUS | 10 |
| Example AA05 | PGMEA | 0.60 | 11.3 | 9.5 | Polyimide | EP-SUS | 10 |
| Example AA06 | PGMEA | 0.60 | 11.3 | 9.5 | Polyamide | EP-SUS | 10 |
| Example AA07 | PGMEA | 0.60 | 11.3 | 9.5 | UPE | EP-SUS | 10 |
| Example AA08 | PGMEA | 0.60 | 11.3 | 9.5 | UPE | EP-SUS | 10 |
| Example AA09 | PGMEA | 0.60 | 11.3 | 9.5 | UPE | EP-SUS | 10 |

TABLE 1-continued

| Table 1a1 | Organic solvent | | | | Filter | Container | |
| --- | --- | --- | --- | --- | --- | --- | --- |
| | Type | ClogP | HSP distance to eicosane | HSP distance to eicosene | | Type | Void volume [% by volume] |
| Example AA10 | PGMEA | 0.60 | 11.3 | 9.5 | Nylon | EP-SUS | 10 |
| Example AA11 | PGMEA | 0.60 | 11.3 | 9.5 | Nylon | EP-SUS | 10 |
| Example AA12 | PGMEA | 0.60 | 11.3 | 9.5 | Nylon | EP-SUS | 10 |
| Example AA13 | PGMEA | 0.60 | 11.3 | 9.5 | UPE | EP-SUS | 10 |
| Example AA14 | PGMEA | 0.60 | 11.3 | 9.5 | PTFE | EP-SUS | 10 |
| Example AA15 | PGMEA | 0.60 | 11.3 | 9.5 | Nylon | EP-SUS | 10 |
| Example AA16 | PGMEA | 0.60 | 11.3 | 9.5 | UPE | EP-SUS | 30 |
| Example AA17 | PGMEA | 0.60 | 11.3 | 9.5 | UPE | EP-SUS | 50 |
| Example AA18 | PGMEA | 0.60 | 11.3 | 9.5 | PTFE | EP-SUS | 30 |
| Example AA19 | PGMEA | 0.60 | 11.3 | 9.5 | PTFE | EP-SUS | 50 |
| Example AA20 | PGMEA | 0.60 | 11.3 | 9.5 | UPE | PFA | 10 |
| Example AA21 | PGMEA | 0.60 | 11.3 | 9.5 | PTFE | PFA | 10 |
| Example AA22 | PGMEA | 0.60 | 11.3 | 9.5 | Nylon | PFA | 10 |
| Comparative Example AB01 | PGMEA | 0.60 | 11.3 | 9.5 | UPE | EP-SUS | 10 |
| Comparative Example AB02 | PGMEA | 0.60 | 11.3 | 9.5 | UPE | EP-SUS | 10 |
| Comparative Example AB03 | PGMEA | 0.60 | 11.3 | 9.5 | PTFE | EP-SUS | 10 |
| Comparative Example AB04 | PGMEA | 0.60 | 11.3 | 9.5 | PTFE | EP-SUS | 10 |
| Comparative Example AB05 | PGMEA | 0.60 | 11.3 | 9.5 | Nylon | EP-SUS | 10 |
| Comparative Example AB06 | PGMEA | 0.60 | 11.3 | 9.5 | Nylon | EP-SUS | 10 |
| Comparative Example AB07 | PGMEA | 0.60 | 11.3 | 9.5 | UPE | EP-SUS | 10 |
| Comparative Example AB08 | PGMEA | 0.60 | 11.3 | 9.5 | Nylon | EP-SUS | 10 |
| Comparative Example AB09 | PGMEA | 0.60 | 11.3 | 9.5 | Nylon | EP-SUS | 10 |

TABLE 2

| Table 1b1 | Alkane content (mass ppt) (upper column carbon number/lower column ClogP) | | | | | | | | | | | Maximum contained |
| --- | --- | --- | --- | --- | --- | --- | --- | --- | --- | --- | --- | --- |
| Chemical liquid | 6 3.9 | 10 6.0 | 12 7.0 | 14 8.1 | 16 9.2 | 18 10.2 | 20 11.3 | 30 16.6 | 40 21.9 | 50 27.1 | Total amount | carbon number |
| AA01 | 0 | 0 | 0 | 1 | 1 | 2 | 2 | 4 | 1 | 0 | 34 | 28 |
| AA02 | 0 | 0 | 0 | 1 | 1 | 2 | 1 | 1 | 0 | 0 | 12 | 18 |
| AA03 | 0 | 0 | 1 | 1 | 2 | 1 | 0 | 0 | 0 | 0 | 5 | 16 |
| AA04 | 0 | 0 | 1 | 1 | 2 | 2 | 2 | 1 | 0 | 0 | 16 | 18 |
| AA05 | 0 | 0 | 1 | 1 | 2 | 2 | 2 | 1 | 0 | 0 | 16 | 18 |
| AA06 | 0 | 0 | 1 | 2 | 3 | 2 | 2 | 1 | 0 | 0 | 18 | 16 |
| AA07 | 0 | 0 | 0 | 1 | 1 | 2 | 2 | 3 | 1 | 0 | 29 | 28 |
| AA08 | 0 | 0 | 0 | 1 | 1 | 2 | 3 | 3 | 1 | 0 | 32 | 26 |
| AA09 | 0 | 0 | 0 | 0 | 0.01 | 0.01 | 0.02 | 0.02 | 0.01 | 0 | 0.22 | 26 |
| AA10 | 0 | 0 | 1 | 1 | 2 | 1 | 0 | 0 | 0 | 0 | 5 | 16 |
| AA11 | 0 | 0 | 1 | 1 | 2 | 1 | 0 | 0 | 0 | 0 | 5 | 16 |
| AA12 | 0 | 0 | 0 | 0 | 0.01 | 0.01 | 0 | 0 | 0 | 0 | 0.02 | 16 |
| AA13 | 0 | 0 | 5 | 10 | 20 | 35 | 39 | 41 | 12 | 5 | 450 | 26 |
| AA14 | 0 | 0 | 3 | 8 | 12 | 18 | 30 | 25 | 5 | 0 | 266 | 20 |
| AA15 | 0 | 0 | 5 | 10 | 25 | 15 | 0 | 0 | 0 | 0 | 55 | 16 |
| AA16 | 0 | 0 | 0 | 1 | 1 | 2 | 3 | 4 | 1 | 0 | 37 | 26 |
| AA17 | 0 | 0 | 0 | 1 | 2 | 2 | 4 | 4 | 1 | 0 | 40 | 26 |
| AA18 | 0 | 0 | 0 | 1 | 1 | 2 | 2 | 1 | 0 | 0 | 14 | 22 |
| AA19 | 0 | 0 | 0 | 1 | 2 | 3 | 2 | 1 | 0 | 0 | 16 | 18 |
| AA20 | 0 | 0 | 0 | 1 | 1 | 2 | 2 | 4 | 1 | 0 | 34 | 28 |
| AA21 | 0 | 0 | 0 | 1 | 1 | 2 | 1 | 1 | 0 | 0 | 12 | 18 |
| AA22 | 0 | 0 | 1 | 1 | 2 | 1 | 0 | 0 | 0 | 0 | 5 | 16 |
| AB01 | 0 | 0 | 0 | 100 | 12000 | 92000 | 290000 | 92000 | 4200 | | 1501310630 | 22 |
| AB02 | 0 | 0 | 0 | 0 | 0 | 0.01 | 0.01 | 0.01 | 0 | 0 | 0.085 | 24 |
| AB03 | 0 | 0 | 0 | 80 | 890 | 79500 | 200000 | 92000 | 4200 | | 1501062000 | 22 |
| AB04 | 0 | 0 | 0 | 0 | 0 | 0 | 0.01 | 0.01 | 0 | 0 | 0.075 | 24 |
| AB05 | 0 | 0 | 250 | 3000 | 5000 | 1000 | 0 | 0 | 0 | 0 | 9250 | 16 |
| AB06 | 0 | 0 | 0 | 0 | 0.007 | 0.005 | 0 | 0 | 0 | 0 | 0.012 | 16 |
| AB07 | 0.07 | 0.07 | 0 | 0 | 0 | 0.01 | 0.01 | 0.01 | 0 | 0 | 0.085 | 22 |

TABLE 2-continued

| Table 1b1 | Alkane content (mass ppt) (upper column carbon number/lower column ClogP) | | | | | | | | | | Total amount | Maximum contained carbon number |
|---|---|---|---|---|---|---|---|---|---|---|---|---|
| Chemical liquid | 6<br>3.9 | 10<br>6.0 | 12<br>7.0 | 14<br>8.1 | 16<br>9.2 | 18<br>10.2 | 20<br>11.3 | 30<br>16.6 | 40<br>21.9 | 50<br>27.1 | | |
| AB08 | 0.05 | 0.05 | 0 | 0 | 0.007 | 0.005 | 0 | 0 | 0 | 0 | 0.012 | 16 |
| AB09 | 0 | 0 | 0 | 0 | 0.007 | 0.005 | 0 | 0 | 0 | 0 | 0.012 | 16 |

TABLE 3

| | Alkene content (mass ppt) | | | | | | | | |
|---|---|---|---|---|---|---|---|---|---|
| Table 1c1 | $C_kH_{2k}$ (upper column carbon number/lower column ClogP) | | | | | | | | |
| Chemical liquid | 6<br>3.4 | 10<br>5.5 | 12<br>6.6 | 20<br>10.8 | 30<br>16.1 | 40<br>21.4 | 50<br>26.7 | $C_nH_m$ (squalene) | Total amount |
| AA01 | 0 | 0 | 0 | 0 | 0 | 0 | 0 | 0 | 0 |
| AA02 | 0 | 0 | 0 | 0 | 0 | 0 | 0 | 0 | 0 |
| AA03 | 0 | 0 | 1 | 2 | 3 | 2 | 0 | 2 | 38 |
| AA04 | 0 | 0 | 1 | 2 | 3 | 1 | 0 | 2 | 33 |
| AA05 | 0 | 0 | 1 | 3 | 2 | 1 | 0 | 2 | 33 |
| AA06 | 0 | 0 | 1 | 2 | 2 | 1 | 0 | 2 | 28 |
| AA07 | 0 | 0 | 0 | 0 | 0 | 0 | 0 | 0 | 0 |
| AA08 | 0 | 0 | 0 | 0 | 0 | 0 | 0 | 0 | 0 |
| AA09 | 0 | 0 | 0 | 0 | 0 | 0 | 0 | 0 | 0 |
| AA10 | 0 | 0 | 1 | 2 | 3 | 1 | 0 | 2 | 33 |
| AA11 | 0 | 0 | 1 | 2 | 3 | 2 | 0 | 2 | 38 |
| AA12 | 0 | 0 | 0.01 | 0.01 | 0.03 | 0.01 | 0 | 0.01 | 0.28 |
| AA13 | 0 | 0 | 0 | 0 | 0 | 0 | 0 | 0 | 0 |
| AA14 | 0 | 0 | 0 | 0 | 0 | 0 | 0 | 0 | 0 |
| AA15 | 0 | 0 | 5 | 16 | 26 | 22 | 12 | 22 | 385 |
| AA16 | 0 | 0 | 0 | 0 | 0 | 0 | 0 | 0 | 0 |
| AA17 | 0 | 0 | 0 | 0 | 0 | 0 | 0 | 0 | 0 |
| AA18 | 0 | 0 | 0 | 0 | 0 | 0 | 0 | 0 | 0 |
| AA19 | 0 | 0 | 0 | 0 | 0 | 0 | 0 | 0 | 0 |
| AA20 | 0 | 0 | 0 | 0 | 0 | 0 | 0 | 0 | 0 |
| AA21 | 0 | 0 | 0 | 0 | 0 | 0 | 0 | 0 | 0 |
| AA22 | 0 | 0 | 1 | 2 | 3 | 2 | 0 | 2 | 38 |
| AB01 | 0 | 0 | 0 | 0 | 0 | 0 | 0 | 0 | 0 |
| AB02 | 0 | 0 | 0 | 0 | 0 | 0 | 0 | 0 | 0 |
| AB03 | 0 | 0 | 0 | 0 | 0 | 0 | 0 | 0 | 0 |
| AB04 | 0 | 0 | 0 | 0 | 0 | 0 | 0 | 0 | 0 |
| AB05 | 0 | 0 | 3000 | 110000 | 220000 | 80000 | 500 | 120000 | 2178750 |
| AB06 | 0 | 0 | 0 | 0.005 | 0.006 | 0.004 | 0 | 0.006 | 0.081 |
| AB07 | 0 | 0 | 0 | 0 | 0 | 0 | 0 | 0 | 0 |
| AB08 | 0 | 0 | 0 | 0.005 | 0.006 | 0.004 | 0 | 0.006 | 0.081 |
| AB09 | 0 | 1 | 0 | 0.005 | 0.006 | 0.004 | 0 | 0.006 | 0.081 |

TABLE 4

| Table 1d1 Chemical liquid | Organic component total amount (mass ppt) | Metal component | | | Ratio 1 Organic component/ Metal component | Ratio 2 Organic component/ Metal particles | Ratio 3 Organic component/ Metal ions |
|---|---|---|---|---|---|---|---|
| | | Total (mass ppt) | Metal ions (mass ppt) | Metal particles (mass ppt) | | | |
| AA01 | 34 | 71.3 | 52.8 | 18.5 | $4.8 \times 10^{-1}$ | $1.8 \times 10^{0}$ | $6.4 \times 10^{-1}$ |
| AA02 | 12 | 69.9 | 51.8 | 18.1 | $1.6 \times 10^{-1}$ | $6.3 \times 10^{-1}$ | $2.2 \times 10^{-1}$ |
| AA03 | 43 | 71.8 | 53.2 | 18.6 | $5.9 \times 10^{-1}$ | $2.3 \times 10^{0}$ | $8.0 \times 10^{-1}$ |
| AA04 | 49 | 73.7 | 54.6 | 19.1 | $6.6 \times 10^{-1}$ | $2.5 \times 10^{0}$ | $8.9 \times 10^{-1}$ |
| AA05 | 49 | 74.4 | 55.1 | 19.3 | $6.5 \times 10^{-1}$ | $2.5 \times 10^{0}$ | $8.8 \times 10^{-1}$ |
| AA06 | 46 | 72.6 | 53.8 | 18.8 | $6.3 \times 10^{-1}$ | $2.4 \times 10^{0}$ | $8.5 \times 10^{-1}$ |
| AA07 | 29 | 0.011 | 0.008 | 0.003 | $2.7 \times 10^{3}$ | $1.0 \times 10^{4}$ | $3.6 \times 10^{3}$ |
| AA08 | 32 | 677.7 | 502.0 | 175.7 | $4.6 \times 10^{-2}$ | $1.8 \times 10^{-1}$ | $6.3 \times 10^{-2}$ |
| AA09 | 0.22 | 70.9 | 52.5 | 18.4 | $3.1 \times 10^{-3}$ | $1.2 \times 10^{-2}$ | $4.2 \times 10^{-3}$ |
| AA10 | 38 | 0.011 | 0.008 | 0.003 | $3.5 \times 10^{3}$ | $1.3 \times 10^{4}$ | $4.7 \times 10^{3}$ |
| AA11 | 43 | 677.7 | 502.0 | 175.7 | $6.3 \times 10^{-2}$ | $2.4 \times 10^{-1}$ | $8.5 \times 10^{-2}$ |
| AA12 | 0.30 | 71.4 | 52.9 | 18.5 | $4.1 \times 10^{-3}$ | $1.6 \times 10^{-2}$ | $5.6 \times 10^{-3}$ |

TABLE 4-continued

| Table 1d1 Chemical liquid | Organic component total amount (mass ppt) | Metal component | | | Ratio 1 Organic component/ Metal component | Ratio 2 Organic component/ Metal particles | Ratio 3 Organic component/ Metal ions |
|---|---|---|---|---|---|---|---|
| | | Total (mass ppt) | Metal ions (mass ppt) | Metal particles (mass ppt) | | | |
| AA13 | 450 | 70.1 | 51.9 | 18.2 | $6.4 \times 10^0$ | $2.5 \times 10^1$ | $8.7 \times 10^{-0}$ |
| AA14 | 266 | 72.0 | 53.3 | 18.7 | $3.7 \times 10^0$ | $1.4 \times 10^1$ | $5.0 \times 10^{-0}$ |
| AA15 | 440 | 73.8 | 54.7 | 19.1 | $6.0 \times 10^0$ | $2.3 \times 10^1$ | $8.0 \times 10^{-0}$ |
| AA16 | 37 | 71.8 | 53.2 | 18.6 | $5.1 \times 10^{-1}$ | $2.0 \times 10^0$ | $6.9 \times 10^{-1}$ |
| AA17 | 40 | 71.1 | 52.7 | 18.4 | $5.6 \times 10^{-1}$ | $2.2 \times 10^0$ | $7.6 \times 10^{-1}$ |
| AA18 | 14 | 69.8 | 51.7 | 18.1 | $2.0 \times 10^{-1}$ | $7.7 \times 10^{-1}$ | $2.7 \times 10^{-1}$ |
| AA19 | 16 | 71.7 | 53.1 | 18.6 | $2.2 \times 10^{-1}$ | $8.6 \times 10^{-1}$ | $3.0 \times 10^{-1}$ |
| AA20 | 34 | 73.6 | 54.5 | 19.1 | $4.6 \times 10^{-1}$ | $1.8 \times 10^0$ | $6.2 \times 10^{-1}$ |
| AA21 | 12 | 71.3 | 52.8 | 18.5 | $1.6 \times 10^{-1}$ | $6.2 \times 10^{-1}$ | $2.2 \times 10^{-1}$ |
| AA22 | 43 | 73.0 | 54.1 | 18.9 | $5.8 \times 10^{-1}$ | $2.2 \times 10^0$ | $7.9 \times 10^{-1}$ |
| AB01 | 1310630 | 0.010 | 0.007 | 0.003 | $1.3 \times 10^8$ | $4.4 \times 10^8$ | $1.9 \times 10^8$ |
| AB02 | 0.085 | 754.2 | 532.6 | 221.6 | $1.1 \times 10^{-4}$ | $3.8 \times 10^{-4}$ | $1.6 \times 10^{-4}$ |
| AB03 | 1062000 | 0.010 | 0.007 | 0.003 | $1.1 \times 10^8$ | $3.5 \times 10^8$ | $1.5 \times 10^8$ |
| AB04 | 0.075 | 754.2 | 532.6 | 221.6 | $9.9 \times 10^{-5}$ | $3.4 \times 10^{-4}$ | $1.4 \times 10^{-4}$ |
| AB05 | 2188000 | 0.011 | 0.008 | 0.003 | $2.0 \times 10^8$ | $7.3 \times 10^8$ | $2.7 \times 10^8$ |
| AB06 | 0.093 | 767.4 | 542.2 | 225.2 | $1.2 \times 10^{-4}$ | $4.1 \times 10^{-4}$ | $1.7 \times 10^{-4}$ |
| AB07 | 0.085 | 754.2 | 532.6 | 221.6 | $1.1 \times 10^{-4}$ | $3.8 \times 10^{-4}$ | $1.6 \times 10^{-4}$ |
| AB08 | 0.093 | 767.4 | 542.2 | 225.2 | $1.2 \times 10^{-4}$ | $4.1 \times 10^{-4}$ | $1.7 \times 10^{-4}$ |
| AB09 | 0.093 | 767.4 | 542.2 | 225.2 | $1.2 \times 10^{-4}$ | $4.1 \times 10^{-4}$ | $1.7 \times 10^{-4}$ |

TABLE 5

| Table 1a2 | Organic solvent | | | | Filter | Container | |
|---|---|---|---|---|---|---|---|
| | Type | ClogP | HSP distance to eicosene | HSP distance to eicosane | | Type | Void volume [% by volume] |
| Example BA01 | CHN | 0.87 | 10.5 | 9.1 | UPE | EP-SUS | 10 |
| Example BA02 | CHN | 0.87 | 10.5 | 9.1 | PTFE | EP-SUS | 10 |
| Example BA03 | CHN | 0.87 | 10.5 | 9.1 | Nylon | EP-SUS | 10 |
| Example BA04 | CHN | 0.87 | 10.5 | 9.1 | Nylon-grafted UPE | EP-SUS | 10 |
| Example BA05 | CHN | 0.87 | 10.5 | 9.1 | Polyimide | EP-SUS | 10 |
| Example BA06 | CHN | 0.87 | 10.5 | 9.1 | Polyamide | EP-SUS | 10 |
| Example BA07 | CHN | 0.87 | 10.5 | 9.1 | UPE | EP-SUS | 10 |
| Example BA08 | CHN | 0.87 | 10.5 | 9.1 | UPE | EP-SUS | 10 |
| Example BA09 | CHN | 0.87 | 10.5 | 9.1 | UPE | EP-SUS | 10 |
| Example BA10 | CHN | 0.87 | 10.5 | 9.1 | Nylon | EP-SUS | 10 |
| Example BA11 | CHN | 0.87 | 10.5 | 9.1 | Nylon | EP-SUS | 10 |
| Example BA12 | CHN | 0.87 | 10.5 | 9.1 | Nylon | EP-SUS | 10 |
| Example BA13 | CHN | 0.87 | 10.5 | 9.1 | UPE | EP-SUS | 10 |
| Example BA14 | CHN | 0.87 | 10.5 | 9.1 | PTFE | EP-SUS | 10 |
| Example BA15 | CHN | 0.87 | 10.5 | 9.1 | Nylon | EP-SUS | 10 |
| Example BA16 | CHN | 0.87 | 10.5 | 9.1 | UPE | EP-SUS | 30 |
| Example BA17 | CHN | 0.87 | 10.5 | 9.1 | UPE | EP-SUS | 50 |
| Example BA18 | CHN | 0.87 | 10.5 | 9.1 | UPE | PFA | 10 |
| Example BA19 | CHN | 0.87 | 10.5 | 9.1 | PTFE | PFA | 10 |
| Example BA20 | CHN | 0.87 | 10.5 | 9.1 | Nylon | PFA | 10 |
| Comparative Example BB01 | CHN | 0.87 | 10.5 | 9.1 | UPE | EP-SUS | 10 |
| Comparative Example BB02 | CHN | 0.87 | 10.5 | 9.1 | UPE | EP-SUS | 10 |
| Comparative Example BB03 | CHN | 0.87 | 10.5 | 9.1 | PTFE | EP-SUS | 10 |
| Comparative Example BB04 | CHN | 0.87 | 10.5 | 9.1 | PTFE | EP-SUS | 10 |
| Comparative Example BB05 | CHN | 0.87 | 10.5 | 9.1 | Nylon | EP-SUS | 10 |
| Comparative Example BB06 | CHN | 0.87 | 10.5 | 9.1 | Nylon | EP-SUS | 10 |
| Comparative Example BB07 | CHN | 0.87 | 10.5 | 9.1 | UPE | EP-SUS | 10 |
| Comparative Example BB08 | CHN | 0.87 | 10.5 | 9.1 | Nylon | EP-SUS | 10 |

TABLE 6

| Table 1b2 | Alkane content (mass ppt) (upper column carbon number/lower column ClogP) | | | | | | | | | | Maximum contained |
|---|---|---|---|---|---|---|---|---|---|---|---|
| Chemical liquid | 6<br>3.9 | 10<br>6.0 | 12<br>7.0 | 14<br>8.1 | 16<br>9.2 | 18<br>10.2 | 20<br>11.3 | 30<br>16.6 | 40<br>21.9 | 50<br>27.1 | Total amount | carbon number |
| BA01 | 0 | 0 | 0 | 1 | 1 | 2 | 3 | 4 | 1 | 0 | 37 | 28 |
| BA02 | 0 | 0 | 0 | 1 | 1 | 2 | 2 | 1 | 0 | 0 | 14 | 18 |
| BA03 | 0 | 0 | 1 | 1 | 2 | 1 | 0 | 0 | 0 | 0 | 5 | 16 |
| BA04 | 0 | 0 | 1 | 1 | 2 | 2 | 1 | 0 | 0 | 0 | 8.5 | 18 |
| BA05 | 0 | 0 | 1 | 1 | 2 | 3 | 2 | 0 | 0 | 0 | 12 | 18 |
| BA06 | 0 | 0 | 1 | 1 | 3 | 2 | 1 | 0 | 0 | 0 | 9.5 | 16 |
| BA07 | 0 | 0 | 0 | 1 | 1 | 2 | 3 | 3 | 1 | 0 | 32 | 24 |
| BA08 | 0 | 0 | 0 | 1 | 2 | 3 | 3 | 3 | 1 | 0 | 34 | 22 |
| BA09 | 0 | 0 | 0 | 0 | 0.01 | 0.01 | 0.03 | 0.02 | 0.01 | 0 | 0.25 | 24 |
| BA10 | 0 | 0 | 1 | 1 | 2 | 1 | 0 | 0 | 0 | 0 | 5 | 16 |
| BA11 | 0 | 0 | 1 | 2 | 2 | 1 | 0 | 0 | 0 | 0 | 6 | 16 |
| BA12 | 0 | 0 | 0 | 0 | 0.01 | 0.01 | 0 | 0 | 0 | 0 | 0.02 | 16 |
| BA13 | 0 | 0 | 6 | 14 | 22 | 39 | 42 | 44 | 14 | 5 | 494 | 24 |
| BA14 | 0 | 0 | 4 | 10 | 14 | 22 | 32 | 29 | 6 | 1 | 309 | 20 |
| BA15 | 0 | 0 | 5 | 12 | 28 | 17 | 0 | 0 | 0 | 0 | 62 | 16 |
| BA16 | 0 | 0 | 0 | 1 | 1 | 2 | 4 | 4 | 1 | 0 | 39 | 24 |
| BA17 | 0 | 0 | 0 | 1 | 2 | 3 | 4 | 4 | 1 | 0 | 41 | 24 |
| BA18 | 0 | 0 | 0 | 1 | 1 | 2 | 2 | 4 | 1 | 0 | 34 | 26 |
| BA19 | 0 | 0 | 0 | 1 | 2 | 2 | 1 | 1 | 0 | 0 | 13 | 18 |
| BA20 | 0 | 0 | 1 | 1 | 2 | 1 | 0 | 0 | 0 | 0 | 5 | 16 |
| BB01 | 0 | 0 | 0 | 120 | 12900 | 95000 | 320000 | 126000 | 4500 | 130 | 1560980 | 22 |
| BB02 | 0 | 0 | 0 | 0 | 0 | 0.01 | 0.01 | 0.01 | 0 | 0 | 0.085 | 20 |
| BB03 | 0 | 0 | 0 | 75 | 980 | 80100 | 215000 | 93000 | 4300 | 110 | 1105540 | 22 |
| BB04 | 0 | 0 | 0 | 0 | 0 | 0 | 0.01 | 0.01 | 0 | 0 | 0.075 | 24 |
| BB05 | 0 | 0 | 290 | 3200 | 5500 | 1000 | 0 | 0 | 0 | 0 | 9990 | 16 |
| BB06 | 0 | 0 | 0 | 0 | 0.007 | 0.005 | 0 | 0 | 0 | 0 | 0.012 | 16 |
| BB07 | 0.07 | 0.07 | 0 | 0 | 0 | 0.01 | 0.01 | 0.01 | 0 | 0 | 0.085 | 24 |
| BB08 | 0.05 | 0.05 | 0 | 0 | 0.007 | 0.005 | 0 | 0 | 0 | 0 | 0.012 | 16 |

TABLE 7

| | Alkene content (mass ppt) | | | | | | | | |
|---|---|---|---|---|---|---|---|---|---|
| Table 1c2 | $C_kH_{2k}$ (upper column carbon number/lower column ClogP) | | | | | | | | |
| Chemical liquid | 6<br>3.4 | 10<br>5.5 | 12<br>6.6 | 20<br>10.8 | 30<br>16.1 | 40<br>21.4 | 50<br>26.7 | $C_nH_m$ (squalene) | Total amount |
| BA01 | 0 | 0 | 0 | 0 | 0 | 0 | 0 | 0 | 0 |
| BA02 | 0 | 0 | 0 | 0 | 0 | 0 | 0 | 0 | 0 |
| BA03 | 0 | 0 | 1 | 3 | 3 | 1 | 0 | 2 | 38 |
| BA04 | 0 | 0 | 1 | 2 | 3 | 2 | 0 | 2 | 38 |
| BA05 | 0 | 0 | 1 | 2 | 2 | 2 | 0 | 2 | 33 |
| BA06 | 0 | 0 | 1 | 3 | 3 | 1 | 0 | 2 | 38 |
| BA07 | 0 | 0 | 0 | 0 | 0 | 0 | 0 | 0 | 0 |
| BA08 | 0 | 0 | 0 | 0 | 0 | 0 | 0 | 0 | 0 |
| BA09 | 0 | 0 | 0 | 0 | 0 | 0 | 0 | 0 | 0 |
| BA10 | 0 | 0 | 1 | 3 | 3 | 1 | 0 | 2 | 38 |
| BAH | 0 | 0 | 1 | 3 | 3 | 2 | 0 | 2 | 43 |
| BA12 | 0 | 0 | 0.01 | 0.01 | 0.03 | 0.01 | 0 | 0.01 | 0.28 |
| BA13 | 0 | 0 | 0 | 0 | 0 | 0 | 0 | 0 | 0 |
| BA14 | 0 | 0 | 0 | 0 | 0 | 0 | 0 | 0 | 0 |
| BA15 | 0 | 0 | 5 | 18 | 28 | 26 | 15 | 22 | 432 |
| BA16 | 0 | 0 | 0 | 0 | 0 | 0 | 0 | 0 | 0 |
| BA17 | 0 | 0 | 0 | 0 | 0 | 0 | 0 | 0 | 0 |
| BA18 | 0 | 0 | 0 | 0 | 0 | 0 | 0 | 0 | 0 |
| BA19 | 0 | 0 | 0 | 0 | 0 | 0 | 0 | 0 | 0 |
| BA20 | 0 | 0 | 1 | 3 | 3 | 2 | 0 | 2 | 43 |
| BB01 | 0 | 0 | 0 | 0 | 0 | 0 | 0 | 0 | 0 |
| BB02 | 0 | 0 | 0 | 0 | 0 | 0 | 0 | 0 | 0 |
| BB03 | 0 | 0 | 0 | 0 | 0 | 0 | 0 | 0 | 0 |
| BB04 | 0 | 0 | 0 | 0 | 0 | 0 | 0 | 0 | 0 |
| BB05 | 0 | 0 | 3400 | 120000 | 242000 | 84000 | 400 | 135000 | 2374500 |
| BB06 | 0 | 0 | 0 | 0.005 | 0.007 | 0.004 | 0 | 0.007 | 0.087 |
| BB07 | 0 | 0 | 0 | 0 | 0 | 0 | 0 | 0 | 0 |
| BB08 | 0 | 0 | 0 | 0.004 | 0.007 | 0.004 | 0 | 0.007 | 0.082 |

TABLE 8

| Table 1d2 Chemical liquid | Organic component total amount (mass ppt) | Metal component Total (mass ppt) | Metal component Metal ions (mass ppt) | Metal component Metal particles (mass ppt) | Ratio 1 Organic component/ Metal component | Ratio 2 Organic component/ Metal particles | Ratio 3 Organic component/ Metal ions |
|---|---|---|---|---|---|---|---|
| BA01 | 37 | 71.7 | 53.1 | 18.6 | $5.1 \times 10^{-1}$ | $2.0 \times 10^{0}$ | $6.9 \times 10^{-1}$ |
| BA02 | 14 | 71.0 | 52.6 | 18.4 | $2.0 \times 10^{-1}$ | $7.6 \times 10^{-1}$ | $2.7 \times 10^{-1}$ |
| BA03 | 43 | 69.7 | 51.6 | 18.1 | $6.1 \times 10^{-1}$ | $2.4 \times 10^{0}$ | $8.2 \times 10^{-1}$ |
| BA04 | 46.5 | 71.6 | 53.0 | 18.6 | $6.4 \times 10^{-1}$ | $2.5 \times 10^{0}$ | $8.7 \times 10^{-1}$ |
| BA05 | 45 | 73.4 | 54.4 | 19.0 | $6.1 \times 10^{-1}$ | $2.3 \times 10^{0}$ | $8.2 \times 10^{-1}$ |
| BA06 | 47.5 | 71.1 | 52.7 | 18.4 | $6.6 \times 10^{-1}$ | $2.5 \times 10^{0}$ | $8.9 \times 10^{-1}$ |
| BA07 | 32 | 0.011 | 0.008 | 0.003 | $2.9 \times 10^{3}$ | $1.1 \times 10^{4}$ | $3.9 \times 10^{3}$ |
| BA08 | 34 | 691.2 | 512.0 | 179.2 | $4.8 \times 10^{-2}$ | $1.9 \times 10^{-1}$ | $6.5 \times 10^{-2}$ |
| BA09 | 0.25 | 73.4 | 54.4 | 19.0 | $3.3 \times 10^{-3}$ | $1.3 \times 10^{-2}$ | $4.5 \times 10^{-3}$ |
| BA10 | 43 | 0.011 | 0.008 | 0.003 | $3.9 \times 10^{3}$ | $1.5 \times 10^{4}$ | $5.3 \times 10^{3}$ |
| BA11 | 49 | 691.2 | 512.0 | 179.2 | $7.0 \times 10^{-2}$ | $2.7 \times 10^{-1}$ | $9.5 \times 10^{-2}$ |
| BA12 | 0.30 | 69.7 | 51.6 | 18.1 | $4.2 \times 10^{-3}$ | $1.6 \times 10^{-2}$ | $5.7 \times 10^{-3}$ |
| BA13 | 494 | 71.6 | 53.0 | 18.6 | $6.9 \times 10^{0}$ | $2.7 \times 10^{1}$ | $9.3 \times 10^{0}$ |
| BA14 | 309 | 73.4 | 54.4 | 19.0 | $4.2 \times 10^{0}$ | $1.6 \times 10^{1}$ | $5.7 \times 10^{0}$ |
| BA15 | 494 | 71.4 | 52.9 | 18.5 | $6.9 \times 10^{0}$ | $2.7 \times 10^{1}$ | $9.3 \times 10^{0}$ |
| BA16 | 39 | 70.7 | 52.4 | 18.3 | $5.5 \times 10^{-1}$ | $2.1 \times 10^{0}$ | $7.4 \times 10^{-1}$ |
| BA17 | 41 | 69.4 | 51.4 | 18.0 | $5.9 \times 10^{-1}$ | $2.3 \times 10^{0}$ | $8.0 \times 10^{-1}$ |
| BA18 | 34 | 71.3 | 52.8 | 18.5 | $4.8 \times 10^{-1}$ | $1.8 \times 10^{0}$ | $6.4 \times 10^{-1}$ |
| BA19 | 13 | 73.2 | 54.2 | 19.0 | $1.7 \times 10^{-1}$ | $6.6 \times 10^{-1}$ | $2.3 \times 10^{-1}$ |
| BA20 | 48 | 70.9 | 52.5 | 18.4 | $6.7 \times 10^{-1}$ | $2.6 \times 10^{0}$ | $9.0 \times 10^{-1}$ |
| BB01 | 1560980 | 0.010 | 0.007 | 0.003 | $1.6 \times 10^{8}$ | $5.2 \times 10^{8}$ | $2.2 \times 10^{8}$ |
| BB02 | 0.085 | 786.6 | 565.0 | 221.6 | $1.1 \times 10^{-4}$ | $3.8 \times 10^{-4}$ | $1.5 \times 10^{-4}$ |
| BB03 | 1105540 | 0.011 | 0.008 | 0.003 | $1.0 \times 10^{8}$ | $3.7 \times 10^{8}$ | $1.4 \times 10^{8}$ |
| BB04 | 0.075 | 786.6 | 565.0 | 221.6 | $9.5 \times 10^{-5}$ | $3.4 \times 10^{-4}$ | $1.3 \times 10^{-4}$ |
| BB05 | 2384490 | 0.010 | 0.007 | 0.003 | $2.4 \times 10^{8}$ | $7.9 \times 10^{8}$ | $3.4 \times 10^{8}$ |
| BB06 | 0.099 | 790.2 | 565.0 | 225.2 | $1.3 \times 10^{-4}$ | $4.4 \times 10^{-4}$ | $1.8 \times 10^{-4}$ |
| BB07 | 0.085 | 786.6 | 565.0 | 221.6 | $1.1 \times 10^{-4}$ | $3.8 \times 10^{-4}$ | $1.5 \times 10^{-4}$ |
| BB08 | 0.094 | 790.2 | 565.0 | 225.2 | $1.2 \times 10^{-4}$ | $4.2 \times 10^{-4}$ | $1.7 \times 10^{-4}$ |

TABLE 9

| Table 1a3 | Organic solvent Type | Organic solvent ClogP | Organic solvent HSP distance to eicosane | Organic solvent HSP distance to eicosene | Filter | Container Type | Container Void volume [% by volume] |
|---|---|---|---|---|---|---|---|
| Example CA01 | EL | 0.33 | 14.6 | 12.9 | UPE | EP-SUS | 10 |
| Example CA02 | EL | 0.33 | 14.6 | 12.9 | PTFE | EP-SUS | 10 |
| Example CA03 | EL | 0.33 | 14.6 | 12.9 | Nylon | EP-SUS | 10 |
| Example CA04 | EL | 0.33 | 14.6 | 12.9 | UPE | EP-SUS | 10 |
| Example CA05 | EL | 0.33 | 14.6 | 12.9 | UPE | EP-SUS | 10 |
| Example CA06 | EL | 0.33 | 14.6 | 12.9 | UPE | EP-SUS | 10 |
| Example CA07 | EL | 0.33 | 14.6 | 12.9 | Nylon | EP-SUS | 10 |
| Example CA08 | EL | 0.33 | 14.6 | 12.9 | Nylon | EP-SUS | 10 |
| Example CA09 | EL | 0.33 | 14.6 | 12.9 | Nylon | EP-SUS | 10 |
| Example CA10 | EL | 0.33 | 14.6 | 12.9 | UPE | EP-SUS | 10 |
| Example CA11 | EL | 0.33 | 14.6 | 12.9 | PTFE | EP-SUS | 10 |
| Example CA12 | EL | 0.33 | 14.6 | 12.9 | Nylon | EP-SUS | 10 |
| Example CA13 | EL | 0.33 | 14.6 | 12.9 | UPE | EP-SUS | 30 |
| Example CA14 | EL | 0.33 | 14.6 | 12.9 | UPE | EP-SUS | 50 |
| Example CA15 | EL | 0.33 | 14.6 | 12.9 | UPE | PFA | 10 |
| Example CA16 | EL | 0.33 | 14.6 | 12.9 | PTFE | PFA | 10 |
| Example CA17 | EL | 0.33 | 14.6 | 12.9 | Nylon | PFA | 10 |
| Comparative Example CB01 | EL | 0.33 | 14.6 | 12.9 | UPE | EP-SUS | 10 |
| Comparative Example CB02 | EL | 0.33 | 14.6 | 12.9 | UPE | EP-SUS | 10 |
| Comparative Example CB03 | EL | 0.33 | 14.6 | 12.9 | PTFE | EP-SUS | 10 |
| Comparative Example CB04 | EL | 0.33 | 14.6 | 12.9 | PTFE | EP-SUS | 10 |
| Comparative Example CB05 | EL | 0.33 | 14.6 | 12.9 | Nylon | EP-SUS | 10 |
| Comparative Example CB06 | EL | 0.33 | 14.6 | 12.9 | Nylon | EP-SUS | 10 |

TABLE 9-continued

| Table 1a3 | Organic solvent | | | Container | | |
|---|---|---|---|---|---|---|
| | Type | ClogP | HSP distance to eicosane | HSP distance to eicosene | Filter | Type | Void volume [% by volume] |
| Comparative Example CB07 | EL | 0.33 | 14.6 | 12.9 | UPE | EP-SUS | 10 |
| Comparative Example CB08 | EL | 0.33 | 14.6 | 12.9 | Nylon | EP-SUS | 10 |

TABLE 10

| Table 1b3 | Alkane content (mass ppt) (upper column carbon number/lower column ClogP) | | | | | | | | | | Total amount | Maximum contained carbon number |
|---|---|---|---|---|---|---|---|---|---|---|---|---|
| Chemical liquid | 6 3.9 | 10 6.0 | 12 7.0 | 14 8.1 | 16 9.2 | 18 10.2 | 20 11.3 | 30 16.6 | 40 21.9 | 50 27.1 | | |
| CA01 | 0 | 0 | 0 | 1 | 1 | 2 | 2 | 2 | 1 | 0 | 24 | 22 |
| CA02 | 0 | 0 | 0 | 1 | 1 | 2 | 1 | 1 | 0 | 0 | 12 | 18 |
| CA03 | 0 | 0 | 1 | 1 | 2 | 1 | 0 | 0 | 0 | 0 | 5 | 16 |
| CA04 | 0 | 0 | 0 | 1 | 1 | 1 | 2 | 3 | 1 | 0 | 28 | 26 |
| CA05 | 0 | 0 | 0 | 1 | 1 | 2 | 2 | 3 | 1 | 0 | 29 | 26 |
| CA06 | 0 | 0 | 0 | 0 | 0.01 | 0.01 | 0.02 | 0.02 | 0.01 | 0 | 0.22 | 24 |
| CA07 | 0 | 0 | 1 | 1 | 2 | 1 | 0 | 0 | 0 | 0 | 5 | 16 |
| CA08 | 0 | 0 | 1 | 1 | 2 | 1 | 0 | 0 | 0 | 0 | 5 | 16 |
| CA09 | 0 | 0 | 0 | 0 | 0.01 | 0.01 | 0 | 0 | 0 | 0 | 0.02 | 16 |
| CA10 | 0 | 0 | 5 | 8 | 18 | 32 | 35 | 30 | 5 | 5 | 343 | 22 |
| CA11 | 0 | 0 | 3 | 6 | 10 | 15 | 25 | 20 | 8 | 0 | 237 | 22 |
| CA12 | 0 | 0 | 5 | 10 | 20 | 15 | 0 | 0 | 0 | 0 | 50 | 16 |
| CA13 | 0 | 0 | 0 | 1 | 1 | 2 | 4 | 4 | 1 | 0 | 39 | 24 |
| CA14 | 0 | 0 | 0 | 1 | 2 | 3 | 4 | 4 | 1 | 0 | 41 | 24 |
| CA15 | 0 | 0 | 0 | 1 | 1 | 2 | 2 | 4 | 1 | 0 | 34 | 28 |
| CA16 | 0 | 0 | 0 | 1 | 1 | 2 | 1 | 1 | 0 | 0 | 12 | 18 |
| CA17 | 0 | 0 | 1 | 1 | 2 | 1 | 0 | 0 | 0 | 0 | 5 | 16 |
| CB01 | 0 | 0 | 0 | 90 | 10000 | 89000 | 250000 | 88000 | 4200 | 150 | 1185620 | 24 |
| CB02 | 0 | 0 | 0 | 0 | 0 | 0.01 | 0.01 | 0.01 | 0 | 0 | 0.085 | 22 |
| CB03 | 0 | 0 | 0 | 80 | 890 | 79500 | 210000 | 93000 | 4300 | 150 | 1092500 | 24 |
| CB04 | 0 | 0 | 0 | 0 | 0 | 0 | 0.01 | 0.01 | 0 | 0 | 0.075 | 24 |
| CB05 | 0 | 0 | 250 | 2600 | 4800 | 700 | 0 | 0 | 0 | 0 | 8350 | 16 |
| CB06 | 0 | 0 | 0 | 0 | 0.007 | 0.005 | 0 | 0 | 0 | 0 | 0.012 | 16 |
| CB07 | 0.07 | 0.07 | 0 | 0 | 0 | 0.01 | 0.01 | 0.01 | 0 | 0 | 0.085 | 20 |
| CB08 | 0.05 | 0.05 | 0 | 0 | 0.007 | 0.005 | 0 | 0 | 0 | 0 | 0.012 | 16 |

TABLE 11

| Table 1c3 | Alkene content (mass ppt) | | | | | | | | |
|---|---|---|---|---|---|---|---|---|---|
| | $C_kH_{2k}$ (upper column carbon number/lower column ClogP) | | | | | | | $C_nH_m$ (squalene) | Total amount |
| Chemical liquid | 6 3.4 | 10 5.5 | 12 6.6 | 20 10.8 | 30 16.1 | 40 21.4 | 50 26.7 | | |
| CA01 | 0 | 0 | 0 | 0 | 0 | 0 | 0 | 0 | 0 |
| CA02 | 0 | 0 | 0 | 0 | 0 | 0 | 0 | 0 | 0 |
| CA03 | 0 | 0 | 1 | 2 | 3 | 2 | 0 | 2 | 38 |
| CA04 | 0 | 0 | 0 | 0 | 0 | 0 | 0 | 0 | 0 |
| CA05 | 0 | 0 | 0 | 0 | 0 | 0 | 0 | 0 | 0 |
| CA06 | 0 | 0 | 0 | 0 | 0 | 0 | 0 | 0 | 0 |
| CA07 | 0 | 0 | 1 | 2 | 3 | 1 | 0 | 2 | 33 |
| CA08 | 0 | 0 | 1 | 2 | 3 | 2 | 0 | 2 | 38 |
| CA09 | 0 | 0 | 0.01 | 0.01 | 0.03 | 0.01 | 0 | 0.01 | 0.28 |
| CA10 | 0 | 0 | 0 | 0 | 0 | 0 | 0 | 0 | 0 |
| CA11 | 0 | 0 | 0 | 0 | 0 | 0 | 0 | 0 | 0 |
| CA12 | 0 | 0 | 5 | 15 | 24 | 18 | 10 | 18 | 341 |
| CA13 | 0 | 0 | 0 | 0 | 0 | 0 | 0 | 0 | 0 |
| CA14 | 0 | 0 | 0 | 0 | 0 | 0 | 0 | 0 | 0 |
| CA15 | 0 | 0 | 0 | 0 | 0 | 0 | 0 | 0 | 0 |
| CA16 | 0 | 0 | 0 | 0 | 0 | 0 | 0 | 0 | 0 |
| CA17 | 0 | 0 | 1 | 2 | 3 | 2 | 0 | 2 | 38 |

TABLE 11-continued

| | Alkene content (mass ppt) | | | | | | | | |
|---|---|---|---|---|---|---|---|---|---|
| Table 1c3 | $C_kH_{2k}$ (upper column carbon number/lower column ClogP) | | | | | | | | |
| Chemical liquid | 6<br>3.4 | 10<br>5.5 | 12<br>6.6 | 20<br>10.8 | 30<br>16.1 | 40<br>21.4 | 50<br>26.7 | $C_nH_m$<br>(squalene) | Total amount |
| CB01 | 0 | 0 | 0 | 0 | 0 | 0 | 0 | 0 | 0 |
| CB02 | 0 | 0 | 0 | 0 | 0 | 0 | 0 | 0 | 0 |
| CB03 | 0 | 0 | 0 | 0 | 0 | 0 | 0 | 0 | 0 |
| CB04 | 0 | 0 | 0 | 0 | 0 | 0 | 0 | 0 | 0 |
| CB05 | 0 | 0 | 2600 | 110000 | 190000 | 72000 | 200 | 105000 | 1972000 |
| CB06 | 0 | 0 | 0 | 0.005 | 0.005 | 0.004 | 0 | 0.006 | 0.076 |
| CB07 | 0 | 0 | 0 | 0 | 0 | 0 | 0 | 0 | 0 |
| CB08 | 0 | 0 | 0 | 0.005 | 0.006 | 0.004 | 0 | 0.006 | 0.081 |

TABLE 12

| Table 1d3<br>Chemical liquid | Organic component total amount (mass ppt) | Metal component | | | Ratio 1<br>Organic component/<br>Metal component | Ratio 2<br>Organic component/<br>Metal particles | Ratio 3<br>Organic component/<br>Metal ions |
|---|---|---|---|---|---|---|---|
| | | Total (mass ppt) | Metal ions (mass ppt) | Metal particles (mass ppt) | | | |
| CA01 | 24 | 73.4 | 54.4 | 19.0 | $3.3 \times 10^{-1}$ | $1.3 \times 10^{0}$ | $4.4 \times 10^{-1}$ |
| CA02 | 12 | 71.4 | 52.9 | 18.5 | $1.6 \times 10^{-1}$ | $6.2 \times 10^{-1}$ | $2.2 \times 10^{-1}$ |
| CA03 | 43 | 70.7 | 52.4 | 18.3 | $6.0 \times 10^{-1}$ | $2.3 \times 10^{0}$ | $8.1 \times 10^{-1}$ |
| CA04 | 28 | 0.009 | 0.007 | 0.002 | $3.0 \times 10^{3}$ | $1.1 \times 10^{4}$ | $4.0 \times 10^{3}$ |
| CA05 | 29 | 687.2 | 509.0 | 178.2 | $4.2 \times 10^{-2}$ | $1.6 \times 10^{-1}$ | $5.7 \times 10^{-2}$ |
| CA06 | 0.22 | 71.6 | 53.0 | 18.6 | $3.1 \times 10^{-3}$ | $1.2 \times 10^{-2}$ | $4.2 \times 10^{-3}$ |
| CA07 | 38 | 0.011 | 0.008 | 0.003 | $3.5 \times 10^{3}$ | $1.3 \times 10^{4}$ | $4.7 \times 10^{3}$ |
| CA08 | 43 | 687.2 | 509.0 | 178.2 | $6.2 \times 10^{-2}$ | $2.4 \times 10^{-1}$ | $8.3 \times 10^{-2}$ |
| CA09 | 0.30 | 69.4 | 51.4 | 18.0 | $4.3 \times 10^{-3}$ | $1.6 \times 10^{-2}$ | $5.7 \times 10^{-3}$ |
| CA10 | 343 | 71.3 | 52.8 | 18.5 | $4.8 \times 10^{0}$ | $1.9 \times 10^{1}$ | $6.5 \times 10^{0}$ |
| CA11 | 237 | 73.2 | 54.2 | 19.0 | $3.2 \times 10^{0}$ | $1.2 \times 10^{1}$ | $4.4 \times 10^{0}$ |
| CA12 | 391 | 71.6 | 53.0 | 18.6 | $5.5 \times 10^{0}$ | $2.1 \times 10^{1}$ | $7.4 \times 10^{0}$ |
| CA13 | 39 | 70.9 | 52.5 | 18.4 | $5.5 \times 10^{-1}$ | $2.1 \times 10^{0}$ | $7.4 \times 10^{-1}$ |
| CA14 | 41 | 69.5 | 51.5 | 18.0 | $5.9 \times 10^{-1}$ | $2.3 \times 10^{0}$ | $8.0 \times 10^{-1}$ |
| CA15 | 34 | 71.4 | 52.9 | 18.5 | $4.8 \times 10^{-1}$ | $1.8 \times 10^{0}$ | $6.4 \times 10^{-1}$ |
| CA16 | 12 | 73.3 | 54.3 | 19.0 | $1.6 \times 10^{-1}$ | $6.1 \times 10^{-1}$ | $2.1 \times 10^{-1}$ |
| CA17 | 43 | 71.0 | 52.6 | 18.4 | $6.0 \times 10^{-1}$ | $2.3 \times 10^{0}$ | $8.1 \times 10^{-1}$ |
| CB01 | 1185620 | 0.010 | 0.007 | 0.003 | $1.2 \times 10^{8}$ | $4.0 \times 10^{8}$ | $1.7 \times 10^{8}$ |
| CB02 | 0.085 | 763.6 | 542.0 | 221.6 | $1.1 \times 10^{-4}$ | $3.8 \times 10^{-4}$ | $1.6 \times 10^{-4}$ |
| CB03 | 1092500 | 0.010 | 0.007 | 0.003 | $1.1 \times 10^{8}$ | $3.6 \times 10^{8}$ | $1.6 \times 10^{8}$ |
| CB04 | 0.075 | 763.6 | 542.0 | 221.6 | $9.8 \times 10^{-5}$ | $3.4 \times 10^{-4}$ | $1.4 \times 10^{-4}$ |
| CB05 | 1980350 | 0.010 | 0.007 | 0.003 | $2.0 \times 10^{8}$ | $6.6 \times 10^{8}$ | $2.8 \times 10^{8}$ |
| CB06 | 0.088 | 767.2 | 542.0 | 225.2 | $1.1 \times 10^{-4}$ | $3.9 \times 10^{-4}$ | $1.6 \times 10^{-4}$ |
| CB07 | 0.085 | 763.6 | 542.0 | 221.6 | $1.1 \times 10^{-4}$ | $3.8 \times 10^{-4}$ | $1.6 \times 10^{-4}$ |
| CB08 | 0.093 | 767.2 | 542.0 | 225.2 | $1.2 \times 10^{-4}$ | $4.1 \times 10^{-4}$ | $1.7 \times 10^{-4}$ |

TABLE 13

| Table 1a4 | Organic solvent | | | | Container | | |
|---|---|---|---|---|---|---|---|
| | Type | ClogP | HSP distance to eicosane | HSP distance to eicosene | Filter | Type | Void volume [% by volume] |
| Example DA01 | PGME/PGMEA = 7/3 | −0.09 | 12.8 | 11.0 | UPE | EP-SUS | 10 |
| Example DA02 | PGME/PGMEA = 7/3 | −0.09 | 12.8 | 11.0 | PTFE | EP-SUS | 10 |
| Example DA03 | PGME/PGMEA = 7/3 | −0.09 | 12.8 | 11.0 | Nylon | EP-SUS | 10 |
| Example DA04 | PGME/PGMEA = 7/3 | −0.09 | 12.8 | 11.0 | UPE | EP-SUS | 10 |
| Example DA05 | PGME/PGMEA = 7/3 | −0.09 | 12.8 | 11.0 | UPE | EP-SUS | 10 |
| Example DA06 | PGME/PGMEA = 7/3 | −0.09 | 12.8 | 11.0 | UPE | EP-SUS | 10 |
| Example DA07 | PGME/PGMEA = 7/3 | −0.09 | 12.8 | 11.0 | Nylon | EP-SUS | 10 |
| Example DA08 | PGME/PGMEA = 7/3 | −0.09 | 12.8 | 11.0 | Nylon | EP-SUS | 10 |
| Example DA09 | PGME/PGMEA = 7/3 | −0.09 | 12.8 | 11.0 | Nylon | EP-SUS | 10 |
| Example DA10 | PGME/PGMEA = 7/3 | −0.09 | 12.8 | 11.0 | UPE | EP-SUS | 10 |
| Example DA11 | PGME/PGMEA = 7/3 | −0.09 | 12.8 | 11.0 | PTFE | EP-SUS | 10 |

TABLE 13-continued

| Table 1a4 | Organic solvent | | | | Container | | |
|---|---|---|---|---|---|---|---|
| | Type | ClogP | HSP distance to eicosane | HSP distance to eicosene | Filter | Type | Void volume [% by volume] |
| Example DA12 | PGME/PGMEA = 7/3 | −0.09 | 12.8 | 11.0 | Nylon | EP-SUS | 10 |
| Comparative Example DB01 | PGME/PGMEA = 7/3 | −0.09 | 12.8 | 11.0 | UPE | EP-SUS | 10 |
| Comparative Example DB02 | PGME/PGMEA = 7/3 | −0.09 | 12.8 | 11.0 | UPE | EP-SUS | 10 |
| Comparative Example DB03 | PGME/PGMEA = 7/3 | −0.09 | 12.8 | 11.0 | PTFE | EP-SUS | 10 |
| Comparative Example DB04 | PGME/PGMEA = 7/3 | −0.09 | 12.8 | 11.0 | PTFE | EP-SUS | 10 |
| Comparative Example DB05 | PGME/PGMEA = 7/3 | −0.09 | 12.8 | 11.0 | Nylon | EP-SUS | 10 |
| Comparative Example DB06 | PGME/PGMEA = 7/3 | −0.09 | 12.8 | 11.0 | Nylon | EP-SUS | 10 |
| Comparative Example DB07 | PGME/PGMEA = 7/3 | −0.09 | 12.8 | 11.0 | UPE | EP-SUS | 10 |
| Comparative Example DB08 | PGME/PGMEA = 7/3 | −0.09 | 12.8 | 11.0 | Nylon | EP-SUS | 10 |

TABLE 14

| Table 1b4 | Alkane content (mass ppt) (upper column carbon number/lower column ClogP) | | | | | | | | | | | Maximum contained |
|---|---|---|---|---|---|---|---|---|---|---|---|---|
| Chemical liquid | 6 3.9 | 10 6.0 | 12 7.0 | 14 8.1 | 16 9.2 | 18 10.2 | 20 11.3 | 30 16.6 | 40 21.9 | 50 27.1 | Total amount | carbon number |
| DA01 | 0 | 0 | 0 | 1 | 1 | 2 | 1 | 0 | 0 | 0 | 6.5 | 18 |
| DA02 | 0 | 0 | 0 | 0 | 1 | 2 | 1 | 0 | 0 | 0 | 5.5 | 18 |
| DA03 | 0 | 0 | 1 | 1 | 2 | 1 | 0 | 0 | 0 | 0 | 5 | 16 |
| DA04 | 0 | 0 | 0 | 1 | 1 | 2 | 1 | 1 | 0 | 0 | 12 | 18 |
| DA05 | 0 | 0 | 0 | 1 | 2 | 2 | 1 | 1 | 0 | 0 | 13 | 18 |
| DA06 | 0 | 0 | 0 | 0 | 0.01 | 0.02 | 0.02 | 0.01 | 0 | 0 | 0.13 | 20 |
| DA07 | 0 | 0 | 1 | 1 | 2 | 1 | 0 | 0 | 0 | 0 | 5 | 16 |
| DA08 | 0 | 0 | 0 | 1 | 2 | 1 | 0 | 0 | 0 | 0 | 4 | 16 |
| DA09 | 0 | 0 | 0 | 0 | 0.01 | 0.01 | 0 | 0 | 0 | 0 | 0.02 | 18 |
| DA10 | 0 | 0 | 5 | 12 | 26 | 30 | 22 | 10 | 2 | 0 | 188 | 18 |
| DA11 | 0 | 0 | 4 | 12 | 24 | 28 | 20 | 6 | 1 | 0 | 153 | 18 |
| DA12 | 0 | 0 | 5 | 10 | 13 | 8 | 0 | 0 | 0 | 0 | 36 | 16 |
| DB01 | 0 | 0 | 0 | 60 | 35000 | 71000 | 270000 | 52000 | 4200 | 70 | 1062310 | 22 |
| DB02 | 0 | 0 | 0 | 0 | 0 | 0.01 | 0.01 | 0.01 | 0 | 0 | 0.085 | 20 |
| DB03 | 0 | 0 | 0 | 50 | 820 | 54000 | 210000 | 82000 | 3500 | 10 | 1007410 | 22 |
| DB04 | 0 | 0 | 0 | 0 | 0 | 0 | 0.01 | 0.01 | 0 | 0 | 0.075 | 24 |
| DB05 | 0 | 0 | 350 | 3300 | 4500 | 500 | 0 | 0 | 0 | 0 | 8650 | 16 |
| DB06 | 0 | 0 | 0 | 0 | 0.007 | 0.005 | 0 | 0 | 0 | 0 | 0.012 | 16 |
| DB07 | 0.07 | 0.07 | 0 | 0 | 0 | 0.01 | 0.01 | 0.01 | 0 | 0 | 0.085 | 20 |
| DB08 | 0.05 | 0.05 | 0 | 0 | 0.007 | 0.005 | 0 | 0 | 0 | 0 | 0.012 | 16 |

TABLE 15

| Table 1c4 | Alkene content (mass ppt) | | | | | | | | |
|---|---|---|---|---|---|---|---|---|---|
| | $C_kH_{2k}$ (upper column carbon number/lower column ClogP) | | | | | | | | |
| Chemical liquid | 6 3.4 | 10 5.5 | 12 6.6 | 20 10.8 | 30 16.1 | 40 21.4 | 50 26.7 | $C_nH_m$ (squalene) | Total amount |
| DA01 | 0 | 0 | 0 | 0 | 0 | 0 | 0 | 0 | 0 |
| DA02 | 0 | 0 | 0 | 0 | 0 | 0 | 0 | 0 | 0 |
| DA03 | 0 | 0 | 0 | 1 | 2 | 1 | 0 | 2 | 22 |
| DA04 | 0 | 0 | 0 | 0 | 0 | 0 | 0 | 0 | 0 |
| DA05 | 0 | 0 | 0 | 0 | 0 | 0 | 0 | 0 | 0 |
| DA06 | 0 | 0 | 0 | 0 | 0 | 0 | 0 | 0 | 0 |
| DA07 | 0 | 0 | 1 | 2 | 3 | 1 | 0 | 2 | 35 |
| DA08 | 0 | 0 | 1 | 2 | 2 | 2 | 0 | 2 | 35 |

TABLE 15-continued

| | Alkene content (mass ppt) | | | | | | | | |
|---|---|---|---|---|---|---|---|---|---|
| Table 1c4 | $C_kH_{2k}$ (upper column carbon number/lower column ClogP) | | | | | | | | |
| Chemical liquid | 6 3.4 | 10 5.5 | 12 6.6 | 20 10.8 | 30 16.1 | 40 21.4 | 50 26.7 | $C_nH_m$ (squalene) | Total amount |
| DA09 | 0 | 0 | 0.01 | 0.01 | 0.03 | 0.01 | 0 | 0.01 | 0.29 |
| DA10 | 0 | 0 | 0 | 0 | 0 | 0 | 0 | 0 | 0 |
| DA11 | 0 | 0 | 0 | 0 | 0 | 0 | 0 | 0 | 0 |
| DA12 | 0 | 0 | 5 | 16 | 23 | 22 | 12 | 22 | 370 |
| DB01 | 0 | 0 | 0 | 0 | 0 | 0 | 0 | 0 | 0 |
| DB02 | 0 | 0 | 0 | 0 | 0 | 0 | 0 | 0 | 0 |
| DB03 | 0 | 0 | 0 | 0 | 0 | 0 | 0 | 0 | 0 |
| DB04 | 0 | 0 | 0 | 0 | 0 | 0 | 0 | 0 | 0 |
| DB05 | 0 | 0 | 2200 | 91200 | 195000 | 79000 | 7000 | 120000 | 1969000 |
| DB06 | 0 | 0 | 0 | 0.005 | 0.006 | 0.004 | 0 | 0.006 | 0.081 |
| DB07 | 0 | 0 | 0 | 0 | 0 | 0 | 0 | 0 | 0 |
| DB08 | 0 | 0 | 0 | 0.005 | 0.006 | 0.004 | 0 | 0.006 | 0.081 |

TABLE 16

| Table 1d4 Chemical liquid | Organic component total amount (mass ppt) | Metal component Total (mass ppt) | Metal ions (mass ppt) | Metal particles (mass ppt) | Ratio 1 Organic component/ Metal component | Ratio 2 Organic component/ Metal particles | Ratio 3 Organic component/ Metal ions |
|---|---|---|---|---|---|---|---|
| DA01 | 6.5 | 71.4 | 52.9 | 18.5 | $9.1 \times 10^{-2}$ | $3.5 \times 10^{-1}$ | $1.2 \times 10^{-1}$ |
| DA02 | 5.5 | 70.7 | 52.4 | 18.3 | $7.8 \times 10^{-2}$ | $3.0 \times 10^{-1}$ | $1.0 \times 10^{-1}$ |
| DA03 | 27 | 69.4 | 51.4 | 18.0 | $3.9 \times 10^{-1}$ | $1.5 \times 10^{0}$ | $5.3 \times 10^{-1}$ |
| DA04 | 12 | 0.009 | 0.007 | 0.002 | $1.2 \times 10^{3}$ | $4.7 \times 10^{3}$ | $1.6 \times 10^{3}$ |
| DA05 | 13 | 694.2 | 514.2 | 180.0 | $1.8 \times 10^{-2}$ | $6.9 \times 10^{-2}$ | $2.4 \times 10^{-2}$ |
| DA06 | 0.13 | 73.3 | 54.3 | 19.0 | $1.8 \times 10^{-3}$ | $6.8 \times 10^{-3}$ | $2.4 \times 10^{-3}$ |
| DA07 | 40 | 0.011 | 0.008 | 0.003 | $3.7 \times 10^{3}$ | $1.4 \times 10^{4}$ | $4.9 \times 10^{3}$ |
| DA08 | 39 | 691.2 | 512.0 | 179.2 | $5.6 \times 10^{-2}$ | $2.1 \times 10^{-1}$ | $7.5 \times 10^{-2}$ |
| DA09 | 0.31 | 72.9 | 54.0 | 18.9 | $4.2 \times 10^{-3}$ | $1.6 \times 10^{-2}$ | $5.6 \times 10^{-3}$ |
| DA10 | 188 | 71.3 | 52.8 | 18.5 | $2.6 \times 10^{0}$ | $1.0 \times 10^{1}$ | $3.6 \times 10^{0}$ |
| DA11 | 153 | 70.6 | 52.3 | 18.3 | $2.2 \times 10^{0}$ | $8.4 \times 10^{0}$ | $2.9 \times 10^{0}$ |
| DA12 | 406 | 69.3 | 51.3 | 18.0 | $5.9 \times 10^{0}$ | $2.3 \times 10^{1}$ | $7.9 \times 10^{0}$ |
| DB01 | 1062310 | 0.010 | 0.007 | 0.003 | $1.1 \times 10^{8}$ | $3.5 \times 10^{8}$ | $1.5 \times 10^{8}$ |
| DB02 | 0.085 | 757.4 | 532.2 | 225.2 | $1.1 \times 10^{-4}$ | $3.8 \times 10^{-4}$ | $1.6 \times 10^{-4}$ |
| DB03 | 1007410 | 0.010 | 0.007 | 0.003 | $1.0 \times 10^{8}$ | $3.4 \times 10^{8}$ | $1.4 \times 10^{8}$ |
| DB04 | 0.075 | 763.7 | 542.1 | 221.6 | $9.8 \times 10^{-5}$ | $3.4 \times 10^{-4}$ | $1.4 \times 10^{-4}$ |
| DB05 | 1977650 | 0.010 | 0.007 | 0.003 | $2.0 \times 10^{8}$ | $6.6 \times 10^{8}$ | $2.8 \times 10^{8}$ |
| DB06 | 0.093 | 782.4 | 557.2 | 225.2 | $1.2 \times 10^{-4}$ | $4.1 \times 10^{-4}$ | $1.7 \times 10^{-4}$ |
| DB07 | 0.085 | 757.4 | 532.2 | 225.2 | $1.1 \times 10^{-4}$ | $3.8 \times 10^{-4}$ | $1.6 \times 10^{-4}$ |
| DB08 | 0.093 | 782.4 | 557.2 | 225.2 | $1.2 \times 10^{-4}$ | $4.1 \times 10^{-4}$ | $1.7 \times 10^{-4}$ |

TABLE 17

| | Organic solvent | | | | | Container | |
|---|---|---|---|---|---|---|---|
| Table 1a5 | Type | ClogP | HSP distance to eicosane | HSP distance to eicosene | Filter | Type | Void volume [% by volume] |
| Example EA01 | PGMEA/PC = 5/5 | 0.04 | 14.8 | 13.5 | UPE | EP-SUS | 10 |
| Example EA02 | PGMEA/PC = 5/5 | 0.04 | 14.8 | 13.5 | PTFE | EP-SUS | 10 |
| Example EA03 | PGMEA/PC = 5/5 | 0.04 | 14.8 | 13.5 | Nylon | EP-SUS | 10 |
| Example EA04 | PGMEA/PC = 5/5 | 0.04 | 14.8 | 13.5 | Nylon-grafted UPE | EP-SUS | 10 |
| Example EA05 | PGMEA/PC = 5/5 | 0.04 | 14.8 | 13.5 | Polyimide | EP-SUS | 10 |
| Example EA06 | PGMEA/PC = 5/5 | 0.04 | 14.8 | 13.5 | Polyamide | EP-SUS | 10 |
| Example EA07 | PGMEA/PC = 5/5 | 0.04 | 14.8 | 13.5 | UPE | EP-SUS | 10 |
| Example EA08 | PGMEA/PC = 5/5 | 0.04 | 14.8 | 13.5 | UPE | EP-SUS | 10 |
| Example EA09 | PGMEA/PC = 5/5 | 0.04 | 14.8 | 13.5 | UPE | EP-SUS | 10 |
| Example EA10 | PGMEA/PC = 5/5 | 0.04 | 14.8 | 13.5 | Nylon | EP-SUS | 10 |
| Example EA11 | PGMEA/PC = 5/5 | 0.04 | 14.8 | 13.5 | Nylon | EP-SUS | 10 |

TABLE 17-continued

| Table 1a5 | Organic solvent | | | | Container | | |
|---|---|---|---|---|---|---|---|
| | Type | ClogP | HSP distance to eicosane | HSP distance to eicosene | Filter | Type | Void volume [% by volume] |
| Example EA12 | PGMEA/PC = 5/5 | 0.04 | 14.8 | 13.5 | Nylon | EP-SUS | 10 |
| Example EA13 | PGMEA/PC = 5/5 | 0.04 | 14.8 | 13.5 | UPE | EP-SUS | 10 |
| Example EA14 | PGMEA/PC = 5/5 | 0.04 | 14.8 | 13.5 | PTFE | EP-SUS | 10 |
| Example EA15 | PGMEA/PC = 5/5 | 0.04 | 14.8 | 13.5 | Nylon | EP-SUS | 10 |
| Example EA16 | PGMEA/PC = 5/5 | 0.04 | 14.8 | 13.5 | UPE | EP-SUS | 30 |
| Example EA17 | PGMEA/PC = 5/5 | 0.04 | 14.8 | 13.5 | UPE | EP-SUS | 50 |
| Example EA18 | PGMEA/PC = 5/5 | 0.04 | 14.8 | 13.5 | PTFE | EP-SUS | 30 |
| Example EA19 | PGMEA/PC = 5/5 | 0.04 | 14.8 | 13.5 | PTFE | EP-SUS | 50 |
| Example EA20 | PGMEA/PC = 5/5 | 0.04 | 14.8 | 13.5 | UPE | PFA | 10 |
| Example EA21 | PGMEA/PC = 5/5 | 0.04 | 14.8 | 13.5 | PTFE | PFA | 10 |
| Example EA22 | PGMEA/PC = 5/5 | 0.04 | 14.8 | 13.5 | Nylon | PFA | 10 |
| Comparative Example EB01 | PGMEA/PC = 5/5 | 0.04 | 14.8 | 13.5 | UPE | EP-SUS | 10 |
| Comparative Example EB02 | PGMEA/PC = 5/5 | 0.04 | 14.8 | 13.5 | UPE | EP-SUS | 10 |
| Comparative Example EB03 | PGMEA/PC = 5/5 | 0.04 | 14.8 | 13.5 | PTFE | EP-SUS | 10 |
| Comparative Example EB04 | PGMEA/PC = 5/5 | 0.04 | 14.8 | 13.5 | PTFE | EP-SUS | 10 |
| Comparative Example EB05 | PGMEA/PC = 5/5 | 0.04 | 14.8 | 13.5 | Nylon | EP-SUS | 10 |
| Comparative Example EB06 | PGMEA/PC = 5/5 | 0.04 | 14.8 | 13.5 | Nylon | EP-SUS | 10 |
| Comparative Example EB07 | PGMEA/PC = 5/5 | 0.04 | 14.8 | 13.5 | UPE | EP-SUS | 10 |
| Comparative Example EB08 | PGMEA/PC = 5/5 | 0.04 | 14.8 | 13.5 | Nylon | EP-SUS | 10 |

TABLE 18

| Table 1b5 | Alkane content (mass ppt) (upper column carbon number/lower column ClogP) | | | | | | | | | | | Maximum contained |
|---|---|---|---|---|---|---|---|---|---|---|---|---|
| Chemical liquid | 6 3.9 | 10 6.0 | 12 7.0 | 14 8.1 | 16 9.2 | 18 10.2 | 20 11.3 | 30 16.6 | 40 21.9 | 50 27.1 | Total amount | carbon number |
| EA01 | 0 | 0 | 0 | 1 | 1 | 1 | 2 | 2 | 1 | 0 | 23 | 28 |
| EA02 | 0 | 0 | 0 | 1 | 1 | 2 | 1 | 1 | 0 | 0 | 12 | 18 |
| EA03 | 0 | 0 | 1 | 1 | 2 | 1 | 0 | 0 | 0 | 0 | 5 | 16 |
| EA04 | 0 | 0 | 1 | 1 | 2 | 2 | 1 | 1 | 0 | 0 | 14 | 18 |
| EA05 | 0 | 0 | 1 | 1 | 1 | 2 | 2 | 1 | 0 | 0 | 15 | 18 |
| EA06 | 0 | 0 | 1 | 2 | 3 | 2 | 1 | 1 | 0 | 0 | 16 | 16 |
| EA07 | 0 | 0 | 0 | 1 | 1 | 1 | 2 | 2 | 1 | 0 | 23 | 24 |
| EA08 | 0 | 0 | 0 | 1 | 1 | 1 | 2 | 2 | 1 | 0 | 23 | 24 |
| EA09 | 0 | 0 | 0 | 0 | 0.01 | 0.01 | 0.02 | 0.02 | 0.01 | 0 | 0.22 | 24 |
| EA10 | 0 | 0 | 1 | 1 | 2 | 1 | 0 | 0 | 0 | 0 | 5 | 16 |
| EA11 | 0 | 0 | 1 | 1 | 2 | 1 | 0 | 0 | 0 | 0 | 5 | 16 |
| EA12 | 0 | 0 | 0 | 0 | 0.01 | 0.01 | 0 | 0 | 0 | 0 | 0.02 | 18 |
| EA13 | 0 | 0 | 5 | 10 | 20 | 35 | 39 | 41 | 12 | 5 | 450 | 22 |
| EA14 | 0 | 0 | 3 | 8 | 12 | 18 | 30 | 25 | 5 | 0 | 266 | 22 |
| EA15 | 0 | 0 | 5 | 10 | 25 | 15 | 0 | 0 | 0 | 0 | 55 | 16 |
| EA16 | 0 | 0 | 0 | 1 | 2 | 2 | 3 | 4 | 1 | 0 | 38 | 26 |
| EA17 | 0 | 0 | 0 | 1 | 2 | 3 | 4 | 4 | 1 | 0 | 41 | 26 |
| EA18 | 0 | 0 | 0 | 1 | 1 | 3 | 2 | 1 | 0 | 0 | 15 | 18 |
| EA19 | 0 | 0 | 0 | 1 | 2 | 3 | 2 | 1 | 0 | 0 | 16 | 18 |
| EA20 | 0 | 0 | 0 | 1 | 1 | 2 | 2 | 4 | 1 | 0 | 34 | 28 |
| EA21 | 0 | 0 | 0 | 1 | 1 | 2 | 1 | 1 | 0 | 0 | 12 | 18 |
| EA22 | 0 | 0 | 1 | 1 | 2 | 1 | 0 | 0 | 0 | 0 | 5 | 16 |
| EB01 | 0 | 0 | 0 | 100 | 12000 | 98000 | 310000 | 92000 | 4200 | 150 | 1366630 | 22 |
| EB02 | 0 | 0 | 0 | 0 | 0 | 0.01 | 0.01 | 0.01 | 0 | 0 | 0.085 | 20 |
| EB03 | 0 | 0 | 0 | 80 | 890 | 79500 | 190000 | 92000 | 3900 | 150 | 1035500 | 22 |
| EB04 | 0 | 0 | 0 | 0 | 0 | 0 | 0.01 | 0.01 | 0 | 0 | 0.075 | 22 |
| EB05 | 0 | 0 | 240 | 2900 | 5000 | 1100 | 0 | 0 | 0 | 0 | 9240 | 16 |
| EB06 | 0 | 0 | 0 | 0 | 0.007 | 0.005 | 0 | 0 | 0 | 0 | 0.012 | 16 |
| EB07 | 0.07 | 0.07 | 0 | 0 | 0 | 0.01 | 0.01 | 0.01 | 0 | 0 | 0.085 | 22 |
| EB08 | 0.05 | 0.05 | 0 | 0 | 0.007 | 0.005 | 0 | 0 | 0 | 0 | 0.012 | 16 |

TABLE 19

| | Alkene content (mass ppt) | | | | | | | | |
|---|---|---|---|---|---|---|---|---|---|
| Table 1c5 | $C_kH_{2k}$ (upper column carbon number/lower column ClogP) | | | | | | | | |
| Chemical liquid | 6 / 3.4 | 10 / 5.5 | 12 / 6.6 | 20 / 10.8 | 30 / 16.1 | 40 / 21.4 | 50 / 26.7 | $C_nH_m$ (squalene) | Total amount |
| EA01 | 0 | 0 | 0 | 0 | 0 | 0 | 0 | 0 | 0 |
| EA02 | 0 | 0 | 0 | 0 | 0 | 0 | 0 | 0 | 0 |
| EA03 | 0 | 0 | 1 | 2 | 3 | 2 | 0 | 2 | 38 |
| EA04 | 0 | 0 | 1 | 2 | 3 | 1 | 0 | 2 | 33 |
| EA05 | 0 | 0 | 1 | 3 | 2 | 1 | 0 | 2 | 33 |
| EA06 | 0 | 0 | 1 | 2 | 2 | 1 | 0 | 2 | 28 |
| EA07 | 0 | 0 | 0 | 0 | 0 | 0 | 0 | 0 | 0 |
| EA08 | 0 | 0 | 0 | 0 | 0 | 0 | 0 | 0 | 0 |
| EA09 | 0 | 0 | 0 | 0 | 0 | 0 | 0 | 0 | 0 |
| EA10 | 0 | 0 | 1 | 2 | 3 | 1 | 0 | 2 | 33 |
| EA11 | 0 | 0 | 1 | 2 | 3 | 2 | 0 | 2 | 38 |
| EA12 | 0 | 0 | 0.01 | 0.01 | 0.03 | 0.01 | 0 | 0.01 | 0.28 |
| EA13 | 0 | 0 | 0 | 0 | 0 | 0 | 0 | 0 | 0 |
| EA14 | 0 | 0 | 0 | 0 | 0 | 0 | 0 | 0 | 0 |
| EA15 | 0 | 0 | 5 | 16 | 26 | 22 | 12 | 22 | 385 |
| EA16 | 0 | 0 | 0 | 0 | 0 | 0 | 0 | 0 | 0 |
| EA17 | 0 | 0 | 0 | 0 | 0 | 0 | 0 | 0 | 0 |
| EA18 | 0 | 0 | 0 | 0 | 0 | 0 | 0 | 0 | 0 |
| EA19 | 0 | 0 | 0 | 0 | 0 | 0 | 0 | 0 | 0 |
| EA20 | 0 | 0 | 0 | 0 | 0 | 0 | 0 | 0 | 0 |
| EA21 | 0 | 0 | 0 | 0 | 0 | 0 | 0 | 0 | 0 |
| EA22 | 0 | 0 | 1 | 2 | 3 | 2 | 0 | 2 | 38 |
| EB01 | 0 | 0 | 0 | 0 | 0 | 0 | 0 | 0 | 0 |
| EB02 | 0 | 0 | 0 | 0 | 0 | 0 | 0 | 0 | 0 |
| EB03 | 0 | 0 | 0 | 0 | 0 | 0 | 0 | 0 | 0 |
| EB04 | 0 | 0 | 0 | 0 | 0 | 0 | 0 | 0 | 0 |
| EB05 | 0 | 0 | 2900 | 110000 | 220000 | 80000 | 500 | 120000 | 2178500 |
| EB06 | 0 | 0 | 0 | 0.005 | 0.006 | 0.004 | 0 | 0.006 | 0.081 |
| EB07 | 0 | 0 | 0 | 0 | 0 | 0 | 0 | 0 | 0 |
| EB08 | 0 | 0 | 0 | 0.005 | 0.006 | 0.004 | 0 | 0.006 | 0.081 |

TABLE 20

| Table 1d5 Chemical liquid | Organic component Total amount (mass ppt) | Metal component Total (mass ppt) | Metal ions (mass ppt) | Metal particles (mass ppt) | Ratio 1 Organic component/ Metal component | Ratio 2 Organic component/ Metal particles | Ratio 3 Organic component/ Metal ions |
|---|---|---|---|---|---|---|---|
| EA01 | 23 | 70.7 | 52.4 | 18.3 | $3.3 \times 10^{-1}$ | $1.3 \times 10^{0}$ | $4.4 \times 10^{-1}$ |
| EA02 | 12 | 72.6 | 53.8 | 18.8 | $1.6 \times 10^{-1}$ | $6.1 \times 10^{-1}$ | $2.1 \times 10^{-1}$ |
| EA03 | 43 | 71.0 | 52.6 | 18.4 | $6.0 \times 10^{-1}$ | $2.3 \times 10^{0}$ | $8.1 \times 10^{-1}$ |
| EA04 | 47 | 70.3 | 52.1 | 18.2 | $6.5 \times 10^{-1}$ | $2.5 \times 10^{0}$ | $8.8 \times 10^{-1}$ |
| EA05 | 48 | 69.0 | 51.1 | 17.9 | $6.9 \times 10^{-1}$ | $2.7 \times 10^{0}$ | $9.3 \times 10^{-1}$ |
| EA06 | 44 | 70.9 | 52.5 | 18.4 | $6.1 \times 10^{-1}$ | $2.3 \times 10^{0}$ | $8.2 \times 10^{-1}$ |
| EA07 | 23 | 0.011 | 0.008 | 0.003 | $2.1 \times 10^{3}$ | $8.2 \times 10^{3}$ | $2.9 \times 10^{3}$ |
| EA08 | 23 | 693.9 | 514.0 | 179.9 | $3.3 \times 10^{-2}$ | $1.3 \times 10^{-1}$ | $4.5 \times 10^{-2}$ |
| EA09 | 0.22 | 71.1 | 52.7 | 18.4 | $3.1 \times 10^{-3}$ | $1.2 \times 10^{-2}$ | $4.2 \times 10^{-3}$ |
| EA10 | 38 | 0.009 | 0.007 | 0.002 | $4.0 \times 10^{3}$ | $1.5 \times 10^{4}$ | $5.4 \times 10^{3}$ |
| EA11 | 43 | 693.9 | 514.0 | 179.9 | $6.1 \times 10^{-2}$ | $2.4 \times 10^{-1}$ | $8.3 \times 10^{-2}$ |
| EA12 | 0.30 | 69.5 | 51.5 | 18.0 | $4.2 \times 10^{-3}$ | $1.6 \times 10^{-2}$ | $5.7 \times 10^{-3}$ |
| EA13 | 450 | 71.4 | 52.9 | 18.5 | $6.3 \times 10^{0}$ | $2.4 \times 10^{1}$ | $8.5 \times 10^{0}$ |
| EA14 | 266 | 73.3 | 54.3 | 19.0 | $3.6 \times 10^{0}$ | $1.4 \times 10^{1}$ | $4.9 \times 10^{0}$ |
| EA15 | 440 | 71.7 | 53.1 | 18.6 | $6.1 \times 10^{0}$ | $2.4 \times 10^{1}$ | $8.3 \times 10^{0}$ |
| EA16 | 38 | 71.0 | 52.6 | 18.4 | $5.3 \times 10^{-1}$ | $2.0 \times 10^{0}$ | $7.1 \times 10^{-1}$ |
| EA17 | 41 | 69.7 | 51.6 | 18.1 | $5.9 \times 10^{-1}$ | $2.3 \times 10^{0}$ | $7.9 \times 10^{-1}$ |
| EA18 | 15 | 73.6 | 54.5 | 19.1 | $2.0 \times 10^{-1}$ | $7.9 \times 10^{-1}$ | $2.8 \times 10^{-1}$ |
| EA19 | 16 | 71.6 | 53.0 | 18.6 | $2.2 \times 10^{-1}$ | $8.6 \times 10^{-1}$ | $3.0 \times 10^{-1}$ |
| EA20 | 34 | 70.9 | 52.5 | 18.4 | $4.8 \times 10^{-1}$ | $1.9 \times 10^{0}$ | $6.5 \times 10^{-1}$ |
| EA21 | 12 | 69.5 | 51.5 | 18.0 | $1.7 \times 10^{-1}$ | $6.4 \times 10^{-1}$ | $2.2 \times 10^{-1}$ |
| EA22 | 43 | 71.4 | 52.9 | 18.5 | $6.0 \times 10^{-1}$ | $2.3 \times 10^{0}$ | $8.0 \times 10^{-1}$ |
| EB01 | 1366630 | 0.010 | 0.007 | 0.003 | $1.4 \times 10^{8}$ | $4.6 \times 10^{8}$ | $2.0 \times 10^{8}$ |
| EB02 | 0.085 | 756.4 | 534.8 | 221.6 | $1.1 \times 10^{-4}$ | $3.8 \times 10^{-4}$ | $1.6 \times 10^{-4}$ |
| EB03 | 1035500 | 0.010 | 0.007 | 0.003 | $1.0 \times 10^{8}$ | $3.5 \times 10^{8}$ | $1.5 \times 10^{8}$ |
| EB04 | 0.075 | 756.4 | 534.8 | 221.6 | $9.9 \times 10^{-5}$ | $3.4 \times 10^{-4}$ | $1.4 \times 10^{-4}$ |

TABLE 20-continued

| Table 1d5 Chemical liquid | Organic component Total amount (mass ppt) | Metal component Total (mass ppt) | Metal component Metal ions (mass ppt) | Metal component Metal particles (mass ppt) | Ratio 1 Organic component/ Metal component | Ratio 2 Organic component/ Metal particles | Ratio 3 Organic component/ Metal ions |
|---|---|---|---|---|---|---|---|
| EB05 | 2187740 | 0.011 | 0.008 | 0.003 | $2.0 \times 10^{8}$ | $7.3 \times 10^{8}$ | $2.7 \times 10^{8}$ |
| EB06 | 0.093 | 760.0 | 534.8 | 225.2 | $1.2 \times 10^{-4}$ | $4.1 \times 10^{-4}$ | $1.7 \times 10^{-4}$ |
| EB07 | 0.085 | 756.4 | 534.8 | 221.6 | $1.1 \times 10^{-4}$ | $3.8 \times 10^{-4}$ | $1.6 \times 10^{-4}$ |
| EB08 | 0.093 | 760.0 | 534.8 | 225.2 | $1.2 \times 10^{-4}$ | $4.1 \times 10^{-4}$ | $1.7 \times 10^{-4}$ |

TABLE 21

| Table 1a5' | Organic solvent Type | ClogP | HSP distance to eicosane | HSP distance to eicosene | Filter | Container Type | Void volume [% by volume] |
|---|---|---|---|---|---|---|---|
| Example EA023 | PGMEA/PC = 3/7 | -0.14 | 16.9 | 15.8 | UPE | EP-SUS | 10 |
| Example EA024 | PGMEA/PC = 9/1 | 0.48 | 11.6 | 9.8 | PTFE | EP-SUS | 10 |
| Example EA025 | PGMEA/PC = 8/2 | 0.36 | 12.1 | 10.5 | Nylon | EP-SUS | 10 |
| Example EA026 | PGMEA/PC = 9/1 | 0.48 | 11.6 | 9.8 | Nylon-grafted UPE | EP-SUS | 10 |
| Example EA027 | PGMEA/PC = 7/3 | 0.25 | 12.9 | 11.4 | UPE | EP-SUS | 10 |
| Example EA028 | MMP/PC = 9/1 | 0.21 | 11.5 | 9.8 | PTFE | EP-SUS | 10 |
| Example EA029 | MMP/PC = 7/3 | 0.07 | 12.7 | 11.1 | Nylon | EP-SUS | 10 |
| Example EA030 | MMP/PC = 6/4 | 0.00 | 13.6 | 12.1 | Nylon-grafted UPE | EP-SUS | 10 |
| Example EA031 | MMP/PC = 5/5 | -0.07 | 15.7 | 14.3 | Polyimide | EP-SUS | 10 |
| Example EA032 | MMP/PC = 5/5 | -0.07 | 15.7 | 14.3 | Polyamide | EP-SUS | 10 |
| Example EA033 | MMP/PC = 5/5 | -0.07 | 15.7 | 14.3 | UPE | EP-SUS | 10 |
| Example EA034 | MMP/PC = 5/5 | -0.07 | 15.7 | 14.3 | UPE | EP-SUS | 10 |
| Example EA035 | MMP/PC = 5/5 | -0.07 | 15.7 | 14.3 | UPE | EP-SUS | 10 |
| Example EA036 | MMP/PC = 5/5 | -0.07 | 15.7 | 14.3 | Nylon | EP-SUS | 10 |
| Example EA037 | MMP/PC = 5/5 | -0.07 | 15.7 | 14.3 | Nylon | EP-SUS | 10 |
| Example EA038 | MMP/PC = 5/5 | -0.07 | 15.7 | 14.3 | Nylon | EP-SUS | 10 |
| Example EA039 | MMP/PC = 5/5 | -0.07 | 15.7 | 14.3 | UPE | EP-SUS | 10 |
| Example EA040 | MMP/PC = 5/5 | -0.07 | 15.7 | 14.3 | PTFE | EP-SUS | 10 |
| Example EA041 | MMP/PC = 5/5 | -0.07 | 15.7 | 14.3 | Nylon | EP-SUS | 10 |
| Example EA042 | MMP/PC = 5/5 | -0.07 | 15.7 | 14.3 | UPE | EP-SUS | 30 |
| Example EA043 | MMP/PC = 5/5 | -0.07 | 15.7 | 14.3 | UPE | EP-SUS | 50 |
| Example EA044 | MMP/PC = 5/5 | -0.07 | 15.7 | 14.3 | PTFE | EP-SUS | 30 |
| Example EA045 | MMP/PC = 5/5 | -0.07 | 15.7 | 14.3 | PTFE | EP-SUS | 50 |
| Example EA046 | MMP/PC = 5/5 | -0.07 | 15.7 | 14.3 | UPE | PFA | 10 |
| Example EA047 | MMP/PC = 5/5 | -0.07 | 15.7 | 14.3 | PTFE | PFA | 10 |
| Example EA048 | MMP/PC = 5/5 | -0.07 | 15.7 | 14.3 | Nylon | PFA | 10 |
| Comparative Example EB09 | MMP/PC = 5/5 | -0.07 | 15.7 | 14.3 | UPE | EP-SUS | 10 |
| Comparative Example EB10 | MMP/PC = 5/5 | -0.07 | 15.7 | 14.3 | UPE | EP-SUS | 10 |
| Comparative Example EB11 | MMP/PC = 5/5 | -0.07 | 15.7 | 14.3 | PTFE | EP-SUS | 10 |
| Comparative Example EB12 | MMP/PC = 5/5 | -0.07 | 15.7 | 14.3 | PTFE | EP-SUS | 10 |
| Comparative Example EB13 | MMP/PC = 5/5 | -0.07 | 15.7 | 14.3 | Nylon | EP-SUS | 10 |
| Comparative Example EB14 | MMP/PC = 5/5 | -0.07 | 15.7 | 14.3 | Nylon | EP-SUS | 10 |
| Comparative Example EB15 | MMP/PC = 5/5 | -0.07 | 15.7 | 14.3 | UPE | EP-SUS | 10 |
| Comparative Example EB16 | MMP/PC = 5/5 | -0.07 | 15.7 | 14.3 | Nylon | EP-SUS | 10 |

TABLE 22

| Table 1b5' | Alkane content (mass ppt) (upper column carbon number/lower column ClogP) | | | | | | | | | | Total amount | Maximum contained carbon number |
|---|---|---|---|---|---|---|---|---|---|---|---|---|
| Chemical liquid | 6<br>3.9 | 10<br>6.0 | 12<br>7.0 | 14<br>8.1 | 16<br>9.2 | 18<br>10.2 | 20<br>11.3 | 30<br>16.6 | 40<br>21.9 | 50<br>27.1 | | |
| EA023 | 0 | 0 | 0 | 1 | 1 | 2 | 1 | 1 | 0 | 0 | 12 | 18 |
| EA024 | 0 | 0 | 0 | 1 | 2 | 3 | 2 | 1 | 0 | 0 | 16 | 18 |
| EA025 | 0 | 0 | 1 | 1 | 2 | 1 | 0 | 0 | 0 | 0 | 5 | 16 |
| EA026 | 0 | 0 | 1 | 1 | 1 | 2 | 1 | 1 | 0 | 0 | 13 | 18 |
| EA027 | 0 | 0 | 0 | 1 | 1 | 2 | 3 | 4 | 1 | 0 | 37 | 28 |
| EA028 | 0 | 0 | 0 | 1 | 1 | 2 | 1 | 1 | 0 | 0 | 12 | 18 |
| EA029 | 0 | 0 | 1 | 1 | 2 | 1 | 0 | 0 | 0 | 0 | 5 | 16 |
| EA030 | 0 | 0 | 1 | 1 | 2 | 2 | 2 | 1 | 0 | 0 | 16 | 18 |
| EA031 | 0 | 0 | 1 | 1 | 2 | 3 | 2 | 1 | 0 | 0 | 17 | 18 |
| EA032 | 0 | 0 | 1 | 2 | 3 | 3 | 2 | 1 | 0 | 0 | 19 | 16 |
| EA033 | 0 | 0 | 0 | 1 | 1 | 2 | 2 | 2 | 1 | 0 | 29 | 20 |
| EA034 | 0 | 0 | 0 | 1 | 1 | 2 | 3 | 3 | 1 | 0 | 32 | 24 |
| EA035 | 0 | 0 | 0 | 0 | 0.01 | 0.01 | 0.02 | 0.02 | 0.01 | 0 | 0.22 | 24 |
| EA036 | 0 | 0 | 1 | 2 | 2 | 1 | 0 | 0 | 0 | 0 | 6 | 16 |
| EA037 | 0 | 0 | 1 | 2 | 2 | 1 | 0 | 0 | 0 | 0 | 6 | 16 |
| EA038 | 0 | 0 | 0 | 0 | 0.01 | 0.01 | 0 | 0 | 0 | 0 | 0.02 | 18 |
| EA039 | 0 | 0 | 5 | 10 | 20 | 38 | 42 | 41 | 12 | 5 | 461 | 22 |
| EA040 | 0 | 0 | 3 | 8 | 12 | 20 | 32 | 25 | 5 | 0 | 273 | 22 |
| EA041 | 0 | 0 | 5 | 10 | 26 | 16 | 0 | 0 | 0 | 0 | 57 | 16 |
| EA042 | 0 | 0 | 0 | 1 | 2 | 2 | 4 | 4 | 1 | 0 | 40 | 26 |
| EA043 | 0 | 0 | 0 | 1 | 2 | 3 | 4 | 4 | 1 | 0 | 41 | 26 |
| EA044 | 0 | 0 | 0 | 1 | 2 | 3 | 2 | 1 | 0 | 0 | 16 | 18 |
| EA045 | 0 | 0 | 0 | 1 | 2 | 3 | 2 | 1 | 0 | 0 | 16 | 18 |
| EA046 | 0 | 0 | 0 | 1 | 1 | 2 | 3 | 4 | 1 | 0 | 37 | 28 |
| EA047 | 0 | 0 | 0 | 1 | 1 | 2 | 2 | 1 | 0 | 0 | 14 | 18 |
| EA048 | 0 | 0 | 1 | 1 | 2 | 1 | 0 | 0 | 0 | 0 | 5 | 16 |
| EB09 | 0 | 0 | 0 | 120 | 13200 | 99000 | 315000 | 94000 | 3800 | 120 | 1389240 | 22 |
| EB10 | 0 | 0 | 0 | 0 | 0 | 0.01 | 0.01 | 0.01 | 0 | 0 | 0.085 | 20 |
| EB11 | 0 | 0 | 0 | 80 | 920 | 81000 | 205000 | 93500 | 2800 | 130 | 1076460 | 22 |
| EB12 | 0 | 0 | 0 | 0 | 0 | 0 | 0.01 | 0.01 | 0 | 0 | 0.075 | 22 |
| EB13 | 0 | 0 | 220 | 3200 | 5100 | 1200 | 0 | 0 | 0 | 0 | 9720 | 16 |
| EB14 | 0 | 0 | 0 | 0 | 0.008 | 0.006 | 0 | 0 | 0 | 0 | 0.014 | 16 |
| EB15 | 0.07 | 0.08 | 0 | 0 | 0 | 0.01 | 0.01 | 0.01 | 0 | 0 | 0.085 | 22 |
| EB16 | 0.06 | 0.05 | 0 | 0 | 0.008 | 0.006 | 0 | 0 | 0 | 0 | 0.014 | 16 |

TABLE 23

| | Alkene content (mass ppt) | | | | | | | | |
|---|---|---|---|---|---|---|---|---|---|
| Table 1c5' | $C_kH_{2k}$ (upper column carbon number/lower column ClogP) | | | | | | | | |
| Chemical liquid | 6<br>3.4 | 10<br>5.5 | 12<br>6.6 | 20<br>10.8 | 30<br>16.1 | 40<br>21.4 | 50<br>26.7 | $C_nH_m$ (squalene) | Total amount |
| EA023 | 0 | 0 | 0 | 0 | 0 | 0 | 0 | 0 | 0 |
| EA024 | 0 | 0 | 0 | 0 | 0 | 0 | 0 | 0 | 0 |
| EA025 | 0 | 0 | 1 | 2 | 3 | 2 | 0 | 2 | 38 |
| EA026 | 0 | 0 | 1 | 2 | 3 | 1 | 0 | 2 | 33 |
| EA027 | 0 | 0 | 0 | 0 | 0 | 0 | 0 | 0 | 0 |
| EA028 | 0 | 0 | 0 | 0 | 0 | 0 | 0 | 0 | 0 |
| EA029 | 0 | 0 | 1 | 2 | 3 | 2 | 0 | 2 | 38 |
| EA030 | 0 | 0 | 1 | 2 | 3 | 1 | 0 | 2 | 33 |
| EA031 | 0 | 0 | 1 | 3 | 2 | 1 | 0 | 2 | 33 |
| EA032 | 0 | 0 | 1 | 2 | 2 | 1 | 0 | 2 | 28 |
| EA033 | 0 | 0 | 0 | 0 | 0 | 0 | 0 | 0 | 0 |
| EA034 | 0 | 0 | 0 | 0 | 0 | 0 | 0 | 0 | 0 |
| EA035 | 0 | 0 | 0 | 0 | 0 | 0 | 0 | 0 | 0 |
| EA036 | 0 | 0 | 1 | 2 | 3 | 1 | 0 | 2 | 33 |
| EA037 | 0 | 0 | 1 | 2 | 3 | 2 | 0 | 2 | 38 |
| EA038 | 0 | 0 | 0.01 | 0.01 | 0.03 | 0.01 | 0 | 0.01 | 0.28 |
| EA039 | 0 | 0 | 0 | 0 | 0 | 0 | 0 | 0 | 0 |
| EA040 | 0 | 0 | 0 | 0 | 0 | 0 | 0 | 0 | 0 |
| EA041 | 0 | 0 | 5 | 16 | 26 | 22 | 12 | 22 | 385 |
| EA042 | 0 | 0 | 0 | 0 | 0 | 0 | 0 | 0 | 0 |
| EA043 | 0 | 0 | 0 | 0 | 0 | 0 | 0 | 0 | 0 |
| EA044 | 0 | 0 | 0 | 0 | 0 | 0 | 0 | 0 | 0 |
| EA045 | 0 | 0 | 0 | 0 | 0 | 0 | 0 | 0 | 0 |
| EA046 | 0 | 0 | 0 | 0 | 0 | 0 | 0 | 0 | 0 |
| EA047 | 0 | 0 | 0 | 0 | 0 | 0 | 0 | 0 | 0 |
| EA048 | 0 | 0 | 1 | 2 | 3 | 2 | 0 | 2 | 38 |

TABLE 23-continued

| | Alkene content (mass ppt) | | | | | | | | |
|---|---|---|---|---|---|---|---|---|---|
| Table 1c5' | $C_kH_{2k}$ (upper column carbon number/lower column ClogP) | | | | | | | | |
| Chemical liquid | 6<br>3.4 | 10<br>5.5 | 12<br>6.6 | 20<br>10.8 | 30<br>16.1 | 40<br>21.4 | 50<br>26.7 | $C_nH_m$ (squalene) | Total amount |
| EB09 | 0 | 0 | 0 | 0 | 0 | 0 | 0 | 0 | 0 |
| EB10 | 0 | 0 | 0 | 0 | 0 | 0 | 0 | 0 | 0 |
| EB11 | 0 | 0 | 0 | 0 | 0 | 0 | 0 | 0 | 0 |
| EB12 | 0 | 0 | 0 | 0 | 0 | 0 | 0 | 0 | 0 |
| EB13 | 0 | 0 | 2900 | 110000 | 220000 | 80000 | 500 | 120000 | 2178500 |
| EB14 | 0 | 0 | 0 | 0.005 | 0.006 | 0.004 | 0 | 0.006 | 0.081 |
| EB15 | 0 | 0 | 0 | 0 | 0 | 0 | 0 | 0 | 0 |
| EB16 | 0 | 0 | 0 | 0.005 | 0.006 | 0.004 | 0 | 0.006 | 0.081 |

TABLE 24

| | Organic component | Metal component | | | Ratio 1<br>Organic | Ratio 2<br>Organic | Ratio 3<br>Organic |
|---|---|---|---|---|---|---|---|
| Table 1d5'<br>Chemical liquid | total amount (mass ppt) | Total (mass ppt) | Metal ions (mass ppt) | Metal particles (mass ppt) | component/ Metal component | component/ Metal particles | component/ Metal ions |
| EA023 | 12 | 70.7 | 52.4 | 18.3 | $1.6 \times 10^{-1}$ | $6.3 \times 10^{-1}$ | $2.2 \times 10^{-1}$ |
| EA024 | 16 | 72.6 | 53.8 | 18.8 | $2.2 \times 10^{-1}$ | $8.5 \times 10^{-1}$ | $3.0 \times 10^{-1}$ |
| EA025 | 43 | 71.0 | 52.6 | 18.4 | $6.0 \times 10^{-1}$ | $2.3 \times 10^{0}$ | $8.1 \times 10^{-1}$ |
| EA026 | 46 | 70.3 | 52.1 | 18.2 | $6.4 \times 10^{-1}$ | $2.5 \times 10^{0}$ | $8.6 \times 10^{-1}$ |
| EA027 | 37 | 70.7 | 52.4 | 18.3 | $5.2 \times 10^{-1}$ | $2.0 \times 10^{0}$ | $7.0 \times 10^{-1}$ |
| EA028 | 12 | 72.6 | 53.8 | 18.8 | $1.6 \times 10^{-1}$ | $6.1 \times 10^{-1}$ | $2.1 \times 10^{-1}$ |
| EA029 | 43 | 71.0 | 52.6 | 18.4 | $6.0 \times 10^{-1}$ | $2.3 \times 10^{0}$ | $8.1 \times 10^{-1}$ |
| EA030 | 49 | 70.3 | 52.1 | 18.2 | $6.9 \times 10^{-1}$ | $2.7 \times 10^{0}$ | $9.3 \times 10^{-1}$ |
| EA031 | 50 | 69.0 | 51.1 | 17.9 | $7.2 \times 10^{-1}$ | $2.8 \times 10^{0}$ | $9.7 \times 10^{-1}$ |
| EA032 | 47 | 70.9 | 52.5 | 18.4 | $6.6 \times 10^{-1}$ | $2.5 \times 10^{0}$ | $8.9 \times 10^{-1}$ |
| EA033 | 29 | 0.011 | 0.008 | 0.003 | $2.7 \times 10^{3}$ | $1.0 \times 10^{4}$ | $3.6 \times 10^{3}$ |
| EA034 | 32 | 693.9 | 514.0 | 179.9 | $4.5 \times 10^{-2}$ | $1.8 \times 10^{-1}$ | $6.1 \times 10^{-2}$ |
| EA035 | 0.22 | 71.1 | 52.7 | 18.4 | $3.1 \times 10^{-3}$ | $1.2 \times 10^{-2}$ | $4.2 \times 10^{-3}$ |
| EA036 | 39 | 0.009 | 0.007 | 0.002 | $4.1 \times 10^{3}$ | $1.6 \times 10^{4}$ | $5.5 \times 10^{3}$ |
| EA037 | 44 | 693.9 | 514.0 | 179.9 | $6.3 \times 10^{-2}$ | $2.4 \times 10^{-1}$ | $8.5 \times 10^{-2}$ |
| EA038 | 0.30 | 69.5 | 51.5 | 18.0 | $4.2 \times 10^{-3}$ | $1.6 \times 10^{-2}$ | $5.7 \times 10^{-3}$ |
| EA039 | 461 | 71.4 | 52.9 | 18.5 | $6.4 \times 10^{0}$ | $2.5 \times 10^{1}$ | $8.7 \times 10^{0}$ |
| EA040 | 273 | 73.3 | 54.3 | 19.0 | $3.7 \times 10^{0}$ | $1.4 \times 10^{1}$ | $5.0 \times 10^{0}$ |
| EA041 | 442 | 71.7 | 53.1 | 18.6 | $6.2 \times 10^{0}$ | $2.4 \times 10^{1}$ | $8.3 \times 10^{0}$ |
| EA042 | 40 | 71.0 | 52.6 | 18.4 | $5.6 \times 10^{-1}$ | $2.2 \times 10^{0}$ | $7.6 \times 10^{-1}$ |
| EA043 | 41 | 69.7 | 51.6 | 18.1 | $5.9 \times 10^{-1}$ | $2.3 \times 10^{0}$ | $7.9 \times 10^{-1}$ |
| EA044 | 16 | 73.6 | 54.5 | 19.1 | $2.2 \times 10^{-1}$ | $8.4 \times 10^{-1}$ | $2.9 \times 10^{-1}$ |
| EA045 | 16 | 71.6 | 53.0 | 18.6 | $2.2 \times 10^{-1}$ | $8.6 \times 10^{-1}$ | $3.0 \times 10^{-1}$ |
| EA046 | 37 | 70.9 | 52.5 | 18.4 | $5.1 \times 10^{-1}$ | $2.0 \times 10^{0}$ | $7.0 \times 10^{-1}$ |
| EA047 | 14 | 69.5 | 51.5 | 18.0 | $2.0 \times 10^{-1}$ | $7.8 \times 10^{-1}$ | $2.7 \times 10^{-1}$ |
| EA048 | 43 | 71.4 | 52.9 | 18.5 | $6.0 \times 10^{-1}$ | $2.3 \times 10^{0}$ | $8.0 \times 10^{-1}$ |
| EB09 | 1389240 | 0.010 | 0.007 | 0.003 | $1.4 \times 10^{8}$ | $4.6 \times 10^{8}$ | $2.0 \times 10^{8}$ |
| EB10 | 0.085 | 756.4 | 534.8 | 221.6 | $1.1 \times 10^{-4}$ | $3.8 \times 10^{-4}$ | $1.6 \times 10^{-4}$ |
| EB11 | 1076460 | 0.010 | 0.007 | 0.003 | $1.1 \times 10^{8}$ | $3.6 \times 10^{8}$ | $1.5 \times 10^{8}$ |
| EB12 | 0.075 | 756.4 | 534.8 | 221.6 | $9.9 \times 10^{-5}$ | $3.4 \times 10^{-4}$ | $1.4 \times 10^{-4}$ |
| EB13 | 2188220 | 0.011 | 0.008 | 0.003 | $2.0 \times 10^{8}$ | $7.3 \times 10^{8}$ | $2.7 \times 10^{8}$ |
| EB14 | 0.095 | 760.0 | 534.8 | 225.2 | $1.3 \times 10^{-4}$ | $4.2 \times 10^{-4}$ | $1.8 \times 10^{-4}$ |
| EB15 | 0.085 | 756.4 | 534.8 | 221.6 | $1.1 \times 10^{-4}$ | $3.8 \times 10^{-4}$ | $1.6 \times 10^{-4}$ |
| EB16 | 0.095 | 760.0 | 534.8 | 225.2 | $1.3 \times 10^{-4}$ | $4.2 \times 10^{-4}$ | $1.8 \times 10^{-4}$ |

TABLE 25

| | Organic solvent | | | | Container | |
|---|---|---|---|---|---|---|
| Table 1a6 | Type | ClogP | HSP distance to eicosane | HSP distance to eicosene | Filter | Type | Void volume [% by volume] |
| Example FA01 | IPA | 0.07 | 17.5 | 15.8 | UPE | EP-SUS | 10 |
| Example FA02 | IPA | 0.07 | 17.5 | 15.8 | PTFE | EP-SUS | 10 |
| Example FA03 | IPA | 0.07 | 17.5 | 15.8 | Nylon | EP-SUS | 10 |

TABLE 25-continued

| Table 1a6 | Organic solvent | | | | Container | | |
|---|---|---|---|---|---|---|---|
| | Type | ClogP | HSP distance to eicosane | HSP distance to eicosene | Filter | Type | Void volume [% by volume] |
| Example FA04 | IPA | 0.07 | 17.5 | 15.8 | UPE | EP-SUS | 10 |
| Example FA05 | IPA | 0.07 | 17.5 | 15.8 | UPE | EP-SUS | 10 |
| Example FA06 | IPA | 0.07 | 17.5 | 15.8 | UPE | EP-SUS | 10 |
| Example FA07 | IPA | 0.07 | 17.5 | 15.8 | Nylon | EP-SUS | 10 |
| Example FA08 | IPA | 0.07 | 17.5 | 15.8 | Nylon | EP-SUS | 10 |
| Example FA09 | IPA | 0.07 | 17.5 | 15.8 | Nylon | EP-SUS | 10 |
| Example FA10 | IPA | 0.07 | 17.5 | 15.8 | UPE | EP-SUS | 10 |
| Example FA11 | IPA | 0.07 | 17.5 | 15.8 | PTFE | EP-SUS | 10 |
| Example FA12 | IPA | 0.07 | 17.5 | 15.8 | Nylon | EP-SUS | 10 |
| Comparative Example FB01 | IPA | 0.07 | 17.5 | 15.8 | UPE | EP-SUS | 10 |
| Comparative Example FB02 | IPA | 0.07 | 17.5 | 15.8 | UPE | EP-SUS | 10 |
| Comparative Example FB03 | IPA | 0.07 | 17.5 | 15.8 | PTFE | EP-SUS | 10 |
| Comparative Example FB04 | IPA | 0.07 | 17.5 | 15.8 | PTFE | EP-SUS | 10 |
| Comparative Example FB05 | IPA | 0.07 | 17.5 | 15.8 | Nylon | EP-SUS | 10 |
| Comparative Example FB06 | IPA | 0.07 | 17.5 | 15.8 | Nylon | EP-SUS | 10 |
| Comparative Example FB07 | IPA | 0.07 | 17.5 | 15.8 | UPE | EP-SUS | 10 |
| Comparative Example FB08 | IPA | 0.07 | 17.5 | 15.8 | Nylon | EP-SUS | 10 |

TABLE 26

| Table 1b6 | Alkane content (mass ppt) (upper column carbon number/lower column ClogP) | | | | | | | | | | | Maximum contained |
|---|---|---|---|---|---|---|---|---|---|---|---|---|
| Chemical liquid | 6<br>3.9 | 10<br>6.0 | 12<br>7.0 | 14<br>8.1 | 16<br>9.2 | 18<br>10.2 | 20<br>11.3 | 30<br>16.6 | 40<br>21.9 | 50<br>27.1 | Total amount | carbon number |
| FA01 | 0 | 0 | 0 | 1 | 1 | 2 | 2 | 1 | 0 | 0 | 14 | 22 |
| FA02 | 0 | 0 | 0 | 0 | 1 | 1 | 2 | 1 | 0 | 0 | 12 | 22 |
| FA03 | 0 | 0 | 1 | 1 | 2 | 1 | 0 | 0 | 0 | 0 | 5 | 16 |
| FA04 | 0 | 0 | 0 | 1 | 1 | 2 | 2 | I | 0 | 0 | 14 | 20 |
| FA05 | 0 | 0 | 0 | 1 | 1 | 2 | 2 | 1 | 0 | 0 | 14 | 20 |
| FA06 | 0 | 0 | 0 | 0 | 0.01 | 0.02 | 0.02 | 0.01 | 0 | 0 | 0.13 | 20 |
| FA07 | 0 | 0 | 1 | I | 2 | 1 | 0 | 0 | 0 | 0 | 5 | 16 |
| FA08 | 0 | 0 | 0 | 1 | 2 | 1 | 0 | 0 | 0 | 0 | 4 | 16 |
| FA09 | 0 | 0 | 0 | 0 | 0.01 | 0.01 | 0 | 0 | 0 | 0 | 0.02 | 18 |
| FA10 | 0 | 0 | 5 | 10 | 25 | 43 | 40 | 20 | 5 | 0 | 308 | 18 |
| FA11 | 0 | 0 | 2 | 6 | 14 | 26 | 18 | 10 | 2 | 0 | 153 | 18 |
| FA12 | 0 | 0 | 5 | 10 | 15 | 10 | 0 | 0 | 0 | 0 | 40 | 16 |
| FB01 | 0 | 0 | 0 | 40 | 9700 | 82000 | 264000 | 92000 | 4100 | 60 | 1232450 | 22 |
| FB02 | 0 | 0 | 0 | 0 | 0 | 0.01 | 0.01 | 0.01 | 0 | 0 | 0.085 | 22 |
| FB03 | 0 | 0 | 0 | 58 | 890 | 69000 | 205000 | 82000 | 3900 | 10 | 1011980 | 22 |
| FB04 | 0 | 0 | 0 | 0 | 0 | 0 | 0.01 | 0.01 | 0 | 0 | 0.08 | 24 |
| FB05 | 0 | 0 | 190 | 2200 | 3900 | 1000 | 0 | 0 | 0 | 0 | 7290 | 16 |
| FB06 | 0 | 0 | 0 | 0 | 0.007 | 0.005 | 0 | 0 | 0 | 0 | 0.012 | 16 |
| FB07 | 0.07 | 0.07 | 0 | 0 | 0 | 0.01 | 0.01 | 0.01 | 0 | 0 | 0.085 | 20 |
| FB08 | 0.05 | 0.05 | 0 | 0 | 0.007 | 0.005 | 0 | 0 | 0 | 0 | 0.012 | 16 |

TABLE 27

| | Alkene content (mass ppt) | | | | | | | | |
|---|---|---|---|---|---|---|---|---|---|
| Table 1c6 | $C_kH_{2k}$ (upper column carbon number/lower column ClogP) | | | | | | | | |
| Chemical liquid | 6<br>3.4 | 10<br>5.5 | 12<br>6.6 | 20<br>10.8 | 30<br>16.1 | 40<br>21.4 | 50<br>26.7 | $C_nH_m$<br>(squalene) | Total amount |
| FA01 | 0 | 0 | 0 | 0 | 0 | 0 | 0 | 0 | 0 |
| FA02 | 0 | 0 | 0 | 0 | 0 | 0 | 0 | 0 | 0 |
| FA03 | 0 | 0 | 1 | 1 | 2 | 1 | 0 | 2 | 25 |
| FA04 | 0 | 0 | 0 | 0 | 0 | 0 | 0 | 0 | 0 |
| FA05 | 0 | 0 | 0 | 0 | 0 | 0 | 0 | 0 | 0 |
| FA06 | 0 | 0 | 0 | 0 | 0 | 0 | 0 | 0 | 0 |
| FA07 | 0 | 0 | 1 | 2 | 3 | 1 | 0 | 2 | 35 |
| FA08 | 0 | 0 | 1 | 2 | 2 | 2 | 0 | 2 | 35 |
| FA09 | 0 | 0 | 0.01 | 0.01 | 0.03 | 0.01 | 0 | 0.01 | 0.29 |
| FA10 | 0 | 0 | 0 | 0 | 0 | 0 | 0 | 0 | 0 |
| FA11 | 0 | 0 | 0 | 0 | 0 | 0 | 0 | 0 | 0 |
| FA12 | 0 | 0 | 5 | 16 | 23 | 22 | 12 | 22 | 370 |
| FB01 | 0 | 0 | 0 | 0 | 0 | 0 | 0 | 0 | 0 |
| FB02 | 0 | 0 | 0 | 0 | 0 | 0 | 0 | 0 | 0 |
| FB03 | 0 | 0 | 0 | 0 | 0 | 0 | 0 | 0 | 0 |
| FB04 | 0 | 0 | 0 | 0 | 0 | 0 | 0 | 0 | 0 |
| FB05 | 0 | 0 | 2000 | 89000 | 140000 | 60000 | 2000 | 90000 | 1545000 |
| FB06 | 0 | 0 | 0 | 0.005 | 0.006 | 0.004 | 0 | 0.006 | 0.081 |
| FB07 | 0 | 0 | 0 | 0 | 0 | 0 | 0 | 0 | 0 |
| FB08 | 0 | 0 | 0 | 0.005 | 0.006 | 0.004 | 0 | 0.005 | 0.08 |

TABLE 28

| | Organic component | Metal component | | | Ratio 1<br>Organic component/<br>Metal component | Ratio 2<br>Organic component/<br>Metal particles | Ratio 3<br>Organic component/<br>Metal ions |
|---|---|---|---|---|---|---|---|
| Table 1d6<br>Chemical liquid | total amount<br>(mass ppt) | Total<br>(mass ppt) | Metal ions<br>(mass ppt) | Metal particles<br>(mass ppt) | | | |
| FA01 | 14 | 71.0 | 52.6 | 18.4 | $2.0 \times 10^{-1}$ | $7.6 \times 10^{-1}$ | $2.7 \times 10^{-1}$ |
| FA02 | 12 | 72.9 | 54.0 | 18.9 | $1.6 \times 10^{-1}$ | $6.3 \times 10^{-1}$ | $2.2 \times 10^{-1}$ |
| FA03 | 30 | 71.3 | 52.8 | 18.5 | $4.1 \times 10^{-1}$ | $1.6 \times 10^{0}$ | $5.6 \times 10^{-1}$ |
| FA04 | 14 | 0.011 | 0.008 | 0.003 | $1.3 \times 10^{3}$ | $5.0 \times 10^{3}$ | $1.8 \times 10^{3}$ |
| FA05 | 14 | 680.4 | 504.0 | 176.4 | $2.1 \times 10^{-2}$ | $7.9 \times 10^{-2}$ | $2.8 \times 10^{-2}$ |
| FA06 | 0.13 | 71.7 | 53.1 | 18.6 | $1.8 \times 10^{-3}$ | $7.0 \times 10^{-3}$ | $2.4 \times 10^{-3}$ |
| FA07 | 40 | 0.011 | 0.008 | 0.003 | $3.7 \times 10^{3}$ | $1.4 \times 10^{4}$ | $4.9 \times 10^{3}$ |
| FA08 | 39 | 691.2 | 512.0 | 179.2 | $5.6 \times 10^{-2}$ | $2.1 \times 10^{-1}$ | $7.5 \times 10^{-2}$ |
| FA09 | 0.31 | 69.5 | 51.5 | 18.0 | $4.4 \times 10^{-3}$ | $1.7 \times 10^{-2}$ | $5.9 \times 10^{-3}$ |
| FA10 | 308 | 73.4 | 54.4 | 19.0 | $4.2 \times 10^{0}$ | $1.6 \times 10^{1}$ | $5.7 \times 10^{0}$ |
| FA11 | 153 | 71.4 | 52.9 | 18.5 | $2.1 \times 10^{0}$ | $8.3 \times 10^{0}$ | $2.9 \times 10^{0}$ |
| FA12 | 410 | 70.7 | 52.4 | 18.3 | $5.8 \times 10^{0}$ | $2.2 \times 10^{1}$ | $7.8 \times 10^{0}$ |
| FB01 | 1232450 | 0.010 | 0.007 | 0.003 | $1.2 \times 10^{8}$ | $4.1 \times 10^{8}$ | $1.8 \times 10^{8}$ |
| FB02 | 0.085 | 773.2 | 548.0 | 225.2 | $1.1 \times 10^{-4}$ | $3.8 \times 10^{-4}$ | $1.6 \times 10^{-4}$ |
| FB03 | 1011980 | 0.010 | 0.007 | 0.003 | $1.0 \times 10^{8}$ | $3.4 \times 10^{8}$ | $1.4 \times 10^{8}$ |
| FB04 | 0.075 | 769.6 | 548.0 | 221.6 | $9.7 \times 10^{-5}$ | $3.4 \times 10^{-4}$ | $1.4 \times 10^{-4}$ |
| FB05 | 1552290 | 0.010 | 0.007 | 0.003 | $1.6 \times 10^{8}$ | $5.2 \times 10^{8}$ | $2.2 \times 10^{8}$ |
| FB06 | 0.093 | 773.2 | 548.0 | 225.2 | $1.2 \times 10^{-4}$ | $4.1 \times 10^{-4}$ | $1.7 \times 10^{-4}$ |
| FB07 | 0.085 | 773.2 | 548.0 | 225.2 | $1.1 \times 10^{-4}$ | $3.8 \times 10^{-4}$ | $1.6 \times 10^{-4}$ |
| FB08 | 0.092 | 773.2 | 548.0 | 225.2 | $1.2 \times 10^{-4}$ | $4.1 \times 10^{-4}$ | $1.7 \times 10^{-4}$ |

TABLE 29

| | Organic solvent | | | | Container | |
|---|---|---|---|---|---|---|
| Table 1a7 | Type | ClogP | HSP distance to eicosane | HSP distance to eicosene | Filter | Type | Void volume [% by volume] |
| Example GA01 | MIBC | 1.53 | 12.8 | 11.1 | UPE | EP-SUS | 10 |
| Example GA02 | MIBC | 1.53 | 12.8 | 11.1 | PTFE | EP-SUS | 10 |
| Example GA03 | MIBC | 1.53 | 12.8 | 11.1 | Nylon | EP-SUS | 10 |
| Example GA04 | MIBC | 1.53 | 12.8 | 11.1 | UPE | EP-SUS | 10 |
| Example GA05 | MIBC | 1.53 | 12.8 | 11.1 | UPE | EP-SUS | 10 |

TABLE 29-continued

| Table 1a7 | Organic solvent | | | | Container | | |
|---|---|---|---|---|---|---|---|
| | Type | ClogP | HSP distance to eicosane | HSP distance to eicosene | Filter | Type | Void volume [% by volume] |
| Example GA06 | MIBC | 1.53 | 12.8 | 11.1 | UPE | EP-SUS | 10 |
| Example GA07 | MIBC | 1.53 | 12.8 | 11.1 | Nylon | EP-SUS | 10 |
| Example GA08 | MIBC | 1.53 | 12.8 | 11.1 | Nylon | EP-SUS | 10 |
| Example GA09 | MIBC | 1.53 | 12.8 | 11.1 | Nylon | EP-SUS | 10 |
| Example GA10 | MIBC | 1.53 | 12.8 | 11.1 | UPE | EP-SUS | 10 |
| Example GA11 | MIBC | 1.53 | 12.8 | 11.1 | PTFE | EP-SUS | 10 |
| Example GA12 | MIBC | 1.53 | 12.8 | 11.1 | Nylon | EP-SUS | 10 |
| Comparative Example GB01 | MIBC | 1.53 | 12.8 | 11.1 | UPE | EP-SUS | 10 |
| Comparative Example GB02 | MIBC | 1.53 | 12.8 | 11.1 | UPE | EP-SUS | 10 |
| Comparative Example GB03 | MIBC | 1.53 | 12.8 | 11.1 | PTFE | EP-SUS | 10 |
| Comparative Example GB04 | MIBC | 1.53 | 12.8 | 11.1 | PTFE | EP-SUS | 10 |
| Comparative Example GB05 | MIBC | 1.53 | 12.8 | 11.1 | Nylon | EP-SUS | 10 |
| Comparative Example GB06 | MIBC | 1.53 | 12.8 | 11.1 | Nylon | EP-SUS | 10 |
| Comparative Example GB07 | MIBC | 1.53 | 12.8 | 11.1 | UPE | EP-SUS | 10 |
| Comparative Example GB08 | MIBC | 1.53 | 12.8 | 11.1 | Nylon | EP-SUS | 10 |

TABLE 30

| Table 1b7 | Alkane content (mass ppt) (upper column carbon number/lower column ClogP) | | | | | | | | | | | Maximum contained |
|---|---|---|---|---|---|---|---|---|---|---|---|---|
| Chemical liquid | 6 3.9 | 10 6.0 | 12 7.0 | 14 8.1 | 16 9.2 | 18 10.2 | 20 11.3 | 30 16.6 | 40 21.9 | 50 27.1 | Total amount | carbon number |
| GA01 | 0 | 0 | 0 | 1 | 1 | 2 | 1 | 1 | 0 | 0 | 12 | 18 |
| GA02 | 0 | 0 | 0 | 0 | 1 | 1 | 2 | 1 | 0 | 0 | 12 | 22 |
| GA03 | 0 | 0 | 1 | 1 | 2 | 1 | 0 | 0 | 0 | 0 | 5 | 16 |
| GA04 | 0 | 0 | 0 | 1 | 1 | 2 | 2 | 1 | 0 | 0 | 14 | 20 |
| GA05 | 0 | 0 | 0 | 1 | 1 | 2 | 1 | 1 | 0 | 0 | 12 | 18 |
| GA06 | 0 | 0 | 0 | 0 | 0.01 | 0.02 | 0.02 | 0.01 | 0 | 0 | 0.13 | 20 |
| GA07 | 0 | 0 | 1 | 1 | 2 | 1 | 0 | 0 | 0 | 0 | 5 | 16 |
| GA08 | 0 | 0 | 0 | 1 | 2 | 1 | 0 | 0 | 0 | 0 | 4 | 16 |
| GA09 | 0 | 0 | 0 | 0 | 0.01 | 0.01 | 0 | 0 | 0 | 0 | 0.02 | 16 |
| GA10 | 0 | 0 | 5 | 10 | 22 | 40 | 35 | 12 | 5 | 0 | 250 | 18 |
| GA11 | 0 | 0 | 2 | 8 | 16 | 28 | 20 | 8 | 2 | 0 | 154 | 18 |
| GA12 | 0 | 0 | 5 | 10 | 15 | 10 | 0 | 0 | 0 | 0 | 40 | 16 |
| GB01 | 0 | 0 | 0 | 60 | 10500 | 84000 | 284000 | 82000 | 4200 | 70 | 1235810 | 22 |
| GB02 | 0 | 0 | 0 | 0 | 0 | 0.01 | 0.01 | 0.01 | 0 | 0 | 0.085 | 22 |
| GB03 | 0 | 0 | 0 | 48 | 820 | 72000 | 200000 | 82000 | 3500 | 10 | 1000400 | 24 |
| GB04 | 0 | 0 | 0 | 0 | 0 | 0 | 0.01 | 0.01 | 0 | 0 | 0.075 | 24 |
| GB05 | 0 | 0 | 220 | 2800 | 4700 | 800 | 0 | 0 | 0 | 0 | 8520 | 16 |
| GB06 | 0 | 0 | 0 | 0 | 0.007 | 0.005 | 0 | 0 | 0 | 0 | 0.012 | 16 |
| GB07 | 0.07 | 0.07 | 0 | 0 | 0 | 0.01 | 0.01 | 0 | 0 | 0.035 | 20 | |
| GB08 | 0.05 | 0.05 | 0 | 0 | 0.007 | 0.005 | 0 | 0 | 0 | 0 | 0.012 | 16 |

TABLE 31

| Table 1c7 | Alkene content (mass ppt) | | | | | | | | |
|---|---|---|---|---|---|---|---|---|---|
| | $C_kH_{2k}$ (upper column carbon number/lower column ClogP) | | | | | | | | |
| Chemical liquid | 6 3.4 | 10 5.5 | 12 6.6 | 20 10.8 | 30 16.1 | 40 21.4 | 50 26.7 | $C_nH_m$ (squalene) | Total amount |
| GA01 | 0 | 0 | 0 | 0 | 0 | 0 | 0 | 0 | 0 |
| GA02 | 0 | 0 | 0 | 0 | 0 | 0 | 0 | 0 | 0 |
| GA03 | 0 | 0 | 0 | 1 | 2 | 1 | 0 | 2 | 22 |

TABLE 31-continued

| | Alkene content (mass ppt) | | | | | | | | |
|---|---|---|---|---|---|---|---|---|---|
| Table 1c7 | $C_kH_{2k}$ (upper column carbon number/lower column ClogP) | | | | | | | | |
| Chemical liquid | 6 3.4 | 10 5.5 | 12 6.6 | 20 10.8 | 30 16.1 | 40 21.4 | 50 26.7 | $C_nH_m$ (squalene) | Total amount |
| GA04 | 0 | 0 | 0 | 0 | 0 | 0 | 0 | 0 | 0 |
| GA05 | 0 | 0 | 0 | 0 | 0 | 0 | 0 | 0 | 0 |
| GA06 | 0 | 0 | 0 | 0 | 0 | 0 | 0 | 0 | 0 |
| GA07 | 0 | 0 | 1 | 2 | 3 | 1 | 0 | 2 | 35 |
| GA08 | 0 | 0 | 1 | 2 | 2 | 2 | 0 | 2 | 35 |
| GA09 | 0 | 0 | 0.01 | 0.01 | 0.03 | 0.01 | 0 | 0.01 | 0.29 |
| GA10 | 0 | 0 | 0 | 0 | 0 | 0 | 0 | 0 | 0 |
| GA11 | 0 | 0 | 0 | 0 | 0 | 0 | 0 | 0 | 0 |
| GA12 | 0 | 0 | 5 | 16 | 23 | 22 | 12 | 22 | 370 |
| GB01 | 0 | 0 | 0 | 0 | 0 | 0 | 0 | 0 | 0 |
| GB02 | 0 | 0 | 0 | 0 | 0 | 0 | 0 | 0 | 0 |
| GB03 | 0 | 0 | 0 | 0 | 0 | 0 | 0 | 0 | 0 |
| GB04 | 0 | 0 | 0 | 0 | 0 | 0 | 0 | 0 | 0 |
| GB05 | 0 | 0 | 2200 | 89000 | 185000 | 70200 | 650 | 120000 | 1848130 |
| GB06 | 0 | 0 | 0 | 0.005 | 0.007 | 0.004 | 0 | 0.006 | 0.086 |
| GB07 | 0 | 0 | 0 | 0 | 0 | 0 | 0 | 0 | 0 |
| GB08 | 0 | 0 | 0 | 0.005 | 0.006 | 0.004 | 0 | 0.006 | 0.081 |

TABLE 32

| Table 1d7 Chemical liquid | Organic component total amount (mass ppt) | Metal component Total (mass ppt) | Metal ions (mass ppt) | Metal particles (mass ppt) | Ratio 1 Organic component/ Metal component | Ratio 2 Organic component/ Metal particles | Ratio 3 Organic component/ Metal ions |
|---|---|---|---|---|---|---|---|
| GA01 | 12 | 71.6 | 53.0 | 18.6 | $1.6 \times 10^{-1}$ | $6.2 \times 10^{-1}$ | $2.2 \times 10^{-1}$ |
| GA02 | 12 | 73.4 | 54.4 | 19.0 | $1.6 \times 10^{-1}$ | $6.3 \times 10^{-1}$ | $2.2 \times 10^{-1}$ |
| GA03 | 27 | 71.8 | 53.2 | 18.6 | $3.8 \times 10^{-1}$ | $1.5 \times 10^{0}$ | $5.1 \times 10^{-1}$ |
| GA04 | 14 | 0.011 | 0.008 | 0.003 | $1.3 \times 10^{3}$ | $5.0 \times 10^{3}$ | $1.8 \times 10^{3}$ |
| GA05 | 12 | 677.7 | 502.0 | 175.7 | $1.7 \times 10^{-2}$ | $6.5 \times 10^{-2}$ | $2.3 \times 10^{-2}$ |
| GA06 | 0.13 | 71.4 | 52.9 | 18.5 | $1.8 \times 10^{-3}$ | $7.0 \times 10^{-3}$ | $2.5 \times 10^{-3}$ |
| GA07 | 40 | 0.011 | 0.008 | 0.003 | $3.7 \times 10^{3}$ | $1.4 \times 10^{4}$ | $4.9 \times 10^{3}$ |
| GA08 | 39 | 677.7 | 502.0 | 175.7 | $5.7 \times 10^{-2}$ | $2.2 \times 10^{-1}$ | $7.7 \times 10^{-2}$ |
| GA09 | 0.31 | 69.8 | 51.7 | 18.1 | $4.4 \times 10^{-3}$ | $1.7 \times 10^{-2}$ | $5.9 \times 10^{-3}$ |
| GA10 | 250 | 73.7 | 54.6 | 19.1 | $3.4 \times 10^{0}$ | $1.3 \times 10^{1}$ | $4.6 \times 10^{0}$ |
| GA11 | 154 | 71.7 | 53.1 | 18.6 | $2.1 \times 10^{0}$ | $8.3 \times 10^{0}$ | $2.9 \times 10^{0}$ |
| GA12 | 410 | 71.0 | 52.6 | 18.4 | $5.8 \times 10^{0}$ | $2.2 \times 10^{1}$ | $7.8 \times 10^{0}$ |
| GB01 | 1235810 | 0.010 | 0.007 | 0.003 | $1.2 \times 10^{8}$ | $4.1 \times 10^{8}$ | $1.8 \times 10^{8}$ |
| GB02 | 0.085 | 767.4 | 542.2 | 225.2 | $1.1 \times 10^{-4}$ | $3.8 \times 10^{-4}$ | $1.6 \times 10^{-4}$ |
| GB03 | 1000400 | 0.010 | 0.007 | 0.003 | $1.0 \times 10^{8}$ | $3.3 \times 10^{8}$ | $1.4 \times 10^{8}$ |
| GB04 | 0.075 | 754.2 | 532.6 | 221.6 | $9.9 \times 10^{-5}$ | $3.4 \times 10^{-4}$ | $1.4 \times 10^{-4}$ |
| GB05 | 1856650 | 0.010 | 0.007 | 0.003 | $1.9 \times 10^{8}$ | $6.2 \times 10^{8}$ | $2.7 \times 10^{8}$ |
| GB06 | 0.098 | 767.4 | 542.2 | 225.2 | $1.3 \times 10^{-4}$ | $4.4 \times 10^{-4}$ | $1.8 \times 10^{-4}$ |
| GB07 | 0.035 | 767.4 | 542.2 | 225.2 | $4.6 \times 10^{-5}$ | $1.6 \times 10^{-4}$ | $6.5 \times 10^{-5}$ |
| GB08 | 0.093 | 767.4 | 542.2 | 225.2 | $1.2 \times 10^{-4}$ | $4.1 \times 10^{-4}$ | $1.7 \times 10^{-4}$ |

TABLE 33

| | Organic solvent | | | | Container | | |
|---|---|---|---|---|---|---|---|
| Table 1a8 | Type | ClogP | HSP distance to eicosene | HSP distance to eicosene | Filter | Type | Void volume [% by volume] |
| Example HA01 | nBA | 0.76 | 7.3 | 5.6 | UPE | EP-SUS | 10 |
| Example HA02 | nBA | 0.76 | 7.3 | 5.6 | PTFE | EP-SUS | 10 |
| Example HA03 | nBA | 0.76 | 7.3 | 5.6 | Nylon | EP-SUS | 10 |
| Example HA04 | nBA | 0.76 | 7.3 | 5.6 | UPE | EP-SUS | 10 |
| Example HA05 | nBA | 0.76 | 7.3 | 5.6 | UPE | EP-SUS | 10 |
| Example HA06 | nBA | 0.76 | 7.3 | 5.6 | UPE | EP-SUS | 10 |
| Example HA07 | nBA | 0.76 | 7.3 | 5.6 | Nylon | EP-SUS | 10 |
| Example HA08 | nBA | 0.76 | 7.3 | 5.6 | Nylon | EP-SUS | 10 |

TABLE 33-continued

| Table 1a8 | Organic solvent | | | | Container | | |
|---|---|---|---|---|---|---|---|
| | Type | ClogP | HSP distance to eicosene | HSP distance to eicosene | Filter | Type | Void volume [% by volume] |
| Example HA09 | nBA | 0.76 | 7.3 | 5.6 | Nylon | EP-SUS | 10 |
| Example HA10 | nBA | 0.76 | 7.3 | 5.6 | UPE | EP-SUS | 10 |
| Example HA11 | nBA | 0.76 | 7.3 | 5.6 | PTFE | EP-SUS | 10 |
| Example HA12 | nBA | 0.76 | 7.3 | 5.6 | Nylon | EP-SUS | 10 |
| Example HA13 | nBA | 0.76 | 7.3 | 5.6 | UPE | EP-SUS | 30 |
| Example HA14 | nBA | 0.76 | 7.3 | 5.6 | UPE | EP-SUS | 50 |
| Example HA15 | nBA | 0.76 | 7.3 | 5.6 | UPE | PFA | 10 |
| Example HA16 | nBA | 0.76 | 7.3 | 5.6 | PTFE | PFA | 10 |
| Example HA17 | nBA | 0.76 | 7.3 | 5.6 | Nylon | PFA | 10 |
| Comparative Example HB01 | nBA | 0.76 | 7.3 | 5.6 | UPE | EP-SUS | 10 |
| Comparative Example HB02 | nBA | 0.76 | 7.3 | 5.6 | UPE | EP-SUS | 10 |
| Comparative Example HB03 | nBA | 0.76 | 7.3 | 5.6 | PTFE | EP-SUS | 10 |
| Comparative Example HB04 | nBA | 0.76 | 7.3 | 5.6 | PTFE | EP-SUS | 10 |
| Comparative Example HB05 | nBA | 0.76 | 7.3 | 5.6 | Nylon | EP-SUS | 10 |
| Comparative Example HB06 | nBA | 0.76 | 7.3 | 5.6 | Nylon | EP-SUS | 10 |
| Comparative Example HB07 | nBA | 0.76 | 7.3 | 5.6 | UPE | EP-SUS | 10 |
| Comparative Example HB08 | nBA | 0.76 | 7.3 | 5.6 | Nylon | EP-SUS | 10 |

TABLE 34

| Table 1b8 | Alkane content (mass ppt) (upper column carbon number/lower column ClogP) | | | | | | | | | | | Maximum contained |
|---|---|---|---|---|---|---|---|---|---|---|---|---|
| Chemical liquid | 6 3.9 | 10 6.0 | 12 7.0 | 14 8.1 | 16 9.2 | 18 10.2 | 20 11.3 | 30 16.6 | 40 21.9 | 50 27.1 | Total amount | carbon number |
| HA01 | 0 | 0 | 0 | 1 | 1 | 2 | 3 | 4 | 1 | 0 | 37 | 28 |
| HA02 | 0 | 0 | 0 | 1 | 1 | 2 | 2 | 1 | 0 | 0 | 14 | 20 |
| HA03 | 0 | 0 | 1 | 1 | 2 | 1 | 0 | 0 | 0 | 0 | 5 | 16 |
| HA04 | 0 | 0 | 0 | 1 | 1 | 2 | 3 | 3 | 1 | 0 | 32 | 24 |
| HA05 | 0 | 0 | 0 | 1 | 1 | 2 | 4 | 3 | 1 | 0 | 34 | 22 |
| HA06 | 0 | 0 | 0 | 0 | 0.01 | 0.01 | 0.02 | 0.02 | 0.01 | 0 | 0.22 | 24 |
| HA07 | 0 | 0 | 1 | 1 | 2 | 1 | 0 | 0 | 0 | 0 | 5 | 16 |
| HA08 | 0 | 0 | 1 | 1 | 2 | 1 | 0 | 0 | 0 | 0 | 5 | 16 |
| HA09 | 0 | 0 | 0 | 0 | 0.01 | 0.01 | 0 | 0 | 0 | 0 | 0.02 | 18 |
| HA10 | 0 | 0 | 5 | 10 | 25 | 40 | 48 | 42 | 12 | 2 | 477 | 22 |
| HA11 | 0 | 0 | 3 | 8 | 12 | 20 | 32 | 29 | 5 | 0 | 293 | 22 |
| HA12 | 0 | 0 | 5 | 10 | 25 | 15 | 0 | 0 | 0 | 0 | 55 | 16 |
| HA13 | 0 | 0 | 0 | 1 | 1 | 2 | 3 | 4 | 1 | 0 | 37 | 28 |
| HA14 | 0 | 0 | 0 | 1 | 2 | 3 | 3 | 4 | 1 | 0 | 39 | 28 |
| HA15 | 0 | 0 | 0 | 1 | 1 | 2 | 2 | 4 | 1 | 0 | 34 | 28 |
| HA16 | 0 | 0 | 0 | 1 | 1 | 2 | 1 | 1 | 0 | 0 | 12 | 18 |
| HA17 | 0 | 0 | 1 | 1 | 2 | 1 | 0 | 0 | 0 | 0 | 5 | 16 |
| HB01 | 0 | 0 | 0 | 120 | 14000 | 96000 | 310000 | 89000 | 4200 | 110 | 1351510 | 22 |
| HB02 | 0 | 0 | 0 | 0 | 0 | 0.01 | 0.01 | 0.01 | 0 | 0 | 0.085 | 22 |
| HB03 | 0 | 0 | 0 | 89 | 980 | 82500 | 240000 | 98000 | 4100 | 120 | 1194490 | 24 |
| HB04 | 0 | 0 | 0 | 0 | 0 | 0 | 0.01 | 0.01 | 0 | 0 | 0.075 | 24 |
| HB05 | 0 | 0 | 250 | 3100 | 5100 | 1000 | 0 | 0 | 0 | 0 | 9450 | 16 |
| HB06 | 0 | 0 | 0 | 0 | 0.007 | 0.005 | 0 | 0 | 0 | 0 | 0.012 | 16 |
| HB07 | 0.07 | 0.07 | 0 | 0 | 0 | 0.01 | 0.01 | 0.01 | 0 | 0 | 0.085 | 22 |
| HB08 | 0.05 | 0.05 | 0 | 0 | 0.007 | 0.005 | 0 | 0 | 0 | 0 | 0.012 | 16 |

TABLE 35

| | Alkene content (mass ppt) | | | | | | | | |
|---|---|---|---|---|---|---|---|---|---|
| Table 1c8 | $C_kH_{2k}$ (upper column carbon number/lower column ClogP) | | | | | | | | |
| Chemical liquid | 6 3.4 | 10 5.5 | 12 6.6 | 20 10.8 | 30 16.1 | 40 21.4 | 50 26.7 | $C_nH_m$ (squalene) | Total amount |
| HA01 | 0 | 0 | 0 | 0 | 0 | 0 | 0 | 0 | 0 |
| HA02 | 0 | 0 | 0 | 0 | 0 | 0 | 0 | 0 | 0 |
| HA03 | 0 | 0 | 1 | 3 | 3 | 2 | 0 | 2 | 43 |
| HA04 | 0 | 0 | 0 | 0 | 0 | 0 | 0 | 0 | 0 |
| HA05 | 0 | 0 | 0 | 0 | 0 | 0 | 0 | 0 | 0 |
| HA06 | 0 | 0 | 0 | 0 | 0 | 0 | 0 | 0 | 0 |
| HA07 | 0 | 0 | 1 | 2 | 3 | 1 | 0 | 2 | 33 |
| HA08 | 0 | 0 | 1 | 2 | 3 | 2 | 0 | 2 | 38 |
| HA09 | 0 | 0 | 0.01 | 0.01 | 0.03 | 0.01 | 0 | 0.01 | 0.28 |
| HA10 | 0 | 0 | 0 | 0 | 0 | 0 | 0 | 0 | 0 |
| HA11 | 0 | 0 | 0 | 0 | 0 | 0 | 0 | 0 | 0 |
| HA12 | 0 | 0 | 5 | 18 | 24 | 28 | 12 | 22 | 415 |
| HA13 | 0 | 0 | 0 | 0 | 0 | 0 | 0 | 0 | 0 |
| HA14 | 0 | 0 | 0 | 0 | 0 | 0 | 0 | 0 | 0 |
| HA15 | 0 | 0 | 0 | 0 | 0 | 0 | 0 | 0 | 0 |
| HA16 | 0 | 0 | 0 | 0 | 0 | 0 | 0 | 0 | 0 |
| HA17 | 0 | 0 | 1 | 2 | 3 | 2 | 0 | 2 | 38 |
| HB01 | 0 | 0 | 0 | 0 | 0 | 0 | 0 | 0 | 0 |
| HB02 | 0 | 0 | 0 | 0 | 0 | 0 | 0 | 0 | 0 |
| HB03 | 0 | 0 | 0 | 0 | 0 | 0 | 0 | 0 | 0 |
| HB04 | 0 | 0 | 0 | 0 | 0 | 0 | 0 | 0 | 0 |
| HB05 | 0 | 0 | 3800 | 13500 | 222000 | 80500 | 500 | 135000 | 1725750 |
| HB06 | 0 | 0 | 0 | 0.005 | 0.006 | 0.004 | 0 | 0.006 | 0.081 |
| HB07 | 0 | 0 | 0 | 0 | 0 | 0 | 0 | 0 | 0 |
| HB08 | 0 | 0 | 0 | 0.005 | 0.006 | 0.004 | 0 | 0.006 | 0.081 |

TABLE 36

| Table 1d8 Chemical liquid | Organic component total amount (mass ppt) | Metal component Total (mass ppt) | Metal ions (mass ppt) | Metal particles (mass ppt) | Ratio 1 Organic component/ Metal component | Ratio 2 Organic component/ Metal particles | Ratio 3 Organic component/ Metal ions |
|---|---|---|---|---|---|---|---|
| HA01 | 37 | 71.8 | 53.2 | 18.6 | $5.1 \times 10^{-1}$ | $2.0 \times 10^{0}$ | $6.9 \times 10^{-1}$ |
| HA02 | 14 | 73.2 | 54.2 | 19.0 | $1.9 \times 10^{-1}$ | $7.4 \times 10^{-1}$ | $2.6 \times 10^{-1}$ |
| HA03 | 48 | 69.9 | 51.8 | 18.1 | $6.8 \times 10^{-1}$ | $2.6 \times 10^{0}$ | $9.2 \times 10^{-1}$ |
| HA04 | 32 | 0.009 | 0.007 | 0.002 | $3.3 \times 10^{3}$ | $1.3 \times 10^{4}$ | $4.5 \times 10^{3}$ |
| HA05 | 34 | 691.5 | 512.2 | 179.3 | $4.9 \times 10^{-2}$ | $1.9 \times 10^{-1}$ | $6.6 \times 10^{-2}$ |
| HA06 | 0.22 | 72.6 | 53.8 | 18.8 | $3.0 \times 10^{-3}$ | $1.2 \times 10^{-2}$ | $4.1 \times 10^{-3}$ |
| HA07 | 38 | 0.011 | 0.008 | 0.003 | $3.5 \times 10^{3}$ | $1.3 \times 10^{4}$ | $4.7 \times 10^{3}$ |
| HA08 | 43 | 691.5 | 512.2 | 179.3 | $6.1 \times 10^{-2}$ | $2.4 \times 10^{-1}$ | $8.3 \times 10^{-2}$ |
| HA09 | 0.30 | 71.7 | 53.1 | 18.6 | $4.1 \times 10^{-3}$ | $1.6 \times 10^{-2}$ | $5.6 \times 10^{-3}$ |
| HA10 | 477 | 73.6 | 54.5 | 19.1 | $6.5 \times 10^{0}$ | $2.5 \times 10^{1}$ | $8.8 \times 10^{0}$ |
| HA11 | 293 | 72.0 | 53.3 | 18.7 | $4.1 \times 10^{0}$ | $1.6 \times 10^{1}$ | $5.5 \times 10^{0}$ |
| HA12 | 470 | 71.3 | 52.8 | 18.5 | $6.6 \times 10^{0}$ | $2.5 \times 10^{1}$ | $8.9 \times 10^{0}$ |
| HA13 | 37 | 69.8 | 51.7 | 18.1 | $5.2 \times 10^{-1}$ | $2.0 \times 10^{0}$ | $7.1 \times 10^{-1}$ |
| HA14 | 39 | 71.7 | 53.1 | 18.6 | $5.4 \times 10^{-1}$ | $2.1 \times 10^{0}$ | $7.3 \times 10^{-1}$ |
| HA15 | 34 | 73.6 | 54.5 | 19.1 | $4.6 \times 10^{-1}$ | $1.8 \times 10^{0}$ | $6.2 \times 10^{-1}$ |
| HA16 | 12 | 72.0 | 53.3 | 18.7 | $1.6 \times 10^{-1}$ | $6.2 \times 10^{-1}$ | $2.2 \times 10^{-1}$ |
| HA17 | 43 | 71.3 | 52.8 | 18.5 | $6.0 \times 10^{-1}$ | $2.3 \times 10^{0}$ | $8.0 \times 10^{-1}$ |
| HB01 | 1351510 | 0.010 | 0.007 | 0.003 | $1.4 \times 10^{8}$ | $4.5 \times 10^{8}$ | $1.9 \times 10^{8}$ |
| HB02 | 0.085 | 795.8 | 574.2 | 221.6 | $1.1 \times 10^{-4}$ | $3.8 \times 10^{-4}$ | $1.5 \times 10^{-4}$ |
| HB03 | 1194490 | 0.011 | 0.008 | 0.003 | $1.1 \times 10^{8}$ | $4.0 \times 10^{8}$ | $1.5 \times 10^{8}$ |
| HB04 | 0.075 | 795.8 | 574.2 | 221.6 | $9.4 \times 10^{-5}$ | $3.4 \times 10^{-4}$ | $1.3 \times 10^{-4}$ |
| HB05 | 1735200 | 0.010 | 0.007 | 0.003 | $1.7 \times 10^{8}$ | $5.8 \times 10^{8}$ | $2.5 \times 10^{8}$ |
| HB06 | 0.093 | 799.4 | 574.2 | 225.2 | $1.2 \times 10^{-4}$ | $4.1 \times 10^{-4}$ | $1.6 \times 10^{-4}$ |
| HB07 | 0.085 | 795.8 | 574.2 | 221.6 | $1.1 \times 10^{-4}$ | $3.8 \times 10^{-4}$ | $1.5 \times 10^{-4}$ |
| HB08 | 0.093 | 799.4 | 574.2 | 225.2 | $1.2 \times 10^{-4}$ | $4.1 \times 10^{-4}$ | $1.6 \times 10^{-4}$ |

TABLE 37

| Table 1a9 | Organic solvent | | | | Filter | Container | |
|---|---|---|---|---|---|---|---|
| | Type | ClogP | HSP distance to eicosene | HSP distance to eicosene | | Type | Void volume [% by volume] |
| Example IA01 | PGMEA | 0.26 | 11.3 | 9.5 | UPE | EP-SUS | 10 |
| Example IA02 | PGMEA | 0.26 | 11.3 | 9.5 | PTFE | EP-SUS | 10 |
| Example IA03 | PGMEA | 0.26 | 11.3 | 9.5 | Nylon | EP-SUS | 10 |
| Example IA04 | PGMEA | 0.26 | 11.3 | 9.5 | Nylon-grafted UPE | EP-SUS | 10 |
| Example IA05 | PGMEA | 0.26 | 11.3 | 9.5 | Polyimide | EP-SUS | 10 |
| Example IA06 | PGMEA | 0.26 | 11.3 | 9.5 | Polyamide | EP-SUS | 10 |
| Example IA07 | PGMEA | 0.26 | 11.3 | 9.5 | UPE | EP-SUS | 10 |
| Example IA08 | PGMEA | 0.26 | 11.3 | 9.5 | UPE | EP-SUS | 10 |
| Example IA09 | PGMEA | 0.26 | 11.3 | 9.5 | UPE | EP-SUS | 10 |
| Example IA10 | PGMEA | 0.26 | 11.3 | 9.5 | Nylon | EP-SUS | 10 |
| Example IA11 | PGMEA | 0.26 | 11.3 | 9.5 | Nylon | EP-SUS | 10 |
| Example IA12 | PGMEA | 0.26 | 11.3 | 9.5 | Nylon | EP-SUS | 10 |
| Example IA13 | PGMEA | 0.26 | 11.3 | 9.5 | UPE | EP-SUS | 10 |
| Example IA14 | PGMEA | 0.26 | 11.3 | 9.5 | PTFE | EP-SUS | 10 |
| Example IA15 | PGMEA | 0.26 | 11.3 | 9.5 | Nylon | EP-SUS | 10 |
| Example IA16 | PGMEA | 0.26 | 11.3 | 9.5 | UPE | EP-SUS | 30 |
| Example IA17 | PGMEA | 0.26 | 11.3 | 9.5 | UPE | PFA | 10 |
| Comparative Example IB01 | PGMEA | 0.26 | 11.3 | 9.5 | UPE | EP-SUS | 10 |
| Comparative Example IB02 | PGMEA | 0.26 | 11.3 | 9.5 | UPE | EP-SUS | 10 |
| Comparative Example IB03 | PGMEA | 0.26 | 11.3 | 9.5 | PTFE | EP-SUS | 10 |
| Comparative Example IB04 | PGMEA | 0.26 | 11.3 | 9.5 | PTFE | EP-SUS | 10 |
| Comparative Example IB05 | PGMEA | 0.26 | 11.3 | 9.5 | Nylon | EP-SUS | 10 |
| Comparative Example IB06 | PGMEA | 0.26 | 11.3 | 9.5 | Nylon | EP-SUS | 10 |

TABLE 38

| Table 1b9 Chemical liquid | Alkane content (mass ppt) (upper column carbon number/lower column ClogP) | | | | | | | | | | | Maximum contained carbon number |
|---|---|---|---|---|---|---|---|---|---|---|---|---|
| | 6 3.9 | 10 6.0 | 12 7.0 | 14 8.1 | 16 9.2 | 18 10.2 | 20 11.3 | 30 16.6 | 40 21.9 | 50 27.1 | Total amount | |
| IA01 | 0 | 0 | 0 | 1 | 1 | 2 | 3 | 2 | 1 | 0 | 27 | 22 |
| IA02 | 0 | 0 | 0 | 1 | 1 | 2 | 1 | 1 | 0 | 0 | 12 | 18 |
| IA03 | 0 | 0 | 1 | 1 | 2 | 1 | 0 | 0 | 0 | 0 | 5 | 16 |
| IA04 | 0 | 0 | 1 | 1 | 2 | 3 | 1 | 1 | 0 | 0 | 15 | 18 |
| IA05 | 0 | 0 | 1 | 1 | 2 | 2 | 1 | 1 | 0 | 0 | 14 | 18 |
| IA06 | 0 | 0 | 1 | 2 | 3 | 2 | 2 | 1 | 0 | 0 | 18 | 16 |
| IA07 | 0 | 0 | 0 | 1 | 1 | 2 | 2 | 2 | 1 | 0 | 24 | 22 |
| IA08 | 0 | 0 | 0 | 1 | 1 | 2 | 3 | 2 | 1 | 0 | 27 | 24 |
| IA09 | 0 | 0 | 0 | 0 | 0.01 | 0.01 | 0.02 | 0.02 | 0.01 | 0 | 0.22 | 22 |
| IA10 | 0 | 0 | 1 | 1 | 2 | 1 | 0 | 0 | 0 | 0 | 5 | 16 |
| IA11 | 0 | 0 | 1 | 1 | 2 | 1 | 0 | 0 | 0 | 0 | 5 | 16 |
| IA12 | 0 | 0 | 0 | 0 | 0.01 | 0.01 | 0 | 0 | 0 | 0 | 0.02 | 18 |
| IA13 | 0 | 0 | 5 | 10 | 20 | 35 | 37 | 35 | 12 | 5 | 415 | 20 |
| IA14 | 0 | 0 | 3 | 8 | 12 | 18 | 30 | 25 | 5 | 0 | 266 | 22 |
| IA15 | 0 | 0 | 5 | 10 | 25 | 15 | 0 | 0 | 0 | 0 | 55 | 16 |
| IA16 | 0 | 0 | 0 | 1 | 2 | 3 | 3 | 2 | 1 | 0 | 29 | 18 |
| IA17 | 0 | 0 | 0 | 1 | 1 | 2 | 2 | 1 | 0 | 0 | 14 | 20 |
| IB01 | 0 | 0 | 0 | 100 | 13000 | 94000 | 270000 | 91000 | 4100 | 150 | 1258130 | 22 |
| IB02 | 0 | 0 | 0 | 0 | 0 | 0.01 | 0.01 | 0.01 | 0 | 0 | 0.085 | 22 |
| IB03 | 0 | 0 | 0 | 64 | 920 | 81500 | 220000 | 93000 | 4000 | 150 | 1118010 | 22 |
| IB04 | 0 | 0 | 0 | 0 | 0 | 0 | 0.01 | 0.01 | 0 | 0 | 0.075 | 22 |
| IB05 | 0 | 0 | 243 | 3100 | 4700 | 970 | 0 | 0 | 0 | 0 | 9013 | 16 |
| IB06 | 0 | 0 | 0 | 0 | 0.007 | 0.005 | 0 | 0 | 0 | 0 | 0.012 | 16 |

TABLE 39

| Table 1c9 Chemical liquid | Alkene content (mass ppt) $C_kH_{2k}$ (upper column carbon number/lower column ClogP) | | | | | | | $C_nH_m$ (squalene) | Total amount |
|---|---|---|---|---|---|---|---|---|---|
| | 6 / 3.4 | 10 / 5.5 | 12 / 6.6 | 20 / 10.8 | 30 / 16.1 | 40 / 21.4 | 50 / 26.7 | | |
| IA01 | 0 | 0 | 0 | 0 | 0 | 0 | 0 | 0 | 0 |
| IA02 | 0 | 0 | 0 | 0 | 0 | 0 | 0 | 0 | 0 |
| IA03 | 0 | 0 | 1 | 2 | 3 | 2 | 0 | 2 | 38 |
| IA04 | 0 | 0 | 1 | 2 | 3 | 1 | 0 | 2 | 33 |
| IA05 | 0 | 0 | 1 | 3 | 2 | 1 | 0 | 2 | 33 |
| IA06 | 0 | 0 | 1 | 2 | 2 | 1 | 0 | 2 | 28 |
| IA07 | 0 | 0 | 0 | 0 | 0 | 0 | 0 | 0 | 0 |
| IA08 | 0 | 0 | 0 | 0 | 0 | 0 | 0 | 0 | 0 |
| IA09 | 0 | 0 | 0 | 0 | 0 | 0 | 0 | 0 | 0 |
| IA10 | 0 | 0 | 1 | 2 | 3 | 1 | 0 | 2 | 33 |
| IA11 | 0 | 0 | 1 | 2 | 3 | 2 | 0 | 2 | 38 |
| IA12 | 0 | 0 | 0.01 | 0.01 | 0.03 | 0.01 | 0 | 0.01 | 0.28 |
| IA13 | 0 | 0 | 0 | 0 | 0 | 0 | 0 | 0 | 0 |
| IA14 | 0 | 0 | 0 | 0 | 0 | 0 | 0 | 0 | 0 |
| IA15 | 0 | 0 | 5 | 16 | 26 | 22 | 12 | 22 | 385 |
| IA16 | 0 | 0 | 0 | 0 | 0 | 0 | 0 | 0 | 0 |
| IA17 | 0 | 0 | 0 | 0 | 0 | 0 | 0 | 0 | 0 |
| IB01 | 0 | 0 | 0 | 0 | 0 | 0 | 0 | 0 | 0 |
| IB02 | 0 | 0 | 0 | 0 | 0 | 0 | 0 | 0 | 0 |
| IB03 | 0 | 0 | 0 | 0 | 0 | 0 | 0 | 0 | 0 |
| IB04 | 0 | 0 | 0 | 0 | 0 | 0 | 0 | 0 | 0 |
| IB05 | 0 | 0 | 2900 | 120000 | 210000 | 85500 | 550 | 125000 | 2211130 |
| IB06 | 0 | 0 | 0 | 0.005 | 0.006 | 0.004 | 0 | 0.006 | 0.081 |

TABLE 40

| Table 1d9 Chemical liquid | Organic component total amount (mass ppt) | Metal component Total (mass ppt) | Metal ions (mass ppt) | Metal particles (mass ppt) | Ratio 1 Organic component/ Metal component | Ratio 2 Organic component/ Metal particles | Ratio 3 Organic component/ Metal ions |
|---|---|---|---|---|---|---|---|
| IA01 | 27 | 71.7 | 53.1 | 18.6 | $3.7 \times 10^{-1}$ | $1.4 \times 10^{0}$ | $5.0 \times 10^{-1}$ |
| IA02 | 12 | 70.3 | 52.1 | 18.2 | $1.6 \times 10^{-1}$ | $6.3 \times 10^{-1}$ | $2.2 \times 10^{-1}$ |
| IA03 | 43 | 72.0 | 53.3 | 18.7 | $5.9 \times 10^{-1}$ | $2.3 \times 10^{0}$ | $8.0 \times 10^{-1}$ |
| IA04 | 48 | 74.1 | 54.9 | 19.2 | $6.3 \times 10^{-1}$ | $2.4 \times 10^{0}$ | $8.6 \times 10^{-1}$ |
| IA05 | 47 | 74.5 | 55.2 | 19.3 | $6.2 \times 10^{-1}$ | $2.4 \times 10^{0}$ | $8.3 \times 10^{-1}$ |
| IA06 | 46 | 73.0 | 54.1 | 18.9 | $6.2 \times 10^{-1}$ | $2.4 \times 10^{0}$ | $8.4 \times 10^{-1}$ |
| IA07 | 24 | 0.416 | 0.308 | 0.108 | $5.8 \times 10^{-1}$ | $2.2 \times 10^{2}$ | $7.8 \times 10^{1}$ |
| IA08 | 27 | 678.1 | 502.3 | 175.8 | $3.9 \times 10^{-2}$ | $1.5 \times 10^{-1}$ | $5.3 \times 10^{-2}$ |
| IA09 | 0.22 | 71.3 | 52.8 | 18.5 | $3.1 \times 10^{-3}$ | $1.2 \times 10^{-2}$ | $4.2 \times 10^{-3}$ |
| IA10 | 38 | 0.416 | 0.308 | 0.108 | $9.0 \times 10^{-1}$ | $3.5 \times 10^{2}$ | $1.2 \times 10^{2}$ |
| IA11 | 43 | 677.8 | 502.1 | 175.7 | $6.3 \times 10^{-2}$ | $2.4 \times 10^{-1}$ | $8.5 \times 10^{-2}$ |
| IA12 | 0.30 | 71.8 | 53.2 | 18.6 | $4.1 \times 10^{-3}$ | $1.6 \times 10^{-2}$ | $5.5 \times 10^{-3}$ |
| IA13 | 415 | 70.5 | 52.2 | 18.3 | $5.9 \times 10^{0}$ | $2.3 \times 10^{1}$ | $8.0 \times 10^{0}$ |
| IA14 | 266 | 72.4 | 53.6 | 18.8 | $3.7 \times 10^{0}$ | $1.4 \times 10^{1}$ | $5.0 \times 10^{0}$ |
| IA15 | 440 | 74.0 | 54.8 | 19.2 | $5.9 \times 10^{0}$ | $2.3 \times 10^{1}$ | $8.0 \times 10^{0}$ |
| IA16 | 29 | 72.2 | 53.5 | 18.7 | $3.9 \times 10^{-1}$ | $1.5 \times 10^{0}$ | $5.3 \times 10^{-1}$ |
| IA17 | 14 | 74.0 | 54.8 | 19.2 | $1.9 \times 10^{-1}$ | $7.3 \times 10^{-1}$ | $2.6 \times 10^{-1}$ |
| IB01 | 1258130 | 0.310 | 0.307 | 0.003 | $4.1 \times 10^{6}$ | $4.2 \times 10^{8}$ | $4.1 \times 10^{6}$ |
| IB02 | 0.085 | 754.5 | 532.9 | 221.6 | $1.1 \times 10^{-4}$ | $3.8 \times 10^{-4}$ | $1.6 \times 10^{-4}$ |
| IB03 | 1118010 | 0.379 | 0.281 | 0.10 | $3.0 \times 10^{6}$ | $1.1 \times 10^{7}$ | $4.0 \times 10^{6}$ |
| IB04 | 0.075 | 754.3 | 532.7 | 221.6 | $9.9 \times 10^{-5}$ | $3.4 \times 10^{-4}$ | $1.4 \times 10^{-4}$ |
| IB05 | 2220143 | 0.011 | 0.008 | 0.003 | $2.0 \times 10^{8}$ | $7.4 \times 10^{8}$ | $2.8 \times 10^{8}$ |
| IB06 | 0.093 | 767.4 | 542.2 | 225.2 | $1.2 \times 10^{-4}$ | $4.1 \times 10^{-4}$ | $1.7 \times 10^{-4}$ |

TABLE 41

| Table 1a10 | Organic solvent | | | | Filter | Container | |
|---|---|---|---|---|---|---|---|
| | Type | ClogP | HSP distance to eicosane | HSP distance to eicosene | | Type | Void volume [% by volume] |
| Example JA01 | MIBC | 1.53 | 12.8 | 11.1 | UPE | EP-SUS | 10 |
| Example JA02 | MIBC | 1.53 | 12.8 | 11.1 | PTFE | EP-SUS | 10 |
| Example JA03 | MIBC | 1.53 | 12.8 | 11.1 | Nylon | EP-SUS | 10 |
| Example JA04 | MIBC | 1.53 | 12.8 | 11.1 | UPE | EP-SUS | 10 |
| Example JA05 | MIBC | 1.53 | 12.8 | 11.1 | UPE | EP-SUS | 10 |
| Example JA06 | MIBC | 1.53 | 12.8 | 11.1 | UPE | EP-SUS | 10 |
| Example JA07 | MIBC | 1.53 | 12.8 | 11.1 | Nylon | EP-SUS | 10 |
| Example JA08 | MIBC | 1.53 | 12.8 | 11.1 | Nylon | EP-SUS | 10 |
| Example JA09 | MIBC | 1.53 | 12.8 | 11.1 | Nylon | EP-SUS | 10 |
| Example JA10 | MIBC | 1.53 | 12.8 | 11.1 | UPE | EP-SUS | 10 |
| Example JA11 | MIBC | 1.53 | 12.8 | 11.1 | PTFE | EP-SUS | 10 |
| Example JA12 | MIBC | 1.53 | 12.8 | 11.1 | Nylon | EP-SUS | 10 |
| Comparative Example JB01 | MIBC | 1.53 | 12.8 | 11.1 | UPE | EP-SUS | 10 |
| Comparative Example JB02 | MIBC | 1.53 | 12.8 | 11.1 | UPE | EP-SUS | 10 |
| Comparative Example JB03 | MIBC | 1.53 | 12.8 | 11.1 | PTFE | EP-SUS | 10 |
| Comparative Example JB04 | MIBC | 1.53 | 12.8 | 11.1 | PTFE | EP-SUS | 10 |
| Comparative Example JB05 | MIBC | 1.53 | 12.8 | 11.1 | Nylon | EP-SUS | 10 |
| Comparative Example JB06 | MIBC | 1.53 | 12.8 | 11.1 | Nylon | EP-SUS | 10 |

TABLE 42

| Table 1b10 | Alkane content (mass ppt) (upper column carbon number/lower column ClogP) | | | | | | | | | | | Maximum contained |
|---|---|---|---|---|---|---|---|---|---|---|---|---|
| Chemical liquid | 6 3.9 | 10 6.0 | 12 7.0 | 14 8.1 | 16 9.2 | 18 10.2 | 20 11.3 | 30 16.6 | 40 21.9 | 50 27.1 | Total amount | carbon number |
| JA01 | 0 | 0 | 0 | 1 | 1 | 2 | 1 | 1 | 0 | 0 | 12 | 18 |
| JA02 | 0 | 0 | 0 | 0 | 1 | 1 | 2 | 1 | 0 | 0 | 12 | 22 |
| JA03 | 0 | 0 | 1 | 1 | 2 | 1 | 0 | 0 | 0 | 0 | 5 | 16 |
| JA04 | 0 | 0 | 0 | 1 | 1 | 2 | 2 | 1 | 0 | 0 | 14 | 22 |
| JA05 | 0 | 0 | 0 | 1 | 1 | 2 | 1 | 1 | 0 | 0 | 12 | 18 |
| JA06 | 0 | 0 | 0 | 0 | 0.01 | 0.02 | 0.02 | 0.01 | 0 | 0 | 0.13 | 20 |
| JA07 | 0 | 0 | 1 | 1 | 2 | 1 | 0 | 0 | 0 | 0 | 5 | 16 |
| JA08 | 0 | 0 | 0 | 1 | 2 | 1 | 0 | 0 | 0 | 0 | 4 | 16 |
| JA09 | 0 | 0 | 0 | 0 | 0.01 | 0.01 | 0 | 0 | 0 | 0 | 0.02 | 18 |
| JA10 | 0 | 0 | 5 | 10 | 23 | 42 | 33 | 11 | 4 | 0 | 238 | 18 |
| JA11 | 0 | 0 | 2 | 8 | 16 | 32 | 20 | 8 | 1 | 0 | 153 | 18 |
| JA12 | 0 | 0 | 5 | 10 | 15 | 8 | 0 | 0 | 0 | 0 | 38 | 16 |
| JB01 | 0 | 0 | 0 | 68 | 12000 | 89000 | 290000 | 92000 | 4200 | 70 | 1307310 | 22 |
| JB02 | 0 | 0 | 0 | 0 | 0 | 0.01 | 0.01 | 0.01 | 0 | 0 | 0.085 | 22 |
| JB03 | 0 | 0 | 0 | 47 | 820 | 71000 | 200000 | 83000 | 3600 | 10 | 1004900 | 22 |
| JB04 | 0 | 0 | 0 | 0 | 0 | 0 | 0.01 | 0.01 | 0 | 0 | 0.075 | 24 |
| JB05 | 0 | 0 | 220 | 2800 | 4500 | 800 | 0 | 0 | 0 | 0 | 8320 | 16 |
| JB06 | 0 | 0 | 0 | 0 | 0.007 | 0.005 | 0 | 0 | 0 | 0 | 0.012 | 16 |

TABLE 43

| Table 1c10 | Alkene content (mass ppt) | | | | | | | | |
|---|---|---|---|---|---|---|---|---|---|
| | $C_kH_{2k}$ (upper column carbon number/lower column ClogP) | | | | | | | | |
| Chemical liquid | 6 3.4 | 10 5.5 | 12 6.6 | 20 10.8 | 30 16.1 | 40 21.4 | 50 26.7 | $C_nH_m$ (squalene) | Total amount |
| JA01 | 0 | 0 | 0 | 0 | 0 | 0 | 0 | 0 | 0 |
| JA02 | 0 | 0 | 0 | 0 | 0 | 0 | 0 | 0 | 0 |
| JA03 | 0 | 0 | 0 | 1 | 2 | 1 | 0 | 2 | 22 |

TABLE 43-continued

| Table | Alkene content (mass ppt) | | | | | | | | |
|---|---|---|---|---|---|---|---|---|---|
| 1c10 | $C_kH_{2k}$ (upper column carbon number/lower column ClogP) | | | | | | | | |
| Chemical liquid | 6<br>3.4 | 10<br>5.5 | 12<br>6.6 | 20<br>10.8 | 30<br>16.1 | 40<br>21.4 | 50<br>26.7 | $C_nH_m$ (squalene) | Total amount |
| JA04 | 0 | 0 | 0 | 0 | 0 | 0 | 0 | 0 | 0 |
| JA05 | 0 | 0 | 0 | 0 | 0 | 0 | 0 | 0 | 0 |
| JA06 | 0 | 0 | 0 | 0 | 0 | 0 | 0 | 0 | 0 |
| JA07 | 0 | 0 | 1 | 2 | 3 | 1 | 0 | 2 | 35 |
| JA08 | 0 | 0 | 1 | 2 | 2 | 2 | 0 | 2 | 35 |
| JA09 | 0 | 0 | 0.01 | 0.01 | 0.03 | 0.01 | 0 | 0.01 | 0.29 |
| JA10 | 0 | 0 | 0 | 0 | 0 | 0 | 0 | 0 | 0 |
| JA11 | 0 | 0 | 0 | 0 | 0 | 0 | 0 | 0 | 0 |
| JA12 | 0 | 0 | 5 | 16 | 23 | 22 | 12 | 22 | 370 |
| JB01 | 0 | 0 | 0 | 0 | 0 | 0 | 0 | 0 | 0 |
| JB02 | 0 | 0 | 0 | 0 | 0 | 0 | 0 | 0 | 0 |
| JB03 | 0 | 0 | 0 | 0 | 0 | 0 | 0 | 0 | 0 |
| JB04 | 0 | 0 | 0 | 0 | 0 | 0 | 0 | 0 | 0 |
| JB05 | 0 | 0 | 2200 | 89000 | 180000 | 69000 | 7000 | 120000 | 1833000 |
| JB06 | 0 | 0 | 0 | 0.005 | 0.006 | 0.004 | 0 | 0.006 | 0.081 |

TABLE 44

| Table 1d10 Chemical liquid | Organic component total amount (mass ppt) | Metal component Total (mass ppt) | Metal ions (mass ppt) | Metal particles (mass ppt) | Ratio 1 Organic component/ Metal component | Ratio 2 Organic component/ Metal particles | Ratio 3 Organic component/ Metal ions |
|---|---|---|---|---|---|---|---|
| JA01 | 12 | 71.3 | 52.8 | 18.5 | $1.6 \times 10^{-1}$ | $6.2 \times 10^{-1}$ | $2.2 \times 10^{-1}$ |
| JA02 | 12 | 73.2 | 54.2 | 19.0 | $1.6 \times 10^{-1}$ | $6.3 \times 10^{-1}$ | $2.2 \times 10^{-1}$ |
| JA03 | 27 | 71.6 | 53.0 | 18.6 | $3.8 \times 10^{-1}$ | $1.5 \times 10^{0}$ | $5.1 \times 10^{-1}$ |
| JA04 | 14 | 0.008 | 0.006 | 0.002 | $1.7 \times 10^{3}$ | $6.7 \times 10^{3}$ | $2.3 \times 10^{3}$ |
| JA05 | 12 | 677.4 | 501.8 | 175.6 | $1.7 \times 10^{-2}$ | $6.5 \times 10^{-2}$ | $2.3 \times 10^{-2}$ |
| JA06 | 0.13 | 71.1 | 52.7 | 18.4 | $1.8 \times 10^{-3}$ | $7.0 \times 10^{-3}$ | $2.5 \times 10^{-3}$ |
| JA07 | 40 | 0.009 | 0.007 | 0.002 | $4.2 \times 10^{3}$ | $1.6 \times 10^{4}$ | $5.6 \times 10^{3}$ |
| JA08 | 39 | 677.4 | 501.8 | 175.6 | $5.7 \times 10^{-2}$ | $2.2 \times 10^{-1}$ | $7.7 \times 10^{-2}$ |
| JA09 | 0.31 | 69.5 | 51.5 | 18.0 | $4.4 \times 10^{-3}$ | $1.7 \times 10^{-2}$ | $5.9 \times 10^{-3}$ |
| JA10 | 238 | 73.4 | 54.4 | 19.0 | $3.2 \times 10^{0}$ | $1.2 \times 10^{1}$ | $4.4 \times 10^{0}$ |
| JA11 | 153 | 71.4 | 52.9 | 18.5 | $2.1 \times 10^{0}$ | $8.3 \times 10^{0}$ | $2.9 \times 10^{0}$ |
| JA12 | 408 | 70.7 | 52.4 | 18.3 | $5.8 \times 10^{0}$ | $2.2 \times 10^{1}$ | $7.8 \times 10^{0}$ |
| JB01 | 1307310 | 0.010 | 0.007 | 0.003 | $1.3 \times 10^{8}$ | $4.4 \times 10^{9}$ | $1.9 \times 10^{8}$ |
| JB02 | 0.085 | 767.2 | 542.0 | 225.2 | $1.1 \times 10^{-4}$ | $3.8 \times 10^{-4}$ | $1.6 \times 10^{-4}$ |
| JB03 | 1004900 | 0.011 | 0.008 | 0.003 | $9.1 \times 10^{7}$ | $3.3 \times 10^{8}$ | $1.3 \times 10^{8}$ |
| JB04 | 0.075 | 754.0 | 532.4 | 221.6 | $9.9 \times 10^{-3}$ | $3.4 \times 10^{-4}$ | $1.4 \times 10^{-1}$ |
| JB05 | 1841320 | 0.011 | 0.008 | 0.003 | $1.7 \times 10^{8}$ | $6.1 \times 10^{8}$ | $2.3 \times 10^{8}$ |
| JB06 | 0.093 | 767.2 | 542.0 | 225.2 | $1.2 \times 10^{-4}$ | $4.1 \times 10^{-4}$ | $1.7 \times 10^{-1}$ |

TABLE 45

| Table 1a11 | Organic solvent | | | | Container | | Void volume [% by volume] |
|---|---|---|---|---|---|---|---|
| | Type | ClogP | HSP distance to eicosane | HSP distance to eicosene | Filter | Type | |
| Example KA01 | MeOH | 0.07 | 25.5 | 23.7 | UPE | EP-SUS | 10 |
| Example KA02 | MeOH | 0.07 | 25.5 | 23.7 | PTFE | EP-SUS | 10 |
| Example KA03 | MeOH | 0.07 | 25.5 | 23.7 | Nylon | EP-SUS | 10 |
| Comparative Example KB01 | MeOH | 0.07 | 25.5 | 23.7 | UPE | EP-SUS | 10 |
| Comparative Example KB02 | MeOH | 0.07 | 25.5 | 23.7 | PTFE | EP-SUS | 10 |
| Comparative Example KB03 | MeOH | 0.07 | 25.5 | 23.7 | Nylon | EP-SUS | 10 |

TABLE 46

| Table 1b11 | Alkane content (mass ppt) (upper column carbon number/lower column ClogP) | | | | | | | | | | Maximum contained |
|---|---|---|---|---|---|---|---|---|---|---|---|
| Chemical liquid | 6<br>3.9 | 10<br>6.0 | 12<br>7.0 | 14<br>8.1 | 16<br>9.2 | 18<br>10.2 | 20<br>11.3 | 30<br>16.6 | 40<br>21.9 | 50<br>27.1 | Total amount | carbon number |
| KA01 | 0 | 0 | 0 | 0.1 | 0.2 | 0.5 | 0.5 | 0.1 | 0 | 0 | 2.55 | 22 |
| KA02 | 0 | 0 | 0 | 0 | 0.1 | 0.2 | 0.4 | 0.2 | 0 | 0 | 2.3 | 22 |
| KA03 | 0 | 0 | 0.1 | 0.2 | 0.5 | 0.2 | 0 | 0 | 0 | 0 | 1 | 16 |
| KB01 | 0 | 0 | 0 | 0.01 | 0.02 | 0.03 | 0.01 | 0 | 0 | 0 | 0.085 | 18 |
| KB02 | 0 | 0 | 0 | 0 | 0.01 | 0.02 | 0.01 | 0 | 0 | 0 | 0.055 | 18 |
| KB03 | 0 | 0 | 0 | 0 | 0.01 | 0.01 | 0 | 0 | 0 | 0 | 0.02 | 18 |

TABLE 47

| | Alkene content (mass ppt) | | | | | | | | |
|---|---|---|---|---|---|---|---|---|---|
| Table 1c11 | $C_kH_{2k}$ (upper column carbon number/lower column ClogP) | | | | | | | | |
| Chemical liquid | 6<br>3.4 | 10<br>5.5 | 12<br>6.6 | 20<br>10.8 | 30<br>16.1 | 40<br>21.4 | 50<br>26.7 | $C_nH_m$ (squalene) | Total amount |
| KA01 | 0 | 0 | 0 | 0 | 0 | 0 | 0 | 0 | 0 |
| KA02 | 0 | 0 | 0 | 0 | 0 | 0 | 0 | 0 | 0 |
| KA03 | 0 | 0 | 0.1 | 0.2 | 0.6 | 0.1 | 0 | 0.2 | 4.95 |
| KB01 | 0 | 0 | 0 | 0 | 0 | 0 | 0 | 0 | 0 |
| KB02 | 0 | 0 | 0 | 0 | 0 | 0 | 0 | 0 | 0 |
| KB03 | 0 | 0 | 0 | 0 | 0.01 | 0 | 0 | 0.01 | 0.06 |

TABLE 48

| Table 1d11 Chemical liquid | Organic component total amount (mass ppt) | Metal component Total (mass ppt) | Metal ions (mass ppt) | Metal particles (mass ppt) | Ratio 1 Organic component/ Metal component | Ratio 2 Organic component/ Metal particles | Ratio 3 Organic component/ Metal ions |
|---|---|---|---|---|---|---|---|
| KA01 | 2.55 | 69.9 | 51.8 | 18.1 | $3.6 \times 10^{-2}$ | $1.4 \times 10^{-1}$ | $4.9 \times 10^{-2}$ |
| KA02 | 2.3 | 71.8 | 53.2 | 18.6 | $3.2 \times 10^{-2}$ | $1.2 \times 10^{-1}$ | $4.3 \times 10^{-2}$ |
| KA03 | 5.95 | 70.5 | 52.2 | 18.3 | $8.4 \times 10^{-2}$ | $3.3 \times 10^{-1}$ | $1.1 \times 10^{-1}$ |
| KB01 | 0.085 | 88.4 | 64.6 | 23.8 | $9.6 \times 10^{-4}$ | $3.6 \times 10^{-3}$ | $1.3 \times 10^{-3}$ |
| KB02 | 0.055 | 91.1 | 66.2 | 24.9 | $6.0 \times 10^{-4}$ | $2.2 \times 10^{-3}$ | $8.3 \times 10^{-4}$ |
| KB03 | 0.08 | 92.5 | 67.6 | 24.9 | $8.6 \times 10^{-4}$ | $3.2 \times 10^{-3}$ | $1.2 \times 10^{-3}$ |

TABLE 49

| | Organic solvent | | | | Container | | |
|---|---|---|---|---|---|---|---|
| Table 1a12 | Type | ClogP | HSP distance to eicosane | HSP distance to eicosene | Filter | Type | Void volume [% by volume] |
| Example LA01 | Undecane | 6.51 | 0.0 | 1.8 | UPE | EP-SUS | 10 |
| Example LA02 | Undecane | 6.51 | 0.0 | 1.8 | PTFE | EP-SUS | 10 |
| Example LA03 | Undecane | 6.51 | 0.0 | 1.8 | Nylon | EP-SUS | 10 |
| Comparative Example LB01 | Undecane | 6.51 | 0.0 | 1.8 | UPE | EP-SUS | 10 |
| Comparative Example LB02 | Undecane | 6.51 | 0.0 | 1.8 | PTFE | EP-SUS | 10 |
| Comparative Example LB03 | Undecane | 6.51 | 0.0 | 1.8 | Nylon | EP-SUS | 10 |

TABLE 50

| Table 1b12 | Alkane content (mass ppt) (upper column carbon number/lower column ClogP) | | | | | | | | | | | Maximum contained |
|---|---|---|---|---|---|---|---|---|---|---|---|---|
| Chemical liquid | 6 / 3.9 | 10 / 6.0 | 12 / 7.0 | 14 / 8.1 | 16 / 9.2 | 18 / 10.2 | 20 / 11.3 | 30 / 16.6 | 40 / 21.9 | 50 / 27.1 | Total amount | carbon number |
| LA01 | 0 | 0 | 0 | 4 | 4 | 8 | 12 | 16 | 4 | 0 | 146 | 28 |
| LA02 | 0 | 0 | 0 | 4 | 4 | 8 | 8 | 4 | 0 | 0 | 56 | 20 |
| LA03 | 0 | 0 | 4 | 4 | 8 | 4 | 0 | 0 | 0 | 0 | 20 | 16 |
| LB01 | 0 | 0 | 10 | 579 | 2850 | 98000 | 410000 | 82000 | 3500 | 10 | 1553970 | 22 |
| LB02 | 0 | 0 | 3 | 214 | 1710 | 91000 | 210000 | 79000 | 1050 | 2 | 1018180 | 22 |
| LB03 | 0 | 0 | 9 | 214 | 2890 | 288 | 0 | 0 | 0 | 0 | 3401 | 16 |

TABLE 51

| Table 1c12 | Alkene content (mass ppt) | | | | | | | | |
|---|---|---|---|---|---|---|---|---|---|
| | $C_kH_{2k}$ (upper column carbon number/lower column ClogP) | | | | | | | | |
| Chemical liquid | 6 / 3.4 | 10 / 5.5 | 12 / 6.6 | 20 / 10.8 | 30 / 16.1 | 40 / 21.4 | 50 / 26.7 | $C_nH_m$ (squalene) | Total amount |
| LA01 | 0 | 0 | 0 | 0 | 0 | 0 | 0 | 0 | 0 |
| LA02 | 0 | 0 | 0 | 0 | 0 | 0 | 0 | 0 | 0 |
| LA03 | 0 | 0 | 4 | 12 | 12 | 8 | 0 | 8 | 170 |
| LB01 | 0 | 0 | 0 | 0 | 0 | 0 | 0 | 0 | 0 |
| LB02 | 0 | 0 | 0 | 0 | 0 | 0 | 0 | 0 | 0 |
| LB03 | 0 | 0 | 1100 | 75000 | 120000 | 59000 | 4200 | 120000 | 1403250 |

TABLE 52

| Table 1d12 | Organic component total amount (mass ppt) | Metal component | | | Ratio 1 Organic component/ Metal component | Ratio 2 Organic component/ Metal particles | Ratio 3 Organic component/ Metal ions |
|---|---|---|---|---|---|---|---|
| Chemical liquid | | Total (mass ppt) | Metal ions (mass ppt) | Metal particles (mass ppt) | | | |
| LA01 | 146 | 71.8 | 53.2 | 18.6 | $2.0 \times 10^0$ | $7.8 \times 10^0$ | $2.7 \times 10^0$ |
| LA02 | 56 | 71.3 | 52.8 | 18.5 | $7.9 \times 10^{-1}$ | $3.0 \times 10^0$ | $1.1 \times 10^0$ |
| LA03 | 190 | 69.7 | 51.6 | 18.1 | $2.7 \times 10^0$ | $1.1 \times 10^1$ | $3.7 \times 10^0$ |
| LB01 | 1553970 | 71.0 | 52.6 | 18.4 | $2.2 \times 10^4$ | $8.4 \times 10^4$ | $3.0 \times 10^4$ |
| LB02 | 1018180 | 72.9 | 54.0 | 18.9 | $1.4 \times 10^4$ | $5.4 \times 10^4$ | $1.9 \times 10^4$ |
| LB03 | 1406651 | 71.3 | 52.8 | 18.5 | $2.0 \times 10^4$ | $7.6 \times 10^4$ | $2.7 \times 10^4$ |

TABLE 53

| Table 1a13 | Organic solvent | | | | Container | | |
|---|---|---|---|---|---|---|---|
| | Type | ClogP | HSP distance to eicosane | HSP distance to eicosene | Filter | Type | Void volume [% by volume] |
| Example MA01 | Butyl Butyrate | 2.83 | 6.4 | 4.6 | UPE | EP-SUS | 10 |
| Example MA02 | Butyl Butyrate | 2.83 | 6.4 | 4.6 | PTFE | EP-SUS | 10 |
| Example MA03 | Butyl Butyrate | 2.83 | 6.4 | 4.6 | Nylon | EP-SUS | 10 |
| Comparative Example MB01 | Butyl Butyrate | 2.83 | 6.4 | 4.6 | UPE | EP-SUS | 10 |
| Comparative Example MB02 | Butyl Butyrate | 2.83 | 6.4 | 4.6 | PTFE | EP-SUS | 10 |
| Comparative Example MB03 | Butyl Butyrate | 2.83 | 6.4 | 4.6 | Nylon | EP-SUS | 10 |

TABLE 54

| Table 1b13 | Alkane content (mass ppt) (upper column carbon number/lower column ClogP) | | | | | | | | | | Maximum contained |
|---|---|---|---|---|---|---|---|---|---|---|---|
| Chemical liquid | 6 / 3.9 | 10 / 6.0 | 12 / 7.0 | 14 / 8.1 | 16 / 9.2 | 18 / 10.2 | 20 / 11.3 | 30 / 16.6 | 40 / 21.9 | 50 / 27.1 | Total amount | carbon number |
| MA01 | 0 | 0 | 0 | 1 | 2 | 3 | 4 | 5 | 2 | 0 | 51 | 28 |
| MA02 | 0 | 0 | 0 | 1 | 1 | 2 | 3 | 2 | 1 | 0 | 27 | 20 |
| MA03 | 0 | 0 | 1 | 1 | 3 | 2 | 0 | 0 | 0 | 0 | 7 | 16 |
| MB01 | 0 | 0 | 5 | 220 | 4700 | 97000 | 360000 | 87000 | 4000 | 90 | 1351510 | 22 |
| MB02 | 0 | 0 | 2 | 120 | 1480 | 82500 | 220000 | 85000 | 3100 | 80 | 1074880 | 22 |
| MB03 | 0 | 0 | 60 | 4200 | 5700 | 1700 | 20 | 0 | 0 | 0 | 11710 | 16 |

TABLE 55

| Table 1c13 | Alkene content (mass ppt) $C_kH_{2k}$ (upper column carbon number/lower column ClogP) | | | | | | | | |
|---|---|---|---|---|---|---|---|---|---|
| Chemical liquid | 6 / 3.4 | 10 / 5.5 | 12 / 6.6 | 20 / 10.8 | 30 / 16.1 | 40 / 21.4 | 50 / 26.7 | $C_nH_m$ (squalene) | Total amount |
| MA01 | 0 | 0 | 0 | 0 | 0 | 0 | 0 | 0 | 0 |
| MA02 | 0 | 0 | 0 | 0 | 0 | 0 | 0 | 0 | 0 |
| MA03 | 0 | 0 | 3 | 7 | 8 | 7 | 0 | 8 | 118 |
| MB01 | 0 | 0 | 0 | 0 | 0 | 0 | 0 | 0 | 0 |
| MB02 | 0 | 0 | 0 | 0 | 0 | 0 | 0 | 0 | 0 |
| MB03 | 0 | 0 | 4200 | 14200 | 231000 | 82500 | 600 | 115000 | 1765500 |

TABLE 56

| Table 1d13 Chemical liquid | Organic component total amount (mass ppt) | Metal component | | | Ratio 1 Organic component/ Metal component | Ratio 2 Organic component/ Metal particles | Ratio 3 Organic component/ Metal ions |
|---|---|---|---|---|---|---|---|
| | | Total (mass ppt) | Metal ions (mass ppt) | Metal particles (mass ppt) | | | |
| MA01 | 51 | 72.1 | 53.4 | 18.7 | $7.1 \times 10^{-1}$ | $2.7 \times 10^{0}$ | $9.6 \times 10^{-1}$ |
| MA02 | 27 | 71.7 | 53.1 | 18.6 | $3.7 \times 10^{-1}$ | $1.4 \times 10^{0}$ | $5.0 \times 10^{-1}$ |
| MA03 | 125 | 69.4 | 51.4 | 18.0 | $1.8 \times 10^{0}$ | $6.9 \times 10^{0}$ | $2.4 \times 10^{0}$ |
| MB01 | 1351510 | 71.3 | 52.8 | 18.5 | $1.9 \times 10^{4}$ | $7.3 \times 10^{4}$ | $2.6 \times 10^{4}$ |
| MB02 | 1074880 | 73.7 | 54.6 | 19.1 | $1.5 \times 10^{4}$ | $5.6 \times 10^{4}$ | $2.0 \times 10^{4}$ |
| MB03 | 1777210 | 70.3 | 52.1 | 18.2 | $2.5 \times 10^{4}$ | $9.7 \times 10^{4}$ | $3.4 \times 10^{4}$ |

TABLE 57

| Table 1a14 | Organic solvent | | | | Container | | Void volume [% by volume] |
|---|---|---|---|---|---|---|---|
| | Type | ClogP | HSP distance to eicosane | HSP distance to eicosene | Filter | Type | |
| Example NA01 | Isoamyl Ether | 3.78 | 3.6 | 2.1 | UPE | EP-SUS | 10 |
| Example NA02 | Isoamyl Ether | 3.78 | 3.6 | 2.1 | PTFE | EP-SUS | 10 |
| Example NA03 | Isoamyl Ether | 3.78 | 3.6 | 2.1 | Nylon | EP-SUS | 10 |
| Comparative Example NB01 | Isoamyl Ether | 3.78 | 3.6 | 2.1 | UPE | EP-SUS | 10 |
| Comparative Example NB02 | Isoamyl Ether | 3.78 | 3.6 | 2.1 | PTFE | EP-SUS | 10 |
| Comparative Example NB03 | Isoamyl Ether | 3.78 | 3.6 | 2.1 | Nylon | EP-SUS | 10 |

TABLE 58

| Table 1b14 | Alkane content (mass ppt) (upper column carbon number/lower column ClogP) | | | | | | | | | | Maximum contained |
|---|---|---|---|---|---|---|---|---|---|---|---|
| Chemical liquid | 6<br>3.9 | 10<br>6.0 | 12<br>7.0 | 14<br>8.1 | 16<br>9.2 | 18<br>10.2 | 20<br>11.3 | 30<br>16.6 | 40<br>21.9 | 50<br>27.1 | Total amount | carbon number |
| NA01 | 0 | 0 | 0 | 3 | 3 | 6 | 8 | 10 | 3 | 0 | 96 | 28 |
| NA02 | 0 | 0 | 0 | 3 | 3 | 5 | 5 | 3 | 1 | 0 | 40 | 20 |
| NA03 | 0 | 0 | 3 | 3 | 5 | 3 | 0 | 0 | 0 | 0 | 13 | 16 |
| NB01 | 0 | 0 | 8 | 400 | 3800 | 97500 | 385000 | 84500 | 3750 | 50 | 1351510 | 22 |
| NB02 | 0 | 0 | 3 | 160 | 1600 | 86750 | 215000 | 82000 | 2050 | 40 | 1046400 | 22 |
| NB03 | 0 | 0 | 35 | 2200 | 4300 | 950 | 10 | 0 | 0 | 0 | 7510 | 16 |

TABLE 59

| | Alkene content (mass ppt) | | | | | | | | |
|---|---|---|---|---|---|---|---|---|---|
| Table 1c14 | $C_kH_{2k}$ (upper column carbon number/lower column ClogP) | | | | | | | | |
| Chemical liquid | 6<br>3.4 | 10<br>5.5 | 12<br>6.6 | 20<br>10.8 | 30<br>16.1 | 40<br>21.4 | 50<br>26.7 | $C_nH_m$ (squalene) | Total amount |
| NA01 | 0 | 0 | 0 | 0 | 0 | 0 | 0 | 0 | 0 |
| NA02 | 0 | o | 0 | 0 | 0 | 0 | 0 | 0 | 0 |
| NA03 | 0 | 0 | 3 | 7 | 8 | 7 | 0 | 8 | 118 |
| NB01 | 0 | 0 | 0 | 0 | 0 | 0 | 0 | 0 | 0 |
| NB02 | 0 | 0 | 0 | 0 | 0 | 0 | 0 | 0 | 0 |
| NB03 | 0 | 0 | 2600 | 44500 | 165500 | 70750 | 2400 | 118000 | 1416250 |

TABLE 60

| Table 1d13 Chemical liquid | Organic component total amount (mass ppt) | Metal component | | | Ratio 1 Organic component/ Metal component | Ratio 2 Organic component/ Metal particles | Ratio 3 Organic component/ Metal ions |
|---|---|---|---|---|---|---|---|
| | | Total (mass ppt) | Metal ions (mass ppt) | Metal particles (mass ppt) | | | |
| NA01 | 96 | 67.9 | 50.3 | 17.6 | $1.4 \times 10^0$ | $5.5 \times 10^0$ | $1.9 \times 10^0$ |
| NA02 | 40 | 69.1 | 51.2 | 17.9 | $5.8 \times 10^{-1}$ | $2.2 \times 10^0$ | $7.8 \times 10^{-1}$ |
| NA03 | 131 | 67.9 | 50.3 | 17.6 | $1.9 \times 10^0$ | $7.4 \times 10^0$ | $2.6 \times 10^0$ |
| NB01 | 1351510 | 67.8 | 50.2 | 17.6 | $2.0 \times 10^4$ | $7.7 \times 10^4$ | $2.7 \times 10^4$ |
| NB02 | 1046400 | 69.7 | 51.6 | 18.1 | $1.5 \times 10^4$ | $5.8 \times 10^4$ | $2.0 \times 10^4$ |
| NB03 | 1423760 | 69.4 | 51.4 | 18.0 | $2.1 \times 10^4$ | $7.9 \times 10^4$ | $2.8 \times 10^4$ |

TABLE 61

| Table 1a15 | Organic solvent | | | | Filter | Container | |
|---|---|---|---|---|---|---|---|
| | Type | ClogP | HSP distance to eicosane | HSP distance to eicosene | | Type | Void volume [% by volume] |
| Example OA01 | Ethylcyclohexane | 4.40 | 0.4 | 1.8 | UPE | EP-SUS | 10 |
| Example OA02 | Ethylcyclohexane | 4.40 | 0.4 | 1.8 | PTFE | EP-SUS | 10 |
| Example OA03 | Ethylcyclohexane | 4.40 | 0.4 | 1.8 | Nylon | EP-SUS | 10 |
| Comparative Example OB01 | Ethylcyclohexane | 4.40 | 0.4 | 1.8 | UPE | EP-SUS | 10 |
| Comparative Example OB02 | Ethylcyclohexane | 4.40 | 0.4 | 1.8 | PTFE | EP-SUS | 10 |
| Comparative Example OB03 | Ethylcyclohexane | 4.40 | 0.4 | 1.8 | Nylon | EP-SUS | 10 |

TABLE 62

| Table 1b15 | Alkane content (mass ppt) (upper column carbon number/lower column ClogP) | | | | | | | | | | | Maximum contained |
|---|---|---|---|---|---|---|---|---|---|---|---|---|
| Chemical liquid | 6 3.9 | 10 6.0 | 12 7.0 | 14 8.1 | 16 9.2 | 18 10.2 | 20 11.3 | 30 16.6 | 40 21.9 | 50 27.1 | Total amount | carbon number |
| OA01 | 0 | 0 | 0 | 3 | 3 | 6 | 10 | 13 | 3 | 0 | 117 | 28 |
| OA02 | 0 | 0 | 0 | 3 | 3 | 6 | 6 | 3 | 0 | 0 | 45 | 20 |
| OA03 | 0 | 0 | 3 | 3 | 6 | 3 | 0 | 0 | 0 | 0 | 16 | 16 |
| OB01 | 0 | 0 | 8 | 470 | 2280 | 98500 | 375000 | 75500 | 2800 | 8 | 1430290 | 22 |
| OB02 | 0 | 0 | 2 | 150 | 1380 | 86800 | 215000 | 75500 | 840 | 2 | 1007540 | 22 |
| OB03 | 0 | 0 | 7 | 170 | 2300 | 230 | 0 | 0 | 0 | 0 | 2707 | 16 |

TABLE 63

| Table 1c15 | Alkene content (mass ppt) $C_kH_{2k}$ (upper column carbon number/lower column ClogP) | | | | | | | | |
|---|---|---|---|---|---|---|---|---|---|
| Chemical liquid | 6 3.4 | 10 5.5 | 12 6.6 | 20 10.8 | 30 16.1 | 40 21.4 | 50 26.7 | $C_nH_m$ (squalene) | Total amount |
| OA01 | 0 | 0 | 0 | 0 | 0 | 0 | 0 | 0 | 0 |
| OA02 | 0 | 0 | 0 | 0 | 0 | 0 | 0 | 0 | 0 |
| OA03 | 0 | 0 | 3 | 8 | 8 | 7 | 0 | 6 | 123 |
| OB01 | 0 | 0 | 0 | 0 | 0 | 0 | 0 | 0 | 0 |
| OB02 | 0 | 0 | 0 | 0 | 0 | 0 | 0 | 0 | 0 |
| OB03 | 0 | 0 | 770 | 52500 | 114000 | 63500 | 2940 | 114000 | 1159280 |

TABLE 64

| Table 1d15 Chemical liquid | Organic component total amount (mass ppt) | Metal component | | | Ratio 1 Organic component/ Metal component | Ratio 2 Organic component/ Metal particles | Ratio 3 Organic component/ Metal ions |
|---|---|---|---|---|---|---|---|
| | | Total (mass ppt) | Metal ions (mass ppt) | Metal particles (mass ppt) | | | |
| OA01 | 117 | 75.3 | 55.8 | 19.5 | $1.6 \times 10^0$ | $6.0 \times 10^0$ | $2.1 \times 10^0$ |
| OA02 | 45 | 75.9 | 56.2 | 19.7 | $5.9 \times 10^{-1}$ | $2.3 \times 10^0$ | $8.0 \times 10^{-1}$ |
| OA03 | 139 | 77.2 | 57.2 | 20.0 | $1.8 \times 10^0$ | $6.9 \times 10^0$ | $2.4 \times 10^0$ |
| OB01 | 1430290 | 76.8 | 56.9 | 19.9 | $1.9 \times 10^4$ | $7.2 \times 10^4$ | $2.5 \times 10^4$ |
| OB02 | 1007540 | 78.0 | 57.8 | 20.2 | $1.3 \times 10^4$ | $5.0 \times 10^4$ | $1.7 \times 10^4$ |
| OB03 | 1161987 | 78.4 | 58.1 | 20.3 | $1.5 \times 10^4$ | $5.7 \times 10^4$ | $2.0 \times 10^4$ |

TABLE 65

| Table 1a16 | Organic solvent | | | | Container | | Void volume [% by volume] |
|---|---|---|---|---|---|---|---|
| | Type | ClogP | HSP distance to eicosane | HSP distance to eicosene | Filter | Type | |
| Example PA01 | iAA | 2.17 | 7.8 | 6.0 | UPE | EP-SUS | 10 |
| Example PA02 | iAA | 2.17 | 7.8 | 6.0 | PTFE | EP-SUS | 10 |
| Example PA03 | iAA | 2.17 | 7.8 | 6.0 | Nylon | EP-SUS | 10 |
| Example PA04 | iAA | 2.17 | 7.8 | 6.0 | UPE | EP-SUS | 10 |
| Example PA05 | iAA | 2.17 | 7.8 | 6.0 | UPE | EP-SUS | 10 |
| Example PA06 | iAA | 2.17 | 7.8 | 6.0 | UPE | EP-SUS | 10 |
| Example PA07 | iAA | 2.17 | 7.8 | 6.0 | Nylon | EP-SUS | 10 |
| Example PA08 | iAA | 2.17 | 7.8 | 6.0 | Nylon | EP-SUS | 10 |
| Example PA09 | iAA | 2.17 | 7.8 | 6.0 | Nylon | EP-SUS | 10 |
| Example PA10 | iAA | 2.17 | 7.8 | 6.0 | UPE | EP-SUS | 10 |
| Example PA11 | iAA | 2.17 | 7.8 | 6.0 | PTFE | EP-SUS | 10 |
| Example PA12 | iAA | 2.17 | 7.8 | 6.0 | Nylon | EP-SUS | 10 |
| Example PA13 | iAA | 2.17 | 7.8 | 6.0 | UPE | EP-SUS | 30 |
| Example PA14 | iAA | 2.17 | 7.8 | 6.0 | UPE | EP-SUS | 50 |
| Example PA15 | iAA | 2.17 | 7.8 | 6.0 | UPE | PFA | 10 |

TABLE 65-continued

| Table 1a16 | Organic solvent | | | | Container | | Void volume [% by volume] |
|---|---|---|---|---|---|---|---|
| | Type | ClogP | HSP distance to eicosane | HSP distance to eicosene | Filter | Type | |
| Example PA16 | iAA | 2.17 | 7.8 | 6.0 | PTFE | PFA | 10 |
| Example PA17 | iAA | 2.17 | 7.8 | 6.0 | Nylon | PFA | 10 |
| Comparative Example PB01 | iAA | 2.17 | 7.8 | 6.0 | UPE | EP-SUS | 10 |
| Comparative Example PB02 | iAA | 2.17 | 7.8 | 6.0 | UPE | EP-SUS | 10 |
| Comparative Example PB03 | iAA | 2.17 | 7.8 | 6.0 | PTFE | EP-SUS | 10 |
| Comparative Example PB04 | iAA | 2.17 | 7.8 | 6.0 | PTFE | EP-SUS | 10 |
| Comparative Example PB05 | iAA | 2.17 | 7.8 | 6.0 | Nylon | EP-SUS | 10 |
| Comparative Example PB06 | iAA | 2.17 | 7.8 | 6.0 | Nylon | EP-SUS | 10 |
| Comparative Example PB07 | iAA | 2.17 | 7.8 | 6.0 | UPE | EP-SUS | 10 |
| Comparative Example PB08 | iAA | 2.17 | 7.8 | 6.0 | Nylon | EP-SUS | 10 |

TABLE 66

| Table 1b16 Chemical liquid | Alkane content (mass ppt) (upper column carbon number/lower column ClogP) | | | | | | | | | | | Maximum contained carbon number |
|---|---|---|---|---|---|---|---|---|---|---|---|---|
| | 6 3.9 | 10 6.0 | 12 7.0 | 14 8.1 | 16 9.2 | 18 10.2 | 20 11.3 | 30 16.6 | 40 21.9 | 50 27.1 | Total amount | |
| PA01 | 0 | 0 | 0 | 1 | 1 | 2 | 4 | 4 | 1 | 0 | 39 | 28 |
| PA02 | 0 | 0 | 0 | 1 | 1 | 2 | 3 | 1 | 0 | 0 | 17 | 20 |
| PA03 | 0 | 0 | 1 | 2 | 3 | 1 | 0 | 0 | 0 | 0 | 7 | 16 |
| PA04 | 0 | 0 | 0 | 1 | 1 | 2 | 4 | 3 | 1 | 0 | 34 | 24 |
| PA05 | 0 | 0 | 0 | 1 | 1 | 2 | 4 | 4 | 1 | 0 | 39 | 22 |
| PA06 | 0 | 0 | 0 | 0 | 0.01 | 0.01 | 0.02 | 0.02 | 0.01 | 0 | 0.22 | 24 |
| PA07 | 0 | 0 | 1 | 1 | 2 | 1 | 0 | 0 | 0 | 0 | 5 | 16 |
| PA08 | 0 | 0 | 1 | 1 | 2 | 1 | 0 | 0 | 0 | 0 | 5 | 16 |
| PA09 | 0 | 0 | 0 | 0 | 0.01 | 0.01 | 0 | 0 | 0 | 0 | 0.02 | 18 |
| PA10 | 0 | 0 | 5 | 10 | 25 | 40 | 46 | 44 | 12 | 2 | 482 | 22 |
| PA11 | 0 | 0 | 3 | 8 | 12 | 22 | 30 | 29 | 5 | 0 | 290 | 22 |
| PA12 | 0 | 0 | 5 | 10 | 25 | 15 | 0 | 0 | 0 | 0 | 55 | 16 |
| PA13 | 0 | 0 | 0 | 1 | 1 | 2 | 3 | 4 | 1 | 0 | 37 | 28 |
| PA14 | 0 | 0 | 0 | 1 | 2 | 3 | 3 | 4 | 1 | 0 | 39 | 28 |
| PA15 | 0 | 0 | 0 | 1 | 1 | 2 | 2 | 4 | 1 | 0 | 34 | 28 |
| PA16 | 0 | 0 | 0 | 1 | 1 | 2 | 1 | 1 | 0 | 0 | 12 | 18 |
| PA17 | 0 | 0 | 1 | 1 | 2 | 1 | 0 | 0 | 0 | 0 | 5 | 16 |
| PB01 | 0 | 0 | 0 | 120 | 14000 | 98000 | 300000 | 88000 | 4200 | 110 | 1323510 | 22 |
| PB02 | 0 | 0 | 0 | 0 | 0 | 0.01 | 0.01 | 0.01 | 0 | 0 | 0.085 | 22 |
| PB03 | 0 | 0 | 0 | 89 | 980 | 82000 | 240000 | 98000 | 4000 | 120 | 1193490 | 24 |
| PB04 | 0 | 0 | 0 | 0 | 0 | 0 | 0.01 | 0.01 | 0 | 0 | 0.075 | 24 |
| PB05 | 0 | 0 | 250 | 3100 | 5000 | 1100 | 0 | 0 | 0 | 0 | 9450 | 16 |
| PB06 | 0 | 0 | 0 | 0 | 0.007 | 0.005 | 0 | 0 | 0 | 0 | 0.012 | 16 |
| PB07 | 0.07 | 0.07 | 0 | 0 | 0 | 0.01 | 0.01 | 0.01 | 0 | 0 | 0.085 | 22 |
| PB08 | 0.05 | 0.05 | 0 | 0 | 0.007 | 0.005 | 0 | 0 | 0 | 0 | 0.012 | 16 |

TABLE 67

| Table 1c16 Chemical liquid | Alkene content (mass ppt) $C_kH_{2k}$ (upper column carbon number/lower column ClogP) | | | | | | | $C_nH_m$ (squalene) | Total amount |
|---|---|---|---|---|---|---|---|---|---|
| | 6 3.4 | 10 5.5 | 12 6.6 | 20 10.8 | 30 16.1 | 40 21.4 | 50 26.7 | | |
| PA01 | 0 | 0 | 0 | 0 | 0 | 0 | 0 | 0 | 0 |
| PA02 | 0 | 0 | 0 | 0 | 0 | 0 | 0 | 0 | 0 |
| PA03 | 0 | 0 | 1 | 3 | 3 | 2 | 0 | 2 | 43 |
| PA04 | 0 | 0 | 0 | 0 | 0 | 0 | 0 | 0 | 0 |

TABLE 67-continued

| Table | Alkene content (mass ppt) | | | | | | | | |
|---|---|---|---|---|---|---|---|---|---|
| 1c16 | $C_kH_{2k}$ (upper column carbon number/lower column ClogP) | | | | | | | | |
| Chemical liquid | 6<br>3.4 | 10<br>5.5 | 12<br>6.6 | 20<br>10.8 | 30<br>16.1 | 40<br>21.4 | 50<br>26.7 | $C_nH_m$<br>(squalene) | Total<br>amount |
| PA05 | 0 | 0 | 0 | 0 | 0 | 0 | 0 | 0 | 0 |
| PA06 | 0 | 0 | 0 | 0 | 0 | 0 | 0 | 0 | 0 |
| PA07 | 0 | 0 | 1 | 2 | 3 | 1 | 0 | 2 | 33 |
| PA08 | 0 | 0 | 1 | 2 | 3 | 2 | 0 | 2 | 38 |
| PA09 | 0 | 0 | 0.01 | 0.01 | 0.03 | 0.01 | 0 | 0.01 | 0.28 |
| PA10 | 0 | 0 | 0 | 0 | 0 | 0 | 0 | 0 | 0 |
| PA11 | 0 | 0 | 0 | 0 | 0 | 0 | 0 | 0 | 0 |
| PA12 | 0 | 0 | 5 | 18 | 24 | 26 | 12 | 22 | 383 |
| PA13 | 0 | 0 | 0 | 0 | 0 | 0 | 0 | 0 | 0 |
| PA14 | 0 | 0 | 0 | 0 | 0 | 0 | 0 | 0 | 0 |
| PA15 | 0 | 0 | 0 | 0 | 0 | 0 | 0 | 0 | 0 |
| PA16 | 0 | 0 | 0 | 0 | 0 | 0 | 0 | 0 | 0 |
| PA17 | 0 | 0 | 1 | 2 | 3 | 2 | 0 | 2 | 38 |
| PB01 | 0 | 0 | 0 | 0 | 0 | 0 | 0 | 0 | 0 |
| PB02 | 0 | 0 | 0 | 0 | 0 | 0 | 0 | 0 | 0 |
| PB03 | 0 | 0 | 0 | 0 | 0 | 0 | 0 | 0 | 0 |
| PB04 | 0 | 0 | 0 | 0 | 0 | 0 | 0 | 0 | 0 |
| PB05 | 0 | 0 | 3600 | 13500 | 224000 | 81000 | 500 | 140000 | 1602750 |
| PB06 | 0 | 0 | 0 | 0.005 | 0.006 | 0.004 | 0 | 0.006 | 0.075 |
| PB07 | 0 | 0 | 0 | 0 | 0 | 0 | 0 | 0 | 0 |
| PB08 | 0 | 0 | 0 | 0.005 | 0.006 | 0.004 | 0 | 0.006 | 0.075 |

TABLE 68

| Table 1d16 | Organic component total | Metal component | | | Ratio 1<br>Organic component/<br>Metal component | Ratio 2<br>Organic component/<br>Metal particles | Ratio 3<br>Organic component/<br>Metal ions |
|---|---|---|---|---|---|---|---|
| Chemical liquid | amount (mass ppt) | Total (mass ppt) | Metal ions (mass ppt) | Metal particles (mass ppt) | | | |
| PA01 | 39 | 71.6 | 53.0 | 18.6 | $5.5 \times 10^{-1}$ | $2.1 \times 10^{0}$ | $7.4 \times 10^{-1}$ |
| PA02 | 17 | 72.6 | 53.8 | 18.8 | $2.3 \times 10^{-1}$ | $8.8 \times 10^{-1}$ | $3.1 \times 10^{-1}$ |
| PA03 | 50 | 69.1 | 51.2 | 17.9 | $7.2 \times 10^{-1}$ | $2.8 \times 10^{0}$ | $9.7 \times 10^{-1}$ |
| PA04 | 34 | 0.008 | 0.006 | 0.002 | $4.2 \times 10^{3}$ | $1.6 \times 10^{4}$ | $5.7 \times 10^{3}$ |
| PA05 | 39 | 688.8 | 510.2 | 178.6 | $5.7 \times 10^{-2}$ | $2.2 \times 10^{-1}$ | $7.6 \times 10^{-2}$ |
| PA06 | 0.22 | 71.4 | 52.9 | 18.5 | $3.1 \times 10^{-3}$ | $1.2 \times 10^{-2}$ | $4.2 \times 10^{-3}$ |
| PA07 | 38 | 0.009 | 0.007 | 0.002 | $4.0 \times 10^{3}$ | $1.5 \times 10^{4}$ | $5.4 \times 10^{3}$ |
| PA08 | 43 | 689.6 | 510.8 | 178.8 | $6.2 \times 10^{-2}$ | $2.4 \times 10^{-1}$ | $8.3 \times 10^{-2}$ |
| PA09 | 0.30 | 70.9 | 52.5 | 18.4 | $4.2 \times 10^{-3}$ | $1.6 \times 10^{-2}$ | $5.6 \times 10^{-3}$ |
| PA10 | 482 | 73.2 | 54.2 | 19.0 | $6.6 \times 10^{0}$ | $2.5 \times 10^{1}$ | $8.9 \times 10^{0}$ |
| PA11 | 290 | 71.8 | 53.2 | 18.6 | $4.0 \times 10^{0}$ | $1.6 \times 10^{1}$ | $5.5 \times 10^{0}$ |
| PA12 | 438 | 71.0 | 52.6 | 18.4 | $6.2 \times 10^{0}$ | $2.4 \times 10^{1}$ | $8.3 \times 10^{0}$ |
| PA13 | 37 | 69.7 | 51.6 | 18.1 | $5.2 \times 10^{-1}$ | $2.0 \times 10^{0}$ | $7.1 \times 10^{-1}$ |
| PA14 | 39 | 71.8 | 53.2 | 18.6 | $5.4 \times 10^{-1}$ | $2.1 \times 10^{0}$ | $7.2 \times 10^{-1}$ |
| PA15 | 34 | 72.9 | 54.0 | 18.9 | $4.7 \times 10^{-1}$ | $1.8 \times 10^{0}$ | $6.3 \times 10^{-1}$ |
| PA16 | 12 | 72.6 | 53.8 | 18.8 | $1.6 \times 10^{-1}$ | $6.1 \times 10^{-1}$ | $2.1 \times 10^{-1}$ |
| PA17 | 43 | 70.9 | 52.5 | 18.4 | $6.0 \times 10^{-1}$ | $2.3 \times 10^{0}$ | $8.1 \times 10^{-1}$ |
| PB01 | 1323510 | 0.010 | 0.007 | 0.003 | $1.3 \times 10^{8}$ | $4.4 \times 10^{8}$ | $1.9 \times 10^{8}$ |
| PB02 | 0.085 | 800.8 | 579.2 | 221.6 | $1.1 \times 10^{-4}$ | $3.8 \times 10^{-4}$ | $1.5 \times 10^{-4}$ |
| PB03 | 1193490 | 0.011 | 0.008 | 0.003 | $1.1 \times 10^{8}$ | $4.0 \times 10^{8}$ | $1.5 \times 10^{8}$ |
| PB04 | 0.075 | 798.4 | 576.8 | 221.6 | $9.4 \times 10^{-5}$ | $3.4 \times 10^{-4}$ | $1.3 \times 10^{-4}$ |
| PB05 | 1612200 | 0.010 | 0.007 | 0.003 | $1.6 \times 10^{8}$ | $5.4 \times 10^{8}$ | $2.3 \times 10^{8}$ |
| PB06 | 0.087 | 802.0 | 576.8 | 225.2 | $1.1 \times 10^{-4}$ | $3.9 \times 10^{-4}$ | $1.5 \times 10^{-4}$ |
| PB07 | 0.085 | 798.4 | 576.8 | 221.6 | $1.1 \times 10^{-4}$ | $3.8 \times 10^{-4}$ | $1.5 \times 10^{-4}$ |
| PB08 | 0.087 | 802.0 | 576.8 | 225.2 | $1.1 \times 10^{-4}$ | $3.9 \times 10^{-4}$ | $1.5 \times 10^{-4}$ |

TABLE 69

| Table 1a17 | Organic solvent | | | | Container | | |
|---|---|---|---|---|---|---|---|
| | Type | ClogP | HSP distance to eicosane | HSP distance to eicosene | Filter | Type | Void volume [% by volume] |
| Example QA01 | Isobutyl isobutyrate | 2.48 | 5.3 | 3.6 | UPE | EP-SUS | 10 |
| Example QA02 | Isobutyl isobutyrate | 2.48 | 5.3 | 3.6 | PTFE | EP-SUS | 10 |
| Example QA03 | Isobutyl isobutyrate | 2.48 | 5.3 | 3.6 | Nylon | EP-SUS | 10 |
| Comparative Example QB01 | Isobutyl isobutyrate | 2.48 | 5.3 | 3.6 | UPE | EP-SUS | 10 |
| Comparative Example QB02 | Isobutyl isobutyrate | 2.48 | 5.3 | 3.6 | PTFE | EP-SUS | 10 |
| Comparative Example QB03 | Isobutyl isobutyrate | 2.48 | 5.3 | 3.6 | Nylon | EP-SUS | 10 |

TABLE 70

| Table 1b17 | Alkane content (mass ppt) (upper column carbon number/lower column ClogP) | | | | | | | | | | | Maximum contained |
|---|---|---|---|---|---|---|---|---|---|---|---|---|
| Chemical liquid | 6 3.9 | 10 6.0 | 12 7.0 | 14 8.1 | 16 9.2 | 18 10.2 | 20 11.3 | 30 16.6 | 40 21.9 | 50 27.1 | Total amount | carbon number |
| QA01 | 0 | 0 | 0 | 1 | 2 | 3 | 5 | 6 | 2 | 0 | 59 | 28 |
| QA02 | 0 | 0 | 0 | 1 | 1 | 2 | 4 | 3 | 1 | 0 | 34 | 20 |
| QA03 | 0 | 0 | 1 | 2 | 4 | 2 | 0 | 0 | 0 | 0 | 9 | 16 |
| QB01 | 0 | 0 | 6 | 240 | 5150 | 106700 | 395000 | 95500 | 4400 | 100 | 1351510 | 22 |
| QB02 | 0 | 0 | 2 | 130 | 1620 | 90750 | 240000 | 93500 | 3400 | 90 | 1177320 | 22 |
| QB03 | 0 | 0 | 65 | 4600 | 6270 | 1850 | 22 | 0 | 0 | 0 | 12840 | 16 |

TABLE 71

| | Alkene content (mass ppt) | | | | | | | | |
|---|---|---|---|---|---|---|---|---|---|
| Table 1c17 | CkH2k (upper column carbon number/lower column ClogP) | | | | | | | | |
| Chemical liquid | 6 3.4 | 10 5.5 | 12 6.6 | 20 10.8 | 30 16.1 | 40 21.4 | 50 26.7 | $C_nH_m$ (squalene) | Total amount |
| QA01 | 0 | 0 | 0 | 0 | 0 | 0 | 0 | 0 | 0 |
| QA02 | 0 | 0 | 0 | 0 | 0 | 0 | 0 | 0 | 0 |
| QA03 | 0 | 0 | 3 | 8 | 9 | 7 | 0 | 8 | 128 |
| QB01 | 0 | 0 | 0 | 0 | 0 | 0 | 0 | 0 | 0 |
| QB02 | 0 | 0 | 0 | 0 | 0 | 0 | 0 | 0 | 0 |
| QB03 | 0 | 0 | 4300 | 14500 | 185000 | 73000 | 750 | 115000 | 1375130 |

TABLE 72

| Table 1d17 | Organic component total | Metal component | | | Ratio 1 Organic component/ Metal component | Ratio 2 Organic component/ Metal particles | Ratio 3 Organic component/ Metal ions |
|---|---|---|---|---|---|---|---|
| Chemical liquid | amount (mass ppt) | Total (mass ppt) | Metal ions (mass ppt) | Metal particles (mass ppt) | | | |
| QA01 | 59 | 70.7 | 52.4 | 18.3 | $8.3 \times 10^{-1}$ | $3.2 \times 10^0$ | $1.1 \times 10^0$ |
| QA02 | 34 | 70.5 | 52.2 | 18.3 | $4.8 \times 10^{-1}$ | $1.9 \times 10^0$ | $6.5 \times 10^{-1}$ |
| QA03 | 137 | 68.3 | 50.6 | 17.7 | $2.0 \times 10^0$ | $7.7 \times 10^0$ | $2.7 \times 10^0$ |
| QB01 | 1351510 | 69.1 | 51.2 | 17.9 | $2.0 \times 10^4$ | $7.5 \times 10^4$ | $2.6 \times 10^4$ |
| QB02 | 1177320 | 70.9 | 52.5 | 18.4 | $1.7 \times 10^4$ | $6.4 \times 10^4$ | $2.2 \times 10^4$ |
| QB03 | 1387970 | 69.9 | 51.8 | 18.1 | $2.0 \times 10^4$ | $7.7 \times 10^4$ | $2.7 \times 10^4$ |

TABLE 73

| Table 1a18 | Organic solvent | | | | Container | | |
|---|---|---|---|---|---|---|---|
| | Type | ClogP | HSP distance to eicosane | HSP distance to eicosene | Filter | Type | Void volume [% by volume] |
| Example RA01 | Methyl Malonate | 0.07 | 12.0 | 10.3 | UPE | EP-SUS | 10 |
| Example RA02 | Methyl Malonate | 0.07 | 12.0 | 10.3 | PTFE | EP-SUS | 10 |
| Example RA03 | Methyl Malonate | 0.07 | 12.0 | 10.3 | Nylon | EP-SUS | 10 |
| Comparative Example RB01 | Methyl Malonate | 0.07 | 12.0 | 10.3 | UPE | EP-SUS | 10 |
| Comparative Example RB02 | Methyl Malonate | 0.07 | 12.0 | 10.3 | PTFE | EP-SUS | 10 |
| Comparative Example RB03 | Methyl Malonate | 0.07 | 12.0 | 10.3 | Nylon | EP-SUS | 10 |

TABLE 74

| Table 1b18 | Alkane content (mass ppt) (upper column carbon number/lower column ClogP) | | | | | | | | | | | Maximum contained |
|---|---|---|---|---|---|---|---|---|---|---|---|---|
| Chemical liquid | 6 3.9 | 10 6.0 | 12 7.0 | 14 8.1 | 16 9.2 | 18 10.2 | 20 11.3 | 30 16.6 | 40 21.9 | 50 27.1 | Total amount | carbon number |
| RA01 | 0 | 0 | 0 | 1 | 1 | 2 | 3 | 2 | 1 | 0 | 27 | 22 |
| RA02 | 0 | 0 | 0 | 1 | 1 | 2 | 1 | 1 | 0 | 0 | 12 | 18 |
| RA03 | 0 | 0 | 1 | 1 | 2 | 1 | 0 | 0 | 0 | 0 | 5 | 16 |
| RB01 | 0 | 0 | 2 | 150 | 720 | 94500 | 372500 | 20500 | 850 | 3 | 1133380 | 20 |
| RB02 | 0 | 0 | 1 | 50 | 420 | 22750 | 352500 | 19750 | 250 | 1 | 1004470 | 20 |
| RB03 | 0 | 0 | 2 | 50 | 730 | 80 | 0 | 0 | 0 | 0 | 862 | 18 |

TABLE 75

| | Alkene content (mass ppt) | | | | | | | | |
|---|---|---|---|---|---|---|---|---|---|
| Table 1c18 | CkH2k (upper column carbon number/lower column ClogP) | | | | | | | | |
| Chemical liquid | 6 3.4 | 10 5.5 | 12 6.6 | 20 10.8 | 30 16.1 | 40 21.4 | 50 26.7 | $C_nH_m$ (squalene) | Total amount |
| RA01 | 0 | 0 | 0 | 0 | 0 | 0 | 0 | 0 | 0 |
| RA02 | 0 | 0 | 0 | 0 | 0 | 0 | 0 | 0 | 0 |
| RA03 | 0 | 0 | 3 | 8 | 9 | 7 | 0 | 8 | 128 |
| RB01 | 0 | 0 | 0 | 0 | 0 | 0 | 0 | 0 | 0 |
| RB02 | 0 | 0 | 0 | 0 | 0 | 0 | 0 | 0 | 0 |
| RB03 | 0 | 0 | 2500 | 52000 | 95000 | 65000 | 400 | 120000 | 1187250 |

TABLE 76

| Table 1d18 | Organic component total | Metal component | | | Ratio 1 Organic component/ Metal component | Ratio 2 Organic component/ Metal particles | Ratio 3 Organic component/ Metal ions |
|---|---|---|---|---|---|---|---|
| Chemical liquid | amount (mass ppt) | Total (mass ppt) | Metal ions (mass ppt) | Metal particles (mass ppt) | | | |
| RA01 | 27 | 72.2 | 53.5 | 18.7 | $3.7 \times 10^{-1}$ | $1.4 \times 10^{0}$ | $5.0 \times 10^{-1}$ |
| RA02 | 12 | 72.6 | 53.8 | 18.8 | $1.6 \times 10^{-1}$ | $6.1 \times 10^{-1}$ | $2.1 \times 10^{-1}$ |
| RA03 | 133 | 73.2 | 54.2 | 19.0 | $1.8 \times 10^{0}$ | $7.0 \times 10^{0}$ | $2.4 \times 10^{0}$ |
| RB01 | 1133380 | 79.0 | 58.5 | 20.5 | $1.4 \times 10^{4}$ | $5.5 \times 10^{4}$ | $1.9 \times 10^{4}$ |

TABLE 76-continued

| Table 1d18 Chemical liquid | Organic component total amount (mass ppt) | Metal component Total (mass ppt) | Metal ions (mass ppt) | Metal particles (mass ppt) | Ratio 1 Organic component/ Metal component | Ratio 2 Organic component/ Metal particles | Ratio 3 Organic component/ Metal ions |
|---|---|---|---|---|---|---|---|
| RB02 | 1004470 | 75.3 | 55.8 | 19.5 | $1.3 \times 10^4$ | $5.1 \times 10^4$ | $1.8 \times 10^4$ |
| RB03 | 1188112 | 73.6 | 54.5 | 19.1 | $1.6 \times 10^4$ | $6.2 \times 10^4$ | $2.2 \times 10^4$ |

TABLE 77

| Table 1a19 | Organic solvent Type | ClogP | HSP distance to eicosane | HSP distance to eicosene | Filter | Container Type | Void volume [% by volume] |
|---|---|---|---|---|---|---|---|
| Example SA01 | Methyl Malonate:Isoamyl Ether = 5:5 | 1.93 | 7.6 | 5.9 | UPE | EP-SUS | 10 |
| Example SA02 | Methyl Malonate:Isoamyl Ether = 5:5 | 1.93 | 7.6 | 5.9 | PTFE | EP-SUS | 10 |
| Example SA03 | Methyl Malonate:Isoamyl Ether = 5:5 | 1.93 | 7.6 | 5.9 | Nylon | EP-SUS | 10 |
| Example SA04 | Methyl Malonate:Isoamyl Ether = 9:1 | 0.44 | 11.1 | 9.4 | UPE | EP-SUS | 10 |
| Example SA05 | Methyl Malonate:Isoamyl Ether = 1:9 | 3.41 | 4.3 | 2.7 | UPE | EP-SUS | 10 |
| Comparative Example SB01 | Methyl Malonate:Isoamyl Ether = 5:5 | 1.93 | 7.6 | 5.9 | UPE | EP-SUS | 10 |
| Comparative Example SB02 | Methyl Malonate:Isoamyl Ether = 5:5 | 1.93 | 7.6 | 5.9 | PTFE | EP-SUS | 10 |
| Comparative Example SB03 | Methyl Malonate:Isoamyl Ether = 5:5 | 1.93 | 7.6 | 5.9 | Nylon | EP-SUS | 10 |

TABLE 78

| Table 1b19 Chemical liquid | Alkane content (mass ppt) (upper column carbon number/lower column ClogP) | | | | | | | | | | Total amount | Maximum contained carbon number |
|---|---|---|---|---|---|---|---|---|---|---|---|---|
| | 6 / 3.9 | 10 / 6.0 | 12 / 7.0 | 14 / 8.1 | 16 / 9.2 | 18 / 10.2 | 20 / 11.3 | 30 / 16.6 | 40 / 21.9 | 50 / 27.1 | | |
| SA01 | 0 | 0 | 0 | 2 | 2 | 4 | 6 | 6 | 2 | 0 | 61 | 26 |
| SA02 | 0 | 0 | 0 | 2 | 2 | 4 | 3 | 2 | 0 | 0 | 26 | 18 |
| SA03 | 0 | 0 | 2 | 2 | 4 | 2 | 0 | 0 | 0 | 0 | 9 | 16 |
| SA04 | 0 | 0 | 0 | 1 | 1 | 2 | 5 | 4 | 1 | 0 | 43 | 20 |
| SA05 | 0 | 0 | 0 | 3 | 3 | 5 | 7 | 9 | 3 | 0 | 88 | 30 |
| SB01 | 0 | 0 | 5 | 280 | 2250 | 61000 | 355000 | 52500 | 2300 | 25 | 1225120 | 26 |
| SB02 | 0 | 0 | 2 | 105 | 1010 | 54750 | 233750 | 75900 | 1100 | 20 | 1025310 | 20 |
| SB03 | 0 | 0 | 20 | 1120 | 2510 | 520 | 5 | 0 | 0 | 0 | 4183 | 16 |

TABLE 79

| Table 1c19 Chemical liquid | Alkene content (mass ppt) $C_kH_{2k}$ (upper column carbon number/lower column ClogP) | | | | | | | $C_nH_m$ (squalene) | Total amount |
|---|---|---|---|---|---|---|---|---|---|
| | 6 / 3.4 | 10 / 5.5 | 12 / 6.6 | 20 / 10.8 | 30 / 16.1 | 40 / 21.4 | 50 / 26.7 | | |
| SA01 | 0 | 0 | 0 | 0 | 0 | 0 | 0 | 0 | 0 |
| SA02 | 0 | 0 | 0 | 0 | 0 | 0 | 0 | 0 | 0 |
| SA03 | 0 | 0 | 2 | 4 | 5 | 4 | 0 | 8 | 64 |
| SA04 | 0 | 0 | 0 | 0 | 0 | 0 | 0 | 0 | 0 |
| SA05 | 0 | 0 | 0 | 0 | 0 | 0 | 0 | 0 | 0 |
| SB01 | 0 | 0 | 0 | 0 | 0 | 0 | 0 | 0 | 0 |
| SB02 | 0 | 0 | 0 | 0 | 0 | 0 | 0 | 0 | 0 |
| SB03 | 0 | 0 | 2550 | 35500 | 95550 | 71500 | 1400 | 105000 | 1022630 |

TABLE 80

| Table 1d19 Chemical liquid | Organic component total amount (mass ppt) | Metal component | | | Ratio 1 Organic component/ Metal component | Ratio 2 Organic component/ Metal particles | Ratio 3 Organic component/ Metal ions |
|---|---|---|---|---|---|---|---|
| | | Total (mass ppt) | Metal ions (mass ppt) | Metal particles (mass ppt) | | | |
| SA01 | 61 | 72.2 | 53.5 | 18.7 | $8.5 \times 10^{-1}$ | $3.3 \times 10^{0}$ | $1.1 \times 10^{0}$ |
| SA02 | 26 | 72.6 | 53.8 | 18.8 | $3.5 \times 10^{-1}$ | $1.4 \times 10^{0}$ | $4.8 \times 10^{-1}$ |
| SA03 | 73 | 73.2 | 54.2 | 19.0 | $9.9 \times 10^{-1}$ | $3.8 \times 10^{0}$ | $1.3 \times 10^{0}$ |
| SA04 | 43 | 72.6 | 53.8 | 18.8 | $5.9 \times 10^{-1}$ | $2.3 \times 10^{0}$ | $8.0 \times 10^{-1}$ |
| SA05 | 88 | 73.2 | 54.2 | 19.0 | $1.2 \times 10^{0}$ | $4.6 \times 10^{0}$ | $1.6 \times 10^{0}$ |
| SB01 | 1225120 | 79.0 | 58.5 | 20.5 | $1.6 \times 10^{4}$ | $6.0 \times 10^{4}$ | $2.1 \times 10^{4}$ |
| SB02 | 1025310 | 75.3 | 55.8 | 19.5 | $1.4 \times 10^{4}$ | $5.2 \times 10^{4}$ | $1.8 \times 10^{4}$ |
| SB03 | 1026813 | 73.6 | 54.5 | 19.1 | $1.4 \times 10^{4}$ | $5.4 \times 10^{4}$ | $1.9 \times 10^{4}$ |

[Test]

The prepared chemical liquids were preserved in a container at 30° C. for 90 days and then subjected to the following tests.

[Evaluation of Coating Defect Suppressing Properties]

The defect suppressing property of the chemical liquid was evaluated by the following method.

A bare silicon wafer having a diameter of about 300 mm was prepared, and while rotating the wafer at 500 rpm, 100 ml of each chemical liquid was transferred from the container to the discharge device via pipe (manufactured by NICHIAS; liquid contact portion: stainless steel; φ: inner diameter 4.35 mm, outer diameter 6.35 mm; length: 10 m; used after washing by passing a washing solution obtained by distillation purification of commercially available PGMEA therethrough), and discharged at a discharge rated of 5 ml/s over 20 seconds. Thereafter, the wafer was rotated at 2000 rpm for 30 seconds to perform spin dry treatment.

This was used as a wafer for evaluation. Next, the number of defects with a size of 17 nm or larger and their composition on the entire surface of the wafer were examined using the wafer inspection device "SP-5" manufactured by KLA-Tencor and the fully automated defect review classifier "SEMVision G6" manufactured by Applied Materials.

Among the measured defects, the particulate foreign matters were classified into "metal residue defects" containing a metal as a main component and "particulate organic residue defects" containing an organic substance as a main component, and measured. Further, defects other than the particulate foreign matter were counted as "spot defects". The measurement results were evaluated according to the following criteria. Furthermore, based on the total number of these defects, the "comprehensive evaluation" was made according to the following criteria.

It can be evaluated that the fewer the coating defects are, the more excellent the performance is in a case where the chemical liquid is used as a prewet solution, a developer, or a rinsing solution.

(Evaluation Criteria for Metal Residue Defects)
 A: The number of defects was 20 or less per wafer.
 B: The number of defects was 21 or more per wafer and 100 or less per wafer.
 C: The number of defects was 101 or more per wafer and 500 or less per wafer.
 D: The number of defects was 501 or more per wafer and 1000 or less per wafer.
 E: The number of defects was 1001 or more per wafer and 5000 or less per wafer.
 F: The number of defects was 5001 or more per wafer.

(Evaluation Criteria for Particulate Organic Residue Defects)
 A: The number of defects was 50 or less per wafer.
 B: The number of defects was 51 or more per wafer and 200 or less per wafer.
 C: The number of defects was 201 or more per wafer and 500 or less per wafer.
 D: The number of defects was 501 or more per wafer and 1000 or less per wafer.
 E: The number of defects was 1001 or more per wafer and 5000 or less per wafer.
 F: The number of defects was 5001 or more per wafer.

(Evaluation Criteria for Spot Defects)
 A: The number of defects was 50 or less per wafer.
 B: The number of defects was 51 or more per wafer and 200 or less per wafer.
 C: The number of defects was 201 or more per wafer and 500 or less per wafer.
 D: The number of defects was 501 or more per wafer and 1000 or less per wafer.
 E: The number of defects was 1001 or more per wafer and 5000 or less per wafer.
 F: The number of defects was 5001 or more per wafer.

(Evaluation Criteria in Comprehensive Evaluation)
 A: The total number of defects of each defect was 100 or less per wafer.
 B: The total number of defects of each defect was 101 or more per wafer and 500 or less per wafer.
 C: The total number of defects of each defect was 501 or more per wafer and 1000 or less per wafer.
 D: The total number of defects of each defect was 1001 or more per wafer and 5000 or less per wafer.
 E: The total number of defects of each defect was 5001 or more per wafer and 30000 or less per wafer.
 F: The total number of defects of each defect was 30001 or more per wafer.

[Evaluation for Pattern Defect Suppressing Properties]

Resist compositions of the following formulations were prepared and patterns were made using the chemical liquid.

At this time, the chemical liquid AA01 was used as the prewet solution described later, the chemical liquid HA01 was used as the developer, and the chemical liquid FA01 was used as the rinsing solution.

However, in the case of evaluating the performance of a chemical liquid as a prewet solution, each chemical liquid to be evaluated was used as the prewet solution. Similarly, in the case of evaluating the performance of a chemical liquid as a developer, each chemical liquid to be evaluated was used as the developer. In the case of evaluating the performance of a chemical liquid as the rinsing solution, each chemical liquid to be evaluated was used as the rinsing solution.

In the discharge of the chemical liquid in the case of using as a prewet solution, a developer, or a rinsing solution, the chemical liquid was transferred from the container to the discharge port of the coating apparatus or the like via pipe (manufactured by NICHIAS; liquid contact portion: stainless steel; φ: inner diameter 4.35 mm, outer diameter 6.35 mm; length: 10 m; used after washing by passing a washing solution obtained by distillation purification of commercially available PGMEA therethrough).

<Resist Composition>

Resist composition 1 was obtained by mixing the components in the following composition.
Resin (A-1): 0.77 g
Photo-acid generator (B-1): 0.03 g
Basic compound (E-3): 0.03 g
PGMEA (commercially available product, high-purity grade): 67.5 g
EL (commercially available product, high-purity grade): 75 g (Resin)
The following resins were used as the resins.

(Basic Compound)
The following compounds were used as the basic compounds.

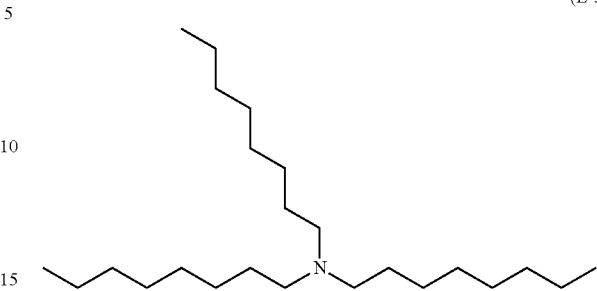

(E-3)

<Pattern Formation and Evaluation>

The residue defect suppressing property, the bridge defect suppressing property, and the spot defect suppressing property of the chemical liquids were evaluated by the following methods. A coater developer "RF$^{3S}$" manufactured by SOKUDO was used for the test.

First, AL412 (manufactured by Brewer Science) was applied on a diameter of silicon wafer of 300 mm and baked at 200° C. for 60 seconds to form a resist lower layer film having a film thickness of 20 nm. A prewet solution was applied thereon, and a resist composition was applied thereon and baked at 100° C. for 60 seconds (PB: Prebake) to form a resist film having a film thickness of 30 nm.

| Resin | | Composition Ratio (molar ratio) from left | Mw | Mw/Mn |
|---|---|---|---|---|
| A-1 | | 30/60/10 | 11,200 | 1.45 |

(Photo-Acid Generator)

The following compounds were used as the photo-acid generators.

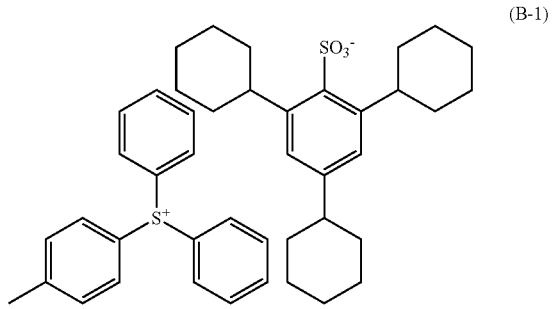

(B-1)

This resist film was exposed through a reflective mask using an EUV exposure machine (manufactured by ASML; NXE3350, NA0.33, Dipole 90°, outer sigma 0.87, inner sigma 0.35). Thereafter, it was heated at 85° C. for 60 seconds (PEB: Post Exposure Bake). Next, a developer was sprayed for 30 seconds for development by a spray method, and a rinsing solution was discharged on a silicon wafer for 20 seconds by a spin coating method for rinsing. Subsequently, the silicon wafer was rotated at a rotation speed of 2000 rpm for 40 seconds to form a line-and-space pattern having a space width of 20 nm and a pattern line width of 15 nm.

The image of the pattern was acquired, the acquired image was analyzed using the aforementioned analyzer, the number of defects per unit area was measured, and evaluated as "comprehensive evaluation" based on the total number of defects according to the following criteria.

Further, among the defects, the numbers of "PLOT defects", which are protruding defects, "BRIDGE defects", which are pattern-to-pattern crosslinking-like defects, and "GEL defects", which are film residue defects, were measured and evaluated according to the following criteria.
(Evaluation Criteria in Comprehensive Evaluation)
- A: The total number of defects was 50 or less per wafer.
- B: The total number of defects was 51 or more per wafer and 200 or less per wafer.
- C: The total number of defects was 201 or more per wafer and 500 or less per wafer.
- D: The total number of defects was 501 or more per wafer and 1000 or less per wafer.
- E: The total number of defects was 1001 or more per wafer and 5000 or less per wafer.
- F: The total number of defects was 5001 or more per wafer.

(Evaluation Criteria for PLOT Defects)
- A: The number of defects was 20 or less per wafer.
- B: The number of defects was 21 or more per wafer and 50 or less per wafer.
- C: The number of defects was 51 or more per wafer and 100 or less per wafer.
- D: The number of defects was 101 or more per wafer and 500 or less per wafer.
- E: The number of defects was 501 or more per wafer and 1000 or less per wafer.
- F: The number of defects was 1001 or more per wafer.

(Evaluation Criteria for BRIDGE Defects)
- A: The number of defects was 20 or less per wafer.
- B: The number of defects was 21 or more per wafer and 50 or less per wafer.
- C: The number of defects was 51 or more per wafer and 100 or less per wafer.
- D: The number of defects was 101 or more per wafer and 500 or less per wafer.
- E: The number of defects was 501 or more per wafer and 1000 or less per wafer.
- F: The number of defects was 1001 or more per wafer.

(Evaluation Criteria for GEL Defects)
- A: The number of defects was 20 or less per wafer.
- B: The number of defects was 21 or more per wafer and 50 or less per wafer.
- C: The number of defects was 51 or more per wafer and 100 or less per wafer.
- D: The number of defects was 101 or more per wafer and 500 or less per wafer.
- E: The number of defects was 501 or more per wafer and 1000 or less per wafer.
- F: The number of defects was 1001 or more per wafer.

[Pipe Washing Performance]

1000 ml of the chemical liquid to be evaluated was passed through pipe immediately after purchase (manufactured by NICHIAS; liquid contact portion: PFA; φ: inner diameter 4.35 mm, outer diameter 6.35 mm; length: 10 m) at 100 ml/min, and the pipe was washed.

Next, the same test as the above-mentioned evaluation of the coating defect suppressing properties was performed except that the chemical liquid AA01 was discharged onto the wafer through this pipe.

It can be evaluated that the better the test result of the coating defect suppressing properties performed as above is, the better the pipe washing performance of the chemical liquid used for washing the pipe is.

The test results are shown in Tables below.

TABLE 81

| Table 2-1 | Use | Coating defect suppressing properties ||||| Pattern defect suppressing properties ||||
|---|---|---|---|---|---|---|---|---|---|
| | | Comprehensive evaluation | Metal residue defects | Particulate organic residue defects | Spot defects | Comprehensive evaluation | PLOT defects | BRIDGE defects | GEL defects |
| Example AA01 | Prewet solution | A | A | A | A | A | A | A | A |
| Example AA02 | | A | A | A | A | A | A | A | A |
| Example AA03 | | A | A | A | A | A | A | A | A |
| Example AA04 | | A | A | A | A | A | A | A | A |
| Example AA05 | | A | A | A | A | A | A | A | A |
| Example AA06 | | A | A | A | A | A | A | A | A |
| Example AA07 | | A | A | B | A | A | B | A | A |
| Example AA08 | | B | C | A | A | B | C | C | A |
| Example AA09 | | A | A | B | A | A | B | A | A |
| Example AA10 | | A | A | B | A | A | B | A | A |
| Example AA11 | | B | C | A | A | B | C | C | A |
| Example AA12 | | A | A | B | A | A | B | A | A |
| Example AA13 | | C | A | B | C | C | A | A | C |
| Example AA14 | | C | A | B | C | C | A | A | C |
| Example AA15 | | C | A | B | C | C | A | A | C |
| Example AA16 | | A | A | A | A | A | A | A | A |
| Example AA17 | | A | A | A | A | A | A | A | A |
| Example AA18 | | A | A | A | A | A | A | A | A |
| Example AA19 | | A | A | A | A | A | A | A | A |
| Example AA20 | | A | A | A | A | A | A | A | A |
| Example AA21 | | A | A | A | A | A | A | A | A |
| Example AA22 | | A | A | A | A | A | A | A | A |
| Comparative Example AB01 | | F | A | F | F | F | A | A | F |
| Comparative Example AB02 | | F | F | A | A | E | F | F | A |
| Comparative Example AB03 | | F | A | F | F | F | A | A | F |
| Comparative Example AB04 | | F | F | A | A | E | F | F | A |
| Comparative Example AB05 | | F | A | F | F | F | A | A | F |

TABLE 81-continued

| Table 2-1 | Use | Coating defect suppressing properties | | | | Pattern defect suppressing properties | | | |
|---|---|---|---|---|---|---|---|---|---|
| | | Comprehensive evaluation | Metal residue defects | Particulate organic residue defects | Spot defects | Comprehensive evaluation | PLOT defects | BRIDGE defects | GEL defects |
| Comparative Example AB06 | | F | F | A | A | E | F | F | A |
| Comparative Example AB07 | | F | F | A | A | E | F | F | A |
| Comparative Example AB08 | | F | F | A | A | E | F | F | A |
| Comparative Example AB09 | | F | F | A | B | E | F | F | B |

TABLE 82

| Table 2-2 | Use | Coating defect suppressing properties | | | | Pattern defect suppressing properties | | | |
|---|---|---|---|---|---|---|---|---|---|
| | | Comprehensive evaluation | Metal residue defects | Particulate organic residue defects | Spot defects | Comprehensive evaluation | PLOT defects | BRIDGE defects | GEL defects |
| Example BA01 | Prewet solution | A | A | A | A | A | A | A | A |
| Example BA02 | | A | A | A | A | A | A | A | A |
| Example BA03 | | A | A | A | A | A | A | A | A |
| Example BA04 | | A | A | A | A | A | A | A | A |
| Example BA05 | | A | A | A | A | A | A | A | A |
| Example BA06 | | A | A | A | A | A | A | A | A |
| Example BA07 | | A | A | B | A | A | B | A | A |
| Example BA08 | | B | C | A | A | B | C | C | A |
| Example BA09 | | A | A | B | A | A | B | A | A |
| Example BA10 | | A | A | B | A | A | B | A | A |
| Example BA11 | | B | C | A | A | B | C | C | A |
| Example BA12 | | A | A | B | A | A | B | A | A |
| Example BA13 | | D | A | B | D | D | A | A | D |
| Example BA14 | | D | A | B | D | D | A | A | D |
| Example BA15 | | D | A | B | D | D | A | A | D |
| Example BA16 | | A | A | A | A | A | A | A | A |
| Example BA17 | | A | A | A | A | A | A | A | A |
| Example BA18 | | A | A | A | A | A | A | A | A |
| Example BA19 | | A | A | A | A | A | A | A | A |
| Example BA20 | | A | A | A | A | A | A | A | A |
| Comparative Example BB01 | | F | A | F | F | F | A | A | F |
| Comparative Example BB02 | | F | F | A | A | E | F | F | A |
| Comparative Example BB03 | | F | A | E | F | F | A | A | F |
| Comparative Example BB04 | | F | F | A | A | E | F | F | A |
| Comparative Example BB05 | | F | A | F | F | F | A | A | F |
| Comparative Example BB06 | | F | F | A | A | E | F | F | A |
| Comparative Example BB07 | | F | F | A | A | E | F | F | A |
| Comparative Example BB08 | | F | F | A | A | E | F | F | A |

TABLE 83

| Table 2-3 | Use | Coating defect suppressing properties | | | | Pattern defect suppressing properties | | | |
|---|---|---|---|---|---|---|---|---|---|
| | | Comprehensive evaluation | Metal residue defects | Particulate organic residue defects | Spot defects | Comprehensive evaluation | PLOT defects | BRIDGE defects | GEL defects |
| Example CA01 | Prewet solution | A | A | A | A | A | A | A | A |
| Example CA02 | | A | A | A | A | A | A | A | A |
| Example CA03 | | A | A | A | A | A | A | A | A |
| Example CA04 | | B | A | B | A | B | B | A | A |
| Example CA05 | | B | C | A | A | B | C | C | A |
| Example CA06 | | A | A | B | A | A | B | A | A |
| Example CA07 | | A | A | B | A | A | B | A | A |
| Example CA08 | | B | C | A | A | B | C | C | A |
| Example CA09 | | A | A | B | A | A | B | A | A |
| Example CA10 | | C | A | B | C | C | A | A | C |
| Example CA11 | | C | A | B | C | C | A | A | C |
| Example CA12 | | C | A | B | C | C | A | A | C |
| Example CA13 | | A | A | A | A | A | A | A | A |
| Example CA14 | | A | A | A | A | A | A | A | A |
| Example CA15 | | A | A | A | A | A | A | A | A |
| Example CA16 | | A | A | A | A | A | A | A | A |
| Example CA17 | | A | A | A | A | A | A | A | A |
| Comparative Example CB01 | | F | A | F | F | F | A | A | F |
| Comparative Example CB02 | | F | F | A | A | E | F | F | A |
| Comparative Example CB03 | | F | A | E | F | F | A | A | F |
| Comparative Example CB04 | | F | F | A | A | E | F | F | A |
| Comparative Example CB05 | | F | A | F | F | F | A | A | F |
| Comparative Example CB06 | | F | F | A | A | E | F | F | A |
| Comparative Example CB07 | | F | F | A | A | E | F | F | A |
| Comparative Example CB08 | | F | F | A | A | E | F | F | A |

TABLE 84

| Table 2-4 | Use | Coating defect suppressing properties | | | | Pattern defect suppressing properties | | | |
|---|---|---|---|---|---|---|---|---|---|
| | | Comprehensive evaluation | Metal residue defects | Particulate organic residue defects | Spot defects | Comprehensive evaluation | PLOT defects | BRIDGE defects | GEL defects |
| Example DA01 | Prewet solution | A | A | A | A | A | A | A | A |
| Example DA02 | | A | A | A | A | A | A | A | A |
| Example DA03 | | A | A | A | A | A | A | A | A |
| Example DA04 | | A | A | B | A | A | B | A | A |
| Example DA05 | | B | C | A | A | B | C | C | A |
| Example DA06 | | A | A | B | A | A | B | A | A |
| Example DA07 | | A | A | B | A | A | B | A | A |
| Example DA08 | | B | C | A | A | B | C | C | A |
| Example DA09 | | A | A | B | A | A | B | A | A |
| Example DA10 | | D | A | B | D | D | C | C | B |
| Example DA11 | | D | A | B | D | D | C | C | B |
| Example DA12 | | D | A | B | D | D | C | C | C |
| Comparative Example DB01 | | F | A | F | F | F | A | A | F |
| Comparative Example DB02 | | F | F | A | A | E | F | F | A |
| Comparative Example DB03 | | F | A | E | F | F | A | A | F |
| Comparative Example DB04 | | F | F | A | A | E | F | F | A |
| Comparative Example DB05 | | F | A | F | F | F | A | A | F |
| Comparative Example DB06 | | F | F | A | A | E | F | F | A |

TABLE 84-continued

| Table 2-4 | Use | Coating defect suppressing properties | | | | Pattern defect suppressing properties | | | |
|---|---|---|---|---|---|---|---|---|---|
| | | Comprehensive evaluation | Metal residue defects | Particulate organic residue defects | Spot defects | Comprehensive evaluation | PLOT defects | BRIDGE defects | GEL defects |
| Comparative Example DB07 | | F | F | A | A | E | F | F | A |
| Comparative Example DB08 | | F | F | A | A | E | F | F | A |

TABLE 85

| Table 2-5 | Use | Coating defect suppressing properties | | | | Pattern defect suppressing properties | | | |
|---|---|---|---|---|---|---|---|---|---|
| | | Comprehensive evaluation | Metal residue defects | Particulate organic residue defects | Spot defects | Comprehensive evaluation | PLOT defects | BRIDGE defects | GEL defects |
| Example EA01 | Prewet solution | A | A | A | A | A | A | A | A |
| Example EA02 | | A | A | A | A | A | A | A | A |
| Example EA03 | | A | A | A | A | A | A | A | A |
| Example EA04 | | A | A | A | A | A | A | A | A |
| Example EA05 | | A | A | A | A | A | A | A | A |
| Example EA06 | | A | A | A | A | A | A | A | A |
| Example EA07 | | A | A | B | A | A | B | A | A |
| Example EA08 | | B | C | A | A | B | C | C | A |
| Example EA09 | | A | A | B | A | A | B | A | A |
| Example EA10 | | B | A | B | A | B | B | A | A |
| Example EA11 | | B | C | A | A | B | C | C | A |
| Example EA12 | | A | A | B | A | A | B | A | A |
| Example EA13 | | C | A | B | C | C | A | A | C |
| Example EA14 | | C | A | B | C | C | A | A | C |
| Example EA15 | | C | A | B | C | C | A | A | C |
| Example EA16 | | A | A | A | A | A | A | A | A |
| Example EA17 | | A | A | A | A | A | A | A | A |
| Example EA18 | | A | A | A | A | A | A | A | A |
| Example EA19 | | A | A | A | A | A | A | A | A |
| Example EA20 | | A | A | A | A | A | A | A | A |
| Example EA21 | | A | A | A | A | A | A | A | A |
| Example EA22 | | A | A | A | A | A | A | A | A |
| Comparative Example EB01 | | F | A | F | F | F | A | A | F |
| Comparative Example EB02 | | F | F | A | A | E | F | F | A |
| Comparative Example EB03 | | F | A | E | F | F | A | A | F |
| Comparative Example EB04 | | F | F | A | A | E | F | F | A |
| Comparative Example EB05 | | F | A | F | F | F | A | A | F |
| Comparative Example EB06 | | F | F | A | A | E | F | F | A |
| Comparative Example EB07 | | F | F | A | A | E | F | F | A |
| Comparative Example EB08 | | F | F | A | A | E | F | F | A |

TABLE 86

| Table 2-5' | Use | Coating defect suppressing properties | | | | Pattern defect suppressing properties | | | |
|---|---|---|---|---|---|---|---|---|---|
| | | Comprehensive evaluation | Metal residue defects | Particulate organic residue defects | Spot defects | Comprehensive evaluation | PLOT defects | BRIDGE defects | GEL defects |
| Example EA023 | Prewet solution | A | A | A | A | A | A | A | A |
| Example EA024 | solution | A | A | A | A | A | A | A | A |
| Example EA025 | | A | A | A | A | A | A | A | A |
| Example EA026 | | A | A | A | A | A | A | A | A |
| Example EA027 | | A | A | A | A | A | A | A | A |
| Example EA028 | | A | A | A | A | A | A | A | A |
| Example EA029 | | A | A | A | A | A | A | A | A |
| Example EA030 | | A | A | A | A | A | A | A | A |
| Example EA031 | | A | A | A | A | A | A | A | A |
| Example EA032 | | A | A | A | A | A | A | A | A |
| Example EA033 | | A | A | B | A | A | B | A | A |
| Example EA034 | | B | C | A | A | B | C | C | A |
| Example EA035 | | A | A | B | A | A | B | A | A |
| Example EA036 | | B | A | B | A | B | B | A | A |
| Example EA037 | | B | C | A | A | B | C | C | A |
| Example EA038 | | A | A | B | A | A | B | A | A |
| Example EA039 | | C | A | B | C | C | A | A | C |
| Example EA040 | | C | A | B | C | C | A | A | C |
| Example EA041 | | C | A | B | C | C | A | A | C |
| Example EA042 | | A | A | A | A | A | A | A | A |
| Example EA043 | | A | A | A | A | A | A | A | A |
| Example EA044 | | A | A | A | A | A | A | A | A |
| Example EA045 | | A | A | A | A | A | A | A | A |
| Example EA046 | | A | A | A | A | A | A | A | A |
| Example EA047 | | A | A | A | A | A | A | A | A |
| Example EA048 | | A | A | A | A | A | A | A | A |
| Comparative Example EB09 | | F | A | F | F | F | A | A | F |
| Comparative Example EB10 | | F | F | A | A | E | F | F | A |
| Comparative Example EB11 | | F | A | E | F | F | A | A | F |
| Comparative Example EB12 | | F | F | A | A | E | F | F | A |
| Comparative Example EB13 | | F | A | F | F | F | A | A | F |
| Comparative Example EB14 | | F | F | A | A | E | F | F | A |
| Comparative Example EB15 | | F | F | A | A | E | F | F | A |
| Comparative Example EB16 | | F | F | A | A | E | F | F | A |

TABLE 87

| Table 2-6 | Use | Coating defect suppressing properties | | | | Pattern defect suppressing properties | | | |
|---|---|---|---|---|---|---|---|---|---|
| | | Comprehensive evaluation | Metal residue defects | Particulate organic residue defects | Spot defects | Comprehensive evaluation | PLOT defects | BRIDGE defects | GEL defects |
| Example FA01 | Prewet solution | A | A | A | A | A | A | A | A |
| Example FA02 | solution | A | A | A | A | A | A | A | A |
| Example FA03 | | A | A | A | A | A | A | A | A |
| Example FA04 | | A | A | A | A | A | A | A | A |
| Example FA05 | | B | C | A | A | B | C | C | A |
| Example FA06 | | A | A | B | A | A | B | A | A |
| Example FA07 | | A | A | B | A | A | B | A | A |
| Example FA08 | | B | C | A | A | B | C | C | A |
| Example FA09 | | A | A | B | A | A | B | A | A |
| Example FA10 | | D | A | B | E | D | C | C | B |

TABLE 87-continued

| | | Coating defect suppressing properties | | | | Pattern defect suppressing properties | | | |
| | | | | Particulate | | | | | |
| Table 2-6 | Use | Comprehensive evaluation | Metal residue defects | organic residue defects | Spot defects | Comprehensive evaluation | PLOT defects | BRIDGE defects | GEL defects |
|---|---|---|---|---|---|---|---|---|---|
| Example FA11 | | D | A | B | E | D | C | C | B |
| Example FA12 | | D | A | B | E | D | C | C | C |
| Comparative Example FB01 | | F | A | F | F | F | A | A | F |
| Comparative Example FB02 | | F | F | A | A | E | F | F | A |
| Comparative Example FB03 | | F | A | E | F | F | A | A | F |
| Comparative Example FB04 | | F | F | A | A | E | F | F | A |
| Comparative Example FB05 | | F | A | F | F | F | A | A | F |
| Comparative Example FB06 | | F | F | A | A | E | F | F | A |
| Comparative Example FB07 | | F | F | A | A | E | F | F | A |
| Comparative Example FB08 | | F | F | A | A | E | F | F | A |

TABLE 88

| | | Coating defect suppressing properties | | | | Pattern defect suppressing properties | | | |
| | | | | Particulate | | | | | |
| Table 2-7 | Use | Comprehensive evaluation | Metal residue defects | organic residue defects | Spot defects | Comprehensive evaluation | PLOT defects | BRIDGE defects | GEL defects |
|---|---|---|---|---|---|---|---|---|---|
| Example GA01 | Rinsing solution | A | A | A | A | A | A | A | A |
| Example GA02 | | A | A | A | A | A | A | A | A |
| Example GA03 | | A | A | A | A | A | A | A | A |
| Example GA04 | | A | A | A | A | A | A | A | A |
| Example GA05 | | B | C | A | A | B | C | C | A |
| Example GA06 | | A | A | B | A | A | B | A | A |
| Example GA07 | | A | A | B | A | A | B | A | A |
| Example GA08 | | B | C | A | A | B | C | C | A |
| Example GA09 | | A | A | B | A | A | B | A | A |
| Example GA10 | | D | A | B | D | D | C | C | B |
| Example GA11 | | D | A | B | D | D | C | C | B |
| Example GA12 | | D | A | B | D | D | C | C | C |
| Comparative Example GB01 | | F | A | F | F | F | A | A | F |
| Comparative Example GB02 | | F | F | A | A | E | F | F | A |
| Comparative Example GB03 | | F | A | E | F | F | A | A | F |
| Comparative Example GB04 | | F | F | A | A | E | F | F | A |
| Comparative Example GB05 | | F | A | F | F | F | A | A | F |
| Comparative Example GB06 | | F | F | A | A | E | F | F | A |
| Comparative Example GB07 | | F | F | A | A | E | F | F | A |
| Comparative Example GB08 | | F | F | A | A | E | F | F | A |

TABLE 89

| Table 2-8 | Use | Coating defect suppressing properties | | | | Pattern defect suppressing properties | | | |
|---|---|---|---|---|---|---|---|---|---|
| | | Comprehensive evaluation | Metal residue defects | Particulate organic residue defects | Spot defects | Comprehensive evaluation | PLOT defects | BRIDGE defects | GEL defects |
| Example HA01 | Developer | A | A | A | A | A | A | A | A |
| Example HA02 | | A | A | A | A | A | A | A | A |
| Example HA03 | | A | A | A | A | A | A | A | A |
| Example HA04 | | B | A | B | A | B | B | A | A |
| Example HA05 | | B | C | A | A | B | C | C | A |
| Example HA06 | | A | A | B | A | A | B | A | A |
| Example HA07 | | A | A | B | A | A | B | A | A |
| Example HA08 | | B | C | A | A | B | C | C | A |
| Example HA09 | | A | A | B | A | A | B | A | A |
| Example HA10 | | C | A | B | C | C | A | A | C |
| Example HA11 | | C | A | B | C | C | A | A | C |
| Example HA12 | | C | A | B | C | C | A | A | C |
| Example HA13 | | A | A | A | A | A | A | A | A |
| Example HA14 | | A | A | A | A | A | A | A | A |
| Example HA15 | | A | A | A | A | A | A | A | A |
| Example HA16 | | A | A | A | A | A | A | A | A |
| Example HA17 | | A | A | A | A | A | A | A | A |
| Comparative Example HB01 | | F | A | F | F | F | A | A | F |
| Comparative Example HB02 | | F | F | A | A | E | F | F | A |
| Comparative Example HB03 | | F | A | E | F | F | A | A | F |
| Comparative Example HB04 | | F | F | A | A | E | F | F | A |
| Comparative Example HB05 | | F | A | F | F | F | A | A | F |
| Comparative Example HB06 | | F | F | A | A | E | F | F | A |
| Comparative Example HB07 | | F | F | A | A | E | F | F | A |
| Comparative Example HB08 | | F | F | A | A | E | F | F | A |

TABLE 90

| Table 2-9 | Use | Coating defect suppressing properties | | | |
|---|---|---|---|---|---|
| | | Comprehensive evaluation | Metal residue defects | Particulate organic residue defects | Spot defects |
| Example IA01 | Pipe washing solution | A | A | A | A |
| Example IA02 | | A | A | A | A |
| Example IA03 | | A | A | A | A |
| Example IA04 | | A | A | A | A |
| Example IA05 | | A | A | A | A |
| Example IA06 | | A | A | A | A |
| Example IA07 | | A | A | A | A |
| Example IA08 | | B | C | A | A |
| Example IA09 | | A | A | B | A |
| Example IA10 | | A | A | A | A |
| Example IA11 | | B | C | A | A |
| Example IA12 | | A | A | B | A |
| Example IA13 | | C | A | B | C |
| Example IA14 | | C | A | B | C |
| Example IA15 | | C | A | B | C |
| Example IA16 | | A | A | A | A |
| Example IA17 | | A | A | A | A |
| Comparative Example IB01 | | F | A | F | F |
| Comparative Example IB02 | | F | F | A | A |
| Comparative Example IB03 | | F | A | F | F |

TABLE 90-continued

| Table 2-9 | Use | Coating defect suppressing properties | | | |
|---|---|---|---|---|---|
| | | Comprehensive evaluation | Metal residue defects | Particulate organic residue defects | Spot defects |
| Comparative Example IB04 | | F | F | A | A |
| Comparative Example IB05 | | F | A | F | F |
| Comparative Example IB06 | | F | F | A | A |

TABLE 91

| Table 2-10 | Use | Coating defect suppressing properties | | | |
|---|---|---|---|---|---|
| | | Comprehensive evaluation | Metal residue defects | Particulate organic residue defects | Spot defects |
| Example JA01 | Pipe washing solution | A | A | A | A |
| Example JA02 | | A | A | A | A |
| Example JA03 | | A | A | A | A |
| Example JA04 | | A | A | B | A |
| Example JA05 | | B | C | A | A |
| Example JA06 | | A | A | B | A |
| Example JA07 | | B | A | B | A |
| Example JA08 | | B | C | A | A |
| Example JA09 | | A | A | B | A |
| Example JA10 | | D | A | B | D |
| Example JA11 | | D | A | B | D |
| Example JA12 | | D | A | B | D |
| Comparative Example JB01 | | F | A | F | F |
| Comparative Example JB02 | | F | F | A | A |
| Comparative Example JB03 | | F | A | F | F |
| Comparative Example JB04 | | F | F | A | A |
| Comparative Example JB05 | | F | A | F | F |
| Comparative Example JB06 | | F | F | A | A |

TABLE 92

| Table 2-11 | Use | Coating defect suppressing properties | | | |
|---|---|---|---|---|---|
| | | Comprehensive evaluation | Metal residue defects | Particulate organic residue defects | Spot defects |
| Example KA01 | Pipe washing solution | B | A | B | B |
| Example KA02 | | B | A | B | B |
| Example KA03 | | B | A | B | B |
| Comparative Example KB01 | | F | A | D | F |
| Comparative Example KB02 | | F | A | C | F |
| Comparative Example KB03 | | F | B | D | F |

TABLE 93

| Table 2-12 | Use | Coating defect suppressing properties | | | | Pattern defect suppressing properties | | | |
|---|---|---|---|---|---|---|---|---|---|
| | | Comprehensive evaluation | Metal residue defects | Particulate organic residue defects | Spot defects | Comprehensive evaluation | PLOT defects | BRIDGE defects | GEL defects |
| Example LA01 | Rinsing solution | C | A | B | C | C | A | B | C |
| Example LA02 | | C | A | B | C | C | A | B | C |
| Example LA03 | | D | B | C | D | D | B | C | D |
| Comparative Example LB01 | | F | A | E | F | F | C | E | F |
| Comparative Example LB02 | | F | A | D | F | E | B | E | E |
| Comparative Example LB03 | | F | B | E | F | F | C | E | F |

TABLE 94

| Table 2-13 | Use | Coating defect suppressing properties | | | | Pattern defect suppressing properties | | | |
|---|---|---|---|---|---|---|---|---|---|
| | | Comprehensive evaluation | Metal residue defects | Particulate organic residue defects | Spot defects | Comprehensive evaluation | PLOT defects | BRIDGE defects | GEL defects |
| Example MA01 | Rinsing solution | A | A | A | A | A | A | A | A |
| Example MA02 | | A | A | A | A | A | A | A | A |
| Example MA03 | | A | A | A | B | A | A | A | B |
| Comparative Example MB01 | | F | A | F | F | F | A | A | F |
| Comparative Example MB02 | | F | A | E | F | F | A | A | F |
| Comparative Example MB03 | | F | A | F | F | F | A | A | F |

TABLE 95

| Table 2-14 | Use | Coating defect suppressing properties | | | | Pattern defect suppressing properties | | | |
|---|---|---|---|---|---|---|---|---|---|
| | | Comprehensive evaluation | Metal residue defects | Particulate organic residue defects | Spot defects | Comprehensive evaluation | PLOT defects | BRIDGE defects | GEL defects |
| Example NA01 | Rinsing solution | C | A | B | C | C | A | B | C |
| Example NA02 | | C | A | B | C | C | A | B | C |
| Example NA03 | | B | A | A | C | D | B | C | D |
| Comparative Example NB01 | | F | A | F | F | F | A | A | F |
| Comparative Example NB02 | | F | A | E | F | F | A | A | F |
| Comparative Example NB03 | | F | A | F | F | F | A | A | F |

TABLE 96

| Table 2-15 | Use | Coating defect suppressing properties | | | | Pattern defect suppressing properties | | | |
|---|---|---|---|---|---|---|---|---|---|
| | | | | Particulate | | | | | |
| | | Comprehensive evaluation | Metal residue defects | organic residue defects | Spot defects | Comprehensive evaluation | PLOT defects | BRIDGE defects | GEL defects |
| Example OA01 | Rinsing solution | C | A | B | C | C | A | B | C |
| Example OA02 | | C | A | B | C | C | A | B | C |
| Example OA03 | | D | B | C | D | D | B | C | D |
| Comparative Example OB01 | | F | A | E | F | F | C | E | F |
| Comparative Example OB02 | | F | A | D | F | E | B | E | E |
| Comparative Example OB03 | | F | B | E | F | F | C | E | F |

TABLE 97

| Table 2-16 | Use | Coating defect suppressing properties | | | | Pattern defect suppressing properties | | | |
|---|---|---|---|---|---|---|---|---|---|
| | | | | Particulate | | | | | |
| | | Comprehensive evaluation | Metal residue defects | organic residue defects | Spot defects | Comprehensive evaluation | PLOT defects | BRIDGE defects | GEL defects |
| Example PA01 | Developer | A | A | A | A | A | A | A | A |
| Example PA02 | | A | A | A | A | A | A | A | A |
| Example PA03 | | A | A | A | A | A | A | A | A |
| Example PA04 | | B | A | B | A | B | B | A | A |
| Example PA05 | | B | C | A | A | B | C | C | A |
| Example PA06 | | A | A | B | A | A | B | A | A |
| Example PA07 | | B | A | B | A | B | B | A | A |
| Example PA08 | | B | C | A | A | B | C | C | A |
| Example PA09 | | A | A | B | A | A | B | A | A |
| Example PA10 | | C | A | B | C | C | A | A | C |
| Example PA11 | | C | A | B | C | C | A | A | C |
| Example PA12 | | C | A | B | C | C | A | A | C |
| Example PA13 | | A | A | A | A | A | A | A | A |
| Example PA14 | | A | A | A | A | A | A | A | A |
| Example PA15 | | A | A | A | A | A | A | A | A |
| Example PA16 | | A | A | A | A | A | A | A | A |
| Example PA17 | | A | A | A | A | A | A | A | A |
| Comparative Example PB01 | | F | A | F | F | F | A | A | F |
| Comparative Example PB02 | | F | F | A | A | E | F | F | A |
| Comparative Example PB03 | | F | A | E | F | F | A | A | F |
| Comparative Example PB04 | | F | F | A | A | E | F | F | A |
| Comparative Example PB05 | | F | A | F | F | F | A | A | F |
| Comparative Example PB06 | | F | F | A | A | E | F | F | A |
| Comparative Example PB07 | | F | F | A | A | E | F | F | A |
| Comparative Example PB08 | | F | F | A | A | E | F | F | A |

TABLE 98

Table 2-17

| Table 2-17 | Use | Coating defect suppressing properties | | | | Pattern defect suppressing properties | | | |
|---|---|---|---|---|---|---|---|---|---|
| | | Comprehensive evaluation | Metal residue defects | Particulate organic residue defects | Spot defects | Comprehensive evaluation | PLOT defects | BRIDGE defects | GEL defects |
| Example QA01 | Rinsing solution | A | A | A | A | A | A | A | A |
| Example QA02 | | A | A | A | A | A | A | A | A |
| Example QA03 | | A | A | A | B | A | A | A | B |
| Comparative Example QB01 | | F | A | F | F | F | A | A | F |
| Comparative Example QB02 | | F | A | E | F | F | A | A | F |
| Comparative Example QB03 | | F | A | F | F | F | A | A | F |

TABLE 99

Table 2-18

| Table 2-18 | Use | Coating defect suppressing properties | | | | Pattern defect suppressing properties | | | |
|---|---|---|---|---|---|---|---|---|---|
| | | Comprehensive evaluation | Metal residue defects | Particulate organic residue defects | Spot defects | Comprehensive evaluation | PLOT defects | BRIDGE defects | GEL defects |
| Example RA01 | Rinsing solution | A | A | A | A | A | A | A | A |
| Example RA02 | | A | A | A | A | A | A | A | A |
| Example RA03 | | A | A | A | B | A | A | A | B |
| Comparative Example RB01 | | F | A | F | F | F | A | A | F |
| Comparative Example RB02 | | F | A | E | F | F | A | A | F |
| Comparative Example RB03 | | F | A | F | F | F | A | A | F |

TABLE 100

Table 2-19

| Table 2-19 | Use | Coating defect suppressing properties | | | | Pattern defect suppressing properties | | | |
|---|---|---|---|---|---|---|---|---|---|
| | | Comprehensive evaluation | Metal residue defects | Particulate organic residue defects | Spot defects | Comprehensive evaluation | PLOT defects | BRIDGE defects | GEL defects |
| Example SA01 | Rinsing solution | A | A | A | A | A | A | A | A |
| Example SA02 | | A | A | A | A | A | A | A | A |
| Example SA03 | | A | A | A | B | A | A | A | B |
| Example SA04 | | B | A | A | B | C | A | B | B |
| Example SA05 | | C | B | B | C | C | B | B | C |
| Comparative Example SB01 | | F | A | F | F | F | A | A | F |
| Comparative Example SB02 | | F | A | E | F | F | A | A | F |
| Comparative Example SB03 | | F | A | F | F | F | A | A | F |

From the results shown in the table, it was confirmed that the chemical liquid of the present invention had excellent defect suppressing properties.

It was confirmed that in a case where the content of the organic component of the chemical liquid was 0.5 to 150 mass ppt (preferably 1 to 60 mass ppt), the defect suppressing properties tend to be more excellent (results of Examples AA09 and 12 to 15, and the like).

It was confirmed that in a case where the content of the metal component of the chemical liquid was 0.01 to 500 mass ppt (preferably 0.01 to 250 mass ppt, more preferably 0.01 to 100 mass ppt), the defect suppressing properties tend to be more excellent (results of Examples AA08 and 11, comparison of Examples CA04 and CA07, and the like).

It was confirmed that in a case where the content of metal ions in the chemical liquid was 0.01 to 400 mass ppt (preferably 0.01 to 200 mass ppt, more preferably 0.01 to 80 mass ppt), the defect suppressing properties tend to be more excellent (results of Examples AA08 and 11, and the like).

It was confirmed that in a case where the content of the metal particles in the chemical liquid is 0.01 to 400 mass ppt (preferably 0.01 to 150 mass ppt, more preferably 0.01 to 40 mass ppt), the defect suppressing properties tend to be more excellent (results of Examples AA08 and 11, and the like).

It was confirmed that in a case where the mass ratio of the content of the organic component to the content of the metal component of the chemical liquid is 0.05 to 2000 (preferably 0.1 to 2000), the defect suppressing properties tend to be more excellent (comparison of Examples FA04 and FA07, and the like).

It was confirmed that in a case where the Hansen solubility parameter distance to eicosene of the organic solvent of the chemical liquid was 3 to 20 $MPa^{0.5}$, the defect suppressing properties tend to be more excellent (results of Examples KA, LA, NA, and OA, and the like).

Further, it was confirmed that in a case where the chemical liquid contains both an organic solvent satisfying the range of the Hansen solubility parameter and an organic solvent not satisfying the range of the Hansen solubility parameter, and contains the organic solvent satisfying the range of the Hansen solubility parameter in an amount of 20% to 80% by mass with respect to the total mass of the chemical liquid, and contains the organic solvent not satisfying the range of the Hansen solubility parameter in an amount of 20% to 80% by mass (preferably 30% to 70% by mass) with respect to the total mass of the chemical liquid, the defect suppressing properties tend to be more excellent (comparison of Examples SA01 to 05, and the like).

What is claimed is:

1. A method for producing a pattern using a resist composition and a chemical liquid comprising,
    a step of applying the chemical liquid to a substrate,
    a step of forming a resist film by applying the resist composition to the substrate,
    a step of exposing the resist film using an EUV exposure machine, and
    a step of developing the resist film to form the pattern, and
    wherein the chemical liquid comprises one or more organic solvents selected from the group consisting of decane, undecane, and a compound other than an alkane and an alkene; and
    one or more organic solvents selected from the group consisting of decane and undecane, and
    one or more organic components selected from the group consisting of alkanes having 12 to 50 carbon atoms and alkenes having 12 to 50 carbon atoms, and
    wherein a content of the organic components is 0.10 to 1,000,000 mass ppt with respect to a total mass of the chemical liquid.

2. A method for producing a pattern according to claim 1, wherein the resist composition comprises a resin.

3. A method for producing a pattern according to claim 1, wherein the resin is a resin P containing a group which decomposes by the action of an acid to generate a polar group.

4. A method for producing a pattern according to claim 3, wherein the resin P contains a repeating unit containing a lactone structure.

5. A method for producing a pattern according to claim 3, wherein the resin P contains a repeating unit containing a phenolic hydroxyl group.

6. A method for producing a pattern according to claim 1, wherein the organic solvent contained in the chemical liquid is one or more organic solvents selected from the group consisting of propylene glycol monomethyl ether acetate, propylene glycol monomethyl ether, cyclohexanone, ethyl lactate, propylene carbonate, isopropanol, 4-methyl-2-pentanol, butyl acetate, methyl methoxypropionate, propylene glycol monoethyl ether, propylene glycol monopropyl ether, cyclopentanone, γ-butyrolactone, diisoamyl ether, isoamyl acetate, dimethyl sulfoxide, Nmethylpyrrolidone, diethylene glycol, ethylene glycol, dipropylene glycol, propylene glycol, ethylene carbonate, sulfolane, cycloheptanone, 2-heptanone, butyl butyrate, isobutyl isobutyrate, pentyl propionate, isopentyl propionate, ethylcyclohexane, mesitylene, decane, undecane, 3,7-dimethyl-3-octanol, 2-ethyl-1-hexanol, 1-octanol, 2-octanol, ethyl acetoacetate, dimethyl malonate, methyl pyruvate, and dimethyl oxalate.

7. A method for producing a pattern using a resist composition and a chemical liquid comprising,
    a step of forming a resist film by applying the resist composition to the substrate,
    a step of exposing the resist film using an EUV exposure machine, and
    a step of developing the resist film with the chemical liquid to form the pattern, and
    wherein the chemical liquid comprises one or more organic solvents selected from the group consisting of decane, undecane, and a compound other than an alkane and an alkene and
    one or more organic components selected from the group consisting of alkanes having 12 to 50 carbon atoms and alkenes having 12 to 50 carbon atoms, and
    wherein a content of the organic components is 0.10 to 1,000,000 mass ppt with respect to a total mass of the chemical liquid.

8. A method for producing a pattern according to claim 7, wherein the resist composition comprises a resin.

9. A method for producing a pattern according to claim 8, wherein the resin is a resin P containing a group which decomposes by the action of an acid to generate a polar group.

10. A method for producing a pattern according to claim 8, wherein the resin P contains a repeating unit containing a lactone structure.

11. A method for producing a pattern according to claim 8, wherein the resin P contains a repeating unit containing a phenolic hydroxyl group.

12. A method for producing a pattern according to claim 7, wherein the organic solvent contained in the chemical liquid is one or more organic solvents selected from the group consisting of propylene glycol monomethyl ether acetate, propylene glycol monomethyl ether, cyclohexanone, ethyl lactate, propylene carbonate, isopropanol, 4-methyl-2-pentanol, butyl acetate, methyl methoxypropionate, propylene glycol monoethyl ether, propylene glycol monopropyl ether, cyclopentanone, γ-butyrolactone, diisoamyl ether, isoamyl acetate, dimethyl sulfoxide, N-methylpyrrolidone, diethylene glycol, ethylene glycol, dipropylene glycol, propylene glycol, ethylene carbonate, sulfolane, cycloheptanone, 2-heptanone, butyl butyrate, isobutyl isobutyrate, pentyl propionate, isopentyl propionate, ethylcyclohexane, mesitylene, decane, undecane, 3,7-dimethyl-3-octanol, 2-ethyl-1-hexanol, 1-octanol, 2-octanol, ethyl acetoacetate, dimethyl malonate, methyl pyruvate, and dimethyl oxalate.

13. A method for producing a pattern using a resist composition and a chemical liquid comprising,
   a step of forming a resist film by applying the resist composition to the substrate,
   a step of exposing the resist film using an EUV exposure machine,
   a step of developing the resist film to form the pattern, and
   a step of rinsing the pattern with the chemical liquid, and
   wherein the chemical liquid comprises one or more organic solvents selected from the group consisting of decane, undecane, and a compound other than an alkane and an alkene and
   one or more organic components selected from the group consisting of alkanes having 12 to 50 carbon atoms and alkenes having 12 to 50 carbon atoms, and
   wherein a content of the organic components is 0.10 to 1,000,000 mass ppt with respect to a total mass of the chemical liquid.

14. A method for producing a pattern according to claim 13,
   wherein the resist composition comprises a resin.

15. A method for producing a pattern according to claim 14,
   wherein the resin is a resin P containing a group which decomposes by the action of an acid to generate a polar group.

16. A method for producing a pattern according to claim 14,
   wherein the resin P contains a repeating unit containing a lactone structure.

17. A method for producing a pattern according to claim 14,
   wherein the resin P contains a repeating unit containing a phenolic hydroxyl group.

18. A method for producing a pattern according to claim 13,
   wherein the organic solvent contained in the chemical liquid is one or more organic solvents selected from the group consisting of propylene glycol monomethyl ether acetate, propylene glycol monomethyl ether, cyclohexanone, ethyl lactate, propylene carbonate, isopropanol, 4-methyl-2-pentanol, butyl acetate, methyl methoxypropionate, propylene glycol monoethyl ether, propylene glycol monopropyl ether, cyclopentanone, γ-butyrolactone, diisoamyl ether, isoamyl acetate, dimethyl sulfoxide, N-methylpyrrolidone, diethylene glycol, ethylene glycol, dipropylene glycol, propylene glycol, ethylene carbonate, sulfolane, cycloheptanone, 2-heptanone, butyl butyrate, isobutyl isobutyrate, pentyl propionate, isopentyl propionate, ethylcyclohexane, mesitylene, decane, undecane, 3,7-dimethyl-3-octanol, 2-ethyl-1-hexanol, 1-octanol, 2-octanol, ethyl acetoacetate, dimethyl malonate, methyl pyruvate, and dimethyl oxalate.

\* \* \* \* \*